US010627688B2

(12) United States Patent
Nishiyama et al.

(10) Patent No.: US 10,627,688 B2
(45) Date of Patent: Apr. 21, 2020

(54) ACTIVE MATRIX SUBSTRATE AND DISPLAY PANEL

(71) Applicant: Sharp Kabushiki Kaisha, Sakai, Osaka (JP)

(72) Inventors: Takayuki Nishiyama, Sakai (JP); Kohhei Tanaka, Sakai (JP); Takeshi Noma, Sakai (JP); Yosuke Iwata, Sakai (JP); Ryo Yonebayashi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/528,496

(22) PCT Filed: Nov. 20, 2015

(86) PCT No.: PCT/JP2015/082783
§ 371 (c)(1),
(2) Date: May 19, 2017

(87) PCT Pub. No.: WO2016/080542
PCT Pub. Date: May 26, 2016

(65) Prior Publication Data
US 2017/0255074 A1    Sep. 7, 2017

(30) Foreign Application Priority Data

Nov. 21, 2014  (JP) ................................. 2014-236846

(51) Int. Cl.
*G02F 1/1368* (2006.01)
*G02F 1/1345* (2006.01)
(Continued)

(52) U.S. Cl.
CPC .... *G02F 1/136286* (2013.01); *G02F 1/13454* (2013.01); *G02F 1/13624* (2013.01);
(Continued)

(58) Field of Classification Search
CPC .......... G02F 1/136286; G02F 1/13624; G02F 1/13454
See application file for complete search history.

(56) References Cited

U.S. PATENT DOCUMENTS

2001/0030719 A1* 10/2001 Yamaguchi ........... G02F 1/1368
349/43
2005/0056847 A1  3/2005 Nakamura et al.
(Continued)

FOREIGN PATENT DOCUMENTS

JP          10197851 A  *  7/1998
JP          H11-184406 A     7/1999
(Continued)

*Primary Examiner* — Alexander P Gross
(74) *Attorney, Agent, or Firm* — ScienBiziP, P.C.

(57) ABSTRACT

An active matrix substrate is provided that includes: a plurality of source lines (data lines) 15S; a plurality of lines that intersect with the source lines 15S, and include at least a plurality of gate lines 13G; a gate driver (driving circuit) 11 that includes a plurality of switching elements 18, and are connected to at least a part of the lines, so as to control potentials of the lines according to a control signal; and a plurality of pixel control elements 16T that are provided in correspondence to a plurality of pixels that compose a display region, and are connected with the data lines 15S and the gate lines 13G, so as to control display of the corresponding pixels, respectively. Either the data lines 15S or the gate lines 13G are vertical lines while the others are horizontal lines, and intervals of the horizontal lines are irregular intervals. At least a part of the switching elements 18 are arranged in areas that are between the pixels adjacent in the vertical direction, and where none of the pixel control elements 16T is arranged.

6 Claims, 43 Drawing Sheets

(51) Int. Cl.
  *G09G 3/36* (2006.01)
  *G02F 1/1362* (2006.01)
  *H01L 27/12* (2006.01)

(52) U.S. Cl.
  CPC ............ *G09G 3/36* (2013.01); *H01L 27/124* (2013.01); *G02F 2001/136222* (2013.01); *G09G 2300/0426* (2013.01); *G09G 2310/0267* (2013.01); *G09G 2310/0286* (2013.01)

(56) References Cited

U.S. PATENT DOCUMENTS

| 2007/0103631 | A1* | 5/2007 | Moon .............. G02F 1/134336 |
| | | | 349/139 |
| 2010/0033470 | A1* | 2/2010 | Lee .................... G02F 1/13624 |
| | | | 345/212 |
| 2010/0097367 | A1* | 4/2010 | Kitayama ............ G09G 3/3614 |
| | | | 345/213 |
| 2012/0081648 | A1* | 4/2012 | Nagami ............ G02F 1/134309 |
| | | | 349/139 |
| 2013/0076723 | A1 | 3/2013 | Niioka et al. |
| 2014/0110868 | A1* | 4/2014 | Rho .................. G02F 1/133711 |
| | | | 264/1.38 |
| 2015/0293546 | A1* | 10/2015 | Tanaka ................ G02F 1/1368 |
| | | | 327/541 |
| 2016/0019856 | A1* | 1/2016 | Tanaka ................ G09G 3/3648 |
| | | | 345/206 |

FOREIGN PATENT DOCUMENTS

| JP | 2005-84416 A | | 3/2005 | | |
| JP | 2008-227057 A | | 9/2008 | | |
| JP | 2012-68405 A | | 4/2012 | | |
| JP | 2012068405 A | * | 4/2012 | | |
| JP | 2012-203285 | | 10/2012 | | |
| WO | 2014-069529 A1 | | 5/2014 | | |
| WO | WO-2014069529 A1 | * | 5/2014 | .......... | G02F 1/1368 |
| WO | WO-2014142183 A1 | * | 9/2014 | .......... | G09G 3/3648 |

* cited by examiner

ACTIVE MATRIX SUBSTRATE AND DISPLAY PANEL

TECHNICAL FIELD

The present invention relates to an active matrix substrate and a display panel.

BACKGROUND ART

An active matrix substrate is known that includes a plurality of data lines, and a plurality of lines that intersect with the data lines and include at least a plurality of gate lines. Patent Document 1 discloses an active matrix substrate in which, among a plurality of switching elements as constituent elements of a driving circuit that is connected to at least a part of the lines and controls potentials of the lines, at least a part of the switching elements are arranged in a display region.

PRIOR ART DOCUMENT

Patent Document

Patent Document 1: WO2014/069529

SUMMARY OF THE INVENTION

Problem to be Solved by the Invention

On the active matrix substrate, a plurality of pixel control elements (pixel-TFTs) are provided in correspondence to a plurality of pixels composing the display region, respectively, and are connected with data lines and gate lines, to control display of the corresponding pixels, respectively. In the active matrix substrate disclosed by Patent Document 1, a plurality of gate lines extending in the horizontal direction when viewed in a plan view are arranged at regular intervals. Switching elements are arranged in areas between pixels adjacent in the vertical direction. Since the pixel control elements are also arranged in these areas, large switching elements cannot be arranged.

It is an object of the present invention to provide an active matrix substrate in which a large switching element can be arranged in a display region.

Means to Solve the Problem

An active matrix substrate in one embodiment of the present invention includes: a plurality of data lines; a plurality of lines that intersect with the data lines, and include at least a plurality of gate lines; a driving circuit that includes a plurality of switching elements, and are connected to at least a part of the lines, so as to control potentials of the lines according to a control signal supplied from outside a display region; and a plurality of pixel control elements that are provided in correspondence to a plurality of pixels that compose the display region, and are connected with the data lines and the gate lines, so as to control display of the corresponding pixels, respectively. Either the data lines or the gate lines are a plurality of vertical lines that extend in a vertical direction in plan view, and the others are a plurality of horizontal lines that extend in a horizontal direction in plan view. Intervals of the horizontal lines are irregular intervals. Besides, at least a part of the switching elements are arranged in areas that are between the pixels adjacent in the vertical direction in plan view, and where none of the pixel control elements is arranged.

Effect of the Invention

According to the present invention, large switching elements can be arranged as a plurality of switching elements that are constituent elements of a driving circuit that controls potentials of lines including at least a plurality of gate lines can be arranged in a display region

MODE FOR CARRYING OUT THE INVENTION

Figure 1:
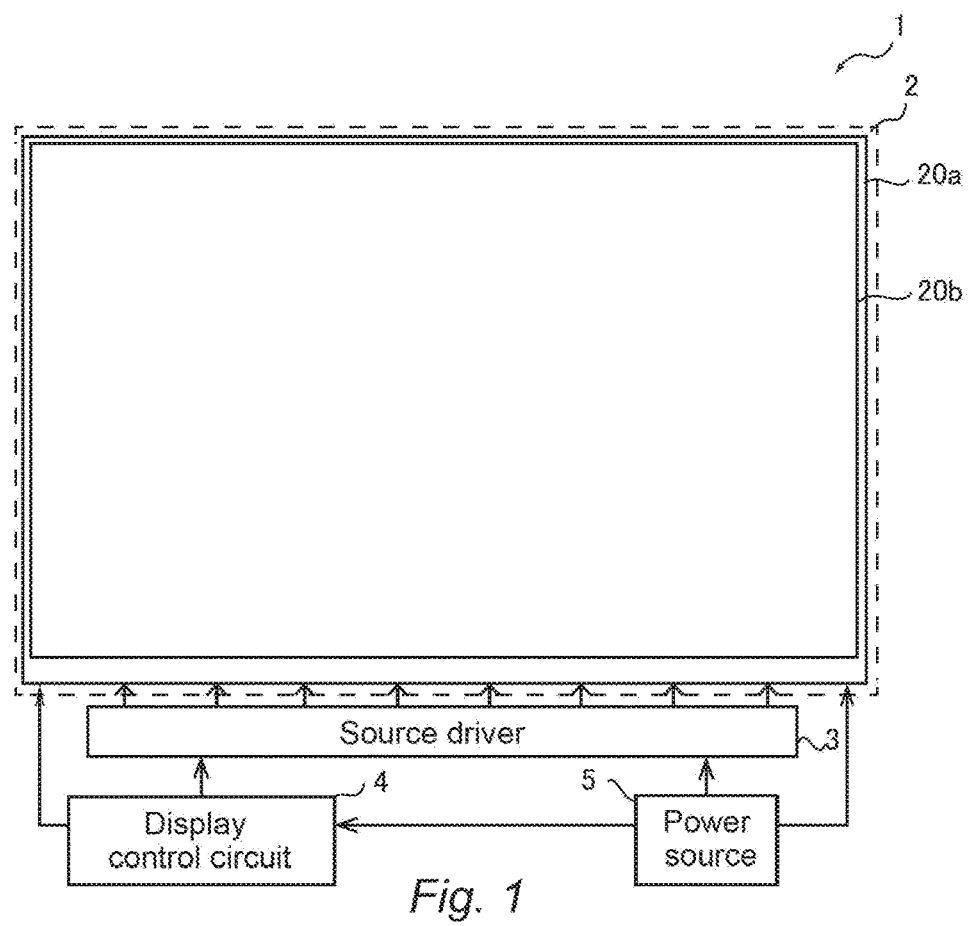
FIG. 1 is a schematic diagram illustrating a schematic configuration of a liquid crystal display device according to Embodiment 1.

An active matrix substrate in one embodiment of the present invention includes: a plurality of data lines; a plurality of lines that intersect with the data lines, and include at least a plurality of gate lines; a driving circuit that includes a plurality of switching elements, and are connected to at least a part of the lines, so as to control potentials of the lines according to a control signal supplied from outside a display region; and a plurality of pixel control elements that are provided in correspondence to a plurality of pixels that compose the display region, and are connected with the data lines and the gate lines, so as to control display of the corresponding pixels, respectively. Either the data lines or the gate lines are a plurality of vertical lines that extend in a vertical direction in plan view, and the others are a plurality of horizontal lines that extend in a horizontal direction in plan view. Intervals of the horizontal lines are irregular intervals. Besides, at least a part of the switching elements are arranged in areas that are between the pixels adjacent in the vertical direction in plan view, and where none of the pixel control elements is arranged.

According to this configuration, at least a part of the switching elements are arranged in areas that are between the pixels adjacent in the vertical direction in plan view, and where none of the pixel control elements is arranged, and this makes it possible to arrange large switching elements therein. This can make the area for arranging a driving circuit smaller, thereby allowing the length of the internal node of the driving circuit to decrease. The decrease of the length of the internal node leads to a decrease in the number of the points of intersection between the internal node or the driver line and the gate lines or the source lines, which results in the improvement of the yield. Further, the decrease of the length of the internal node allows the parasitic capacitance of the internal node to decrease, resulting in a decrease in the electric power consumption.

In addition, according to the above-described configuration, the distance between the drain pad of the pixel control element as an element electrically connected with the pixel electrode, and the driver line, can be increased, whereby capacitive coupling decreases. This makes it possible to decrease noise propagation from the driver line with respect to the pixel potential, and improve the image quality.

Among the pixel control elements, a part of the pixel control elements connected with one same vertical line are arranged on one side with respect to the respective horizontal lines to which the pixel control elements are connected, the side being different from a side on which the other pixel control elements connected with the same vertical line are arranged.

This configuration makes it possible to arrange a large switching element without significant deformation of the shape of the pixel electrode.

Among the pixel control elements, all of the pixel control elements connected with one same vertical line are arranged on the same side with respect to the respective horizontal lines to which the pixel control elements concerned are connected. This configuration also makes it possible to arrange a large switching element.

The above-described configuration can be such that the vertical lines are the data lines, and the horizontal lines are the gate lines. Alternatively, the above-described configuration can be such that the vertical lines are the gate lines, and the horizontal lines are the data lines.

A drain pad of each pixel control element is formed in a layer different in a lamination direction from a gate layer that forms the gate line, and in the gate layer, a region is provided for preventing an area of overlap between the drain pad and the gate layer from changing in a case where the drain pad and the gate layer are displaced from each other.

With this configuration, even in a case where the drain pad and the gate layer are displaced from each other, it is possible to prevent a change from occurring to the area of overlap between the drain pad and the gate layer. It is therefore possible to prevent a change from occurring to the capacitance between the drain pad and the gate layer, thereby suppressing the deterioration of the display quality caused by a change in the capacitance.

A display panel in one embodiment of the present invention includes: the above-described active matrix substrate; a counter substrate including a color filter and a counter electrode; and a liquid crystal layer interposed between the active matrix substrate and the counter substrate.

According to this configuration of the display panel, the driving circuit arranged region, in the active matrix substrate, can be made smaller, which allows the driving circuit non-arranged region to be made larger. Since the driving circuit non-arranged region is cuttable, the degree of freedom in forming the display panel in a shape other than the rectangular shape can be increased, and the degree of freedom in design of the display panel can be increased.

EMBODIMENT

The following describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted. Further, the dimension ratios of the constituent members illustrated in the drawings do not necessarily indicate the real dimension ratios. The display pixel illustrated in the drawings is assumed to have such a size as a short side of about 40 μm and a long side of about 120 but these are values set for convenience of explanation. The values do not necessarily indicate the real dimensions, and do not limit the embodiments.

Embodiment 1

(Configuration of Liquid Crystal Display Device)

FIG. 1 schematically illustrates a schematic configuration of a liquid crystal display device according to the present embodiment. The liquid crystal display device 1 includes a display panel 2, a source driver 3, a display control circuit 4, and a power source 5. The display panel 2 includes an active matrix substrate 20a, a counter substrate 20b, and a liquid crystal layer (not shown) interposed between these substrates. Though not shown in FIG. 1, polarizing plates are provided on the bottom surface side of the active matrix substrate 20a and on the top surface side of the counter substrate 20b. On the counter substrate 20b, there are formed a black matrix, color filters of three colors, which are red (R), green (G), and blue (B), and a common electrode (all are not shown).

As illustrated in FIG. 1, the active matrix substrate 20a is electrically connected with the source driver 3 formed on a flexible substrate. The display control circuit 4 is electrically connected with the display panel 2, the source driver 3, and the power source 5. The display control circuit 4 outputs control signals to the source driver 3, and driving circuits (referred to as gate drivers) formed on the active matrix substrate 20a, which are described below.

The control signals include a reset signal (CLR), clock signals (CKA, CKB), data signals and the like for displaying images on the display panel 2. The power source 5 is electrically connected with the display panel 2, the source driver 3, and the display control circuit 4, so as to supply a power source voltage signal to each.

(Configuration of Active Matrix Substrate)

Figure 2:
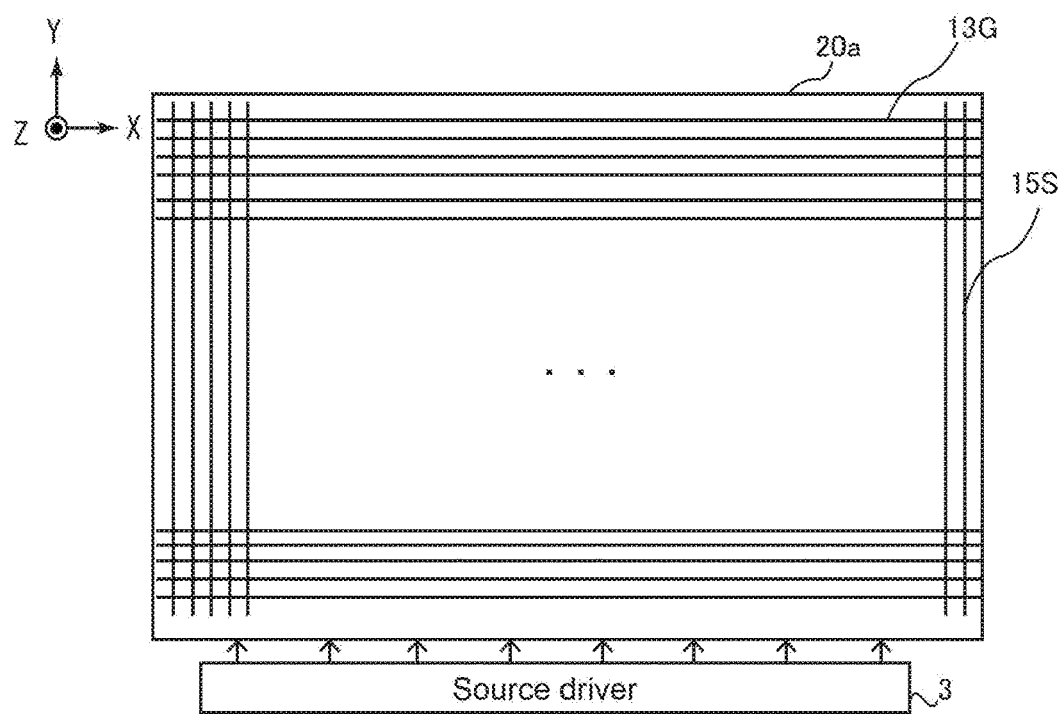
FIG. 2 is a schematic diagram illustrating a schematic configuration of an active matrix substrate.

FIG. 2 schematically illustrates a schematic configuration of the active matrix substrate 20a. On the active matrix substrate 20a, a plurality of gate lines 13G are formed substantially in parallel from one end to the other end in the X-axis direction of the active matrix substrate 20a. Further, on the active matrix substrate 20a, a plurality of source lines (data lines) 15S are formed approximately in parallel so as to extend in the Y axis direction, so as to intersect with the gate lines 13G. In other words, the source lines 15S are vertical lines extending in the vertical direction in plan view, and the gate lines 13G are horizontal lines extending in the horizontal direction in plan view.

As will be described later, TFTs for controlling the display of pixels (hereinafter referred to as pixel-TFTs) (pixel control elements) are provided in the vicinity of intersections between the gate lines 13G and the source lines 15S. Each pixel corresponds to a color filter of any color among the red (R), green (G), and blue (B) provided on the counter substrate 20b side. One display pixel is composed of three adjacent pixels of a red pixel, a green pixel, and a blue pixel, and is capable of displaying various colors.

Figure 3:
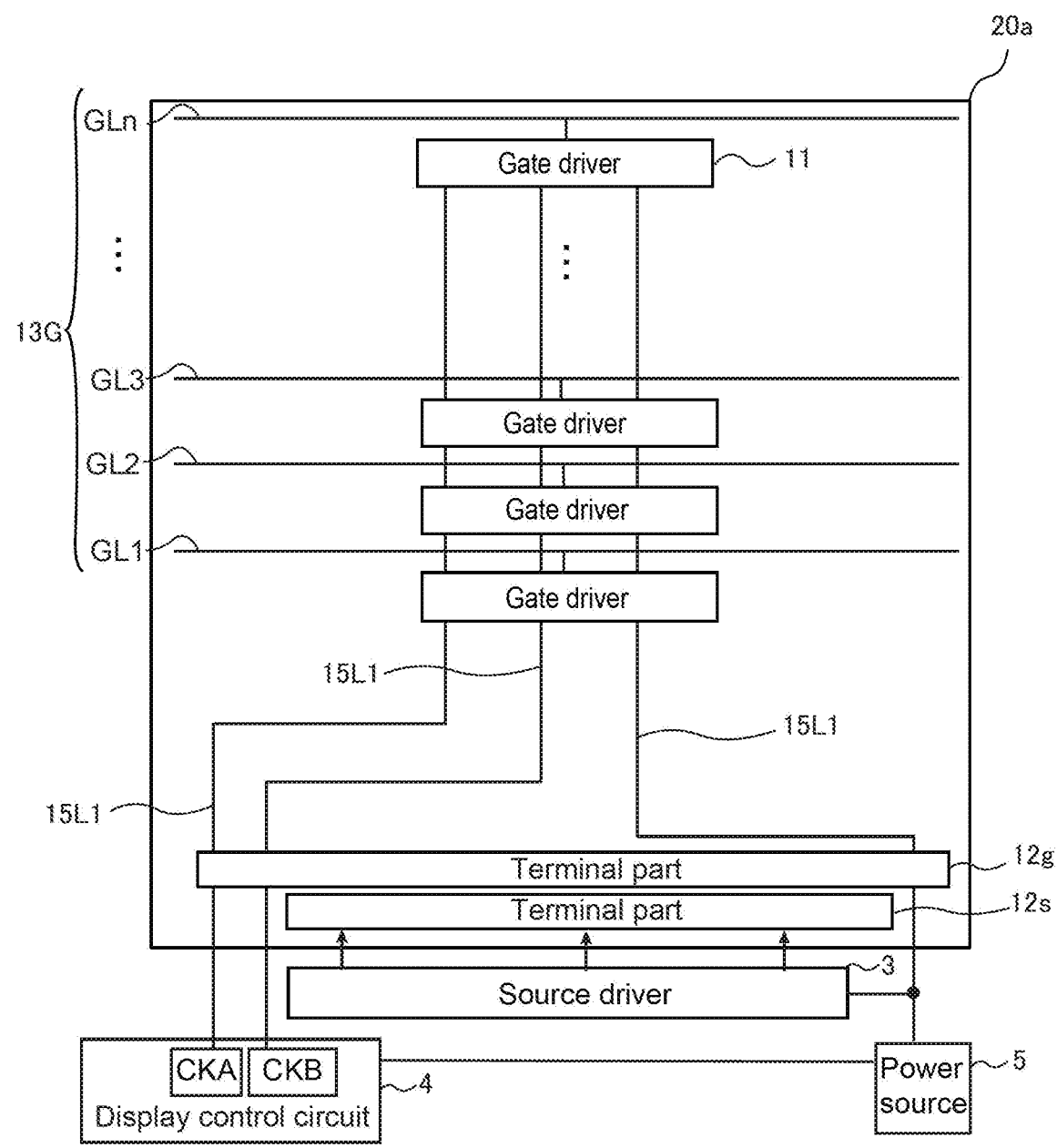
FIG. 3 is a schematic diagram illustrating a schematic configuration of an active matrix substrate, with the illustration of source lines being omitted, and respective parts connected with the active matrix substrate.

FIG. 3 is a schematic diagram illustrating a schematic configuration of the active matrix substrate 20a, with the illustration of the source lines 15S being omitted, and respective parts connected with the active matrix substrate 20a. As illustrated in the example illustrated in FIG. 3, the gate drivers 11 (the driving circuits) are formed in spaces between the gate lines 13G in the display region. In the example illustrated in FIG. 3, each of the gate lines 13G is connected with one gate driver 11, but may be connected with a plurality of the gate drivers 11.

In the display region of the active matrix substrate 20a, in a frame region on a side where the source driver 3 is provided, a terminal part 12g (a second terminal part) is formed. The terminal part 12g is connected with the display control circuit 4 and the power source 5. The terminal part 12g receives signals such as control signals (CKA, CKB) and a power source voltage signal output from the display control circuit 4 and the power source 5. The control signals (CKA, CKB), the power source voltage signal, and other signals input to the terminal part 12g are supplied to each gate driver 11 via the driver lines 15L1.

The gate driver 11 outputs a voltage signal indicating either one of the selected state and the non-selected state, to the gate line 13G connected therewith, according to the signals supplied thereto, and outputs the voltage signal to the gate line 13G of the next stage. In the following description, voltage signals respectively corresponding to the selected state and the non-selected state are referred to as "scanning signals" in some cases. Further, the state in which the gate line 13G is selected is referred to as "the driving of the gate line 13G".

Further, on the active matrix substrate 20a, in a frame region on a side where the source driver 3 is provided, a terminal part 12s (a first terminal part) that connects the source driver 3 and the source lines 15S is formed. The source driver 3 outputs data signals to each source line 15S according to the control signals input from the display control circuit 4.

(Configuration of Gate Driver)

Figure 4:
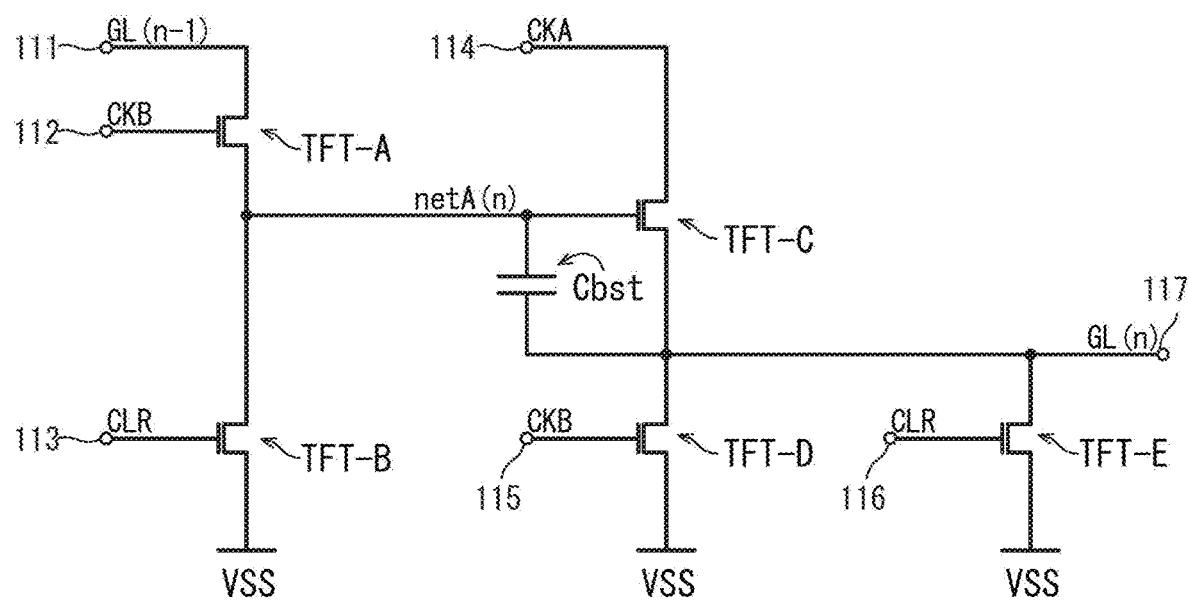
FIG. 4 illustrates an exemplary equivalent circuit of a gate driver for driving a gate line of GL(n).

Here, the configuration of the gate driver 11 in the present embodiment is described. FIG. 4 illustrates an exemplary equivalent circuit of the gate driver 11 for driving the gate line 13G of GL(n). As illustrated in FIG. 4, the gate driver 11 includes TFTs-A to -E formed with thin film transistors (TFTs) as switching elements, a capacitor Cbst, terminals 111 to 117, and a group of terminals to which the power source voltage signal at a low level is input.

The terminal 111 receives a set signal (S) through the gate line 13G of GL(n−1) of the previous stage. The terminal 111 of the gate driver 11 connected to the gate line 13G of GL(1) receives a gate startpulse signal (S) output from the display control circuit 4. The terminals 113, 116 receive the reset signal (CLR) output from the display control circuit 4. The terminal 114 receives the clock signal (CKA) input thereto. The terminals 112, 115 receive the clock signal (CKB) input thereto. The terminal 117 outputs the set signal (S) to the gate line 13G of the subsequent stage.

Figure 5:
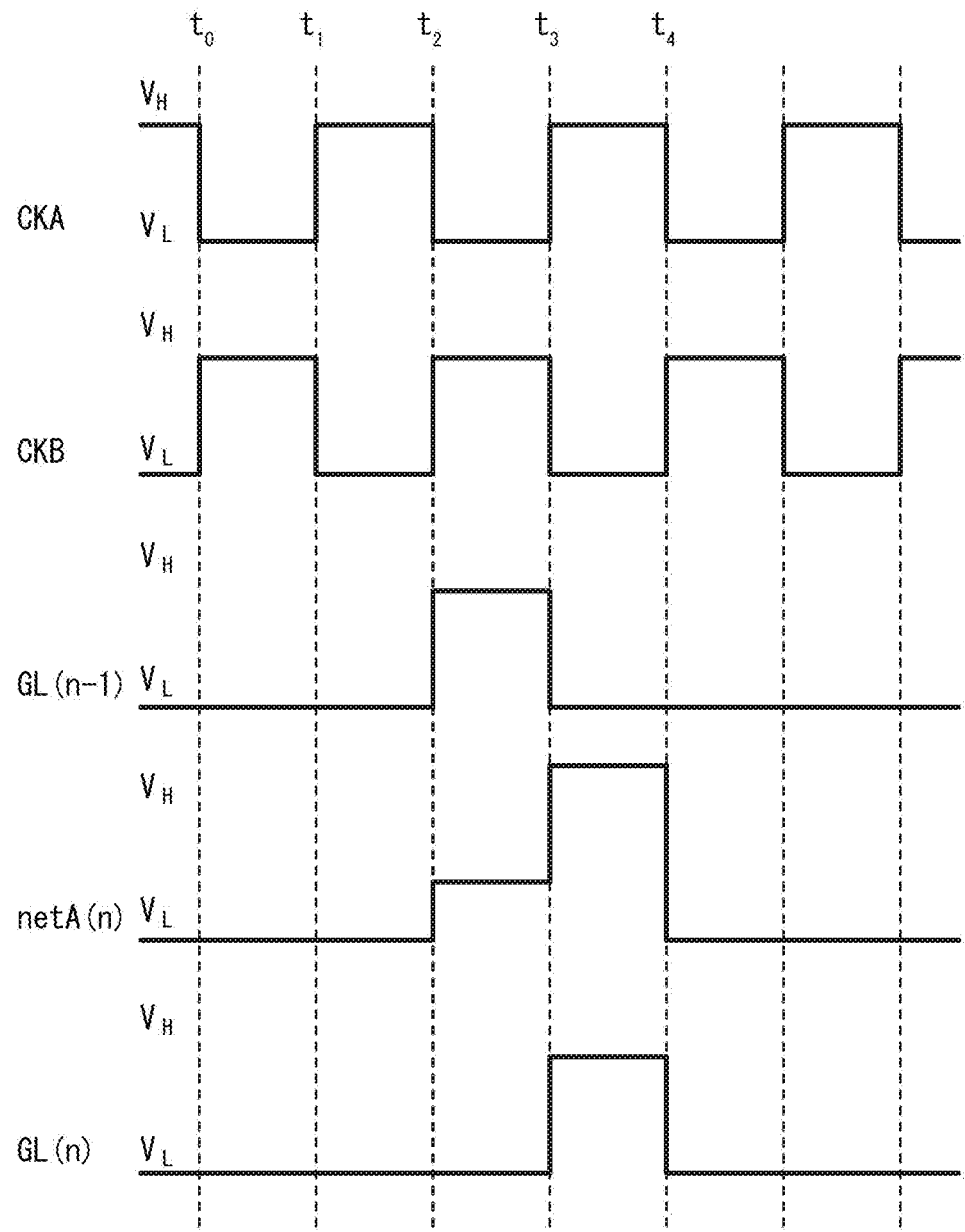
FIG. 5 is a timing chart when the gate driver scans gate lines.

The clock signal (CKA) and the clock signal (CKB) are two-phase clock signals whose phases are reversed every horizontal scanning period (see FIG. 5).

In FIG. 4, the line to which the source terminal of TFT-A, the drain terminal of TFT-B, one of electrodes of the capacitor Cbst, and the gate terminal of TFT-C are connected is referred to as "netA(n)".

The gate terminal of TFT-A is connected with the terminal 112, the drain terminal thereof is connected with the terminal 111, and the source terminal thereof is connected to netA(n).

The gate terminal of TFT-B is connected with the terminal 113, the drain terminal thereof is connected with netA(n), and the source terminal thereof is connected to the power source voltage terminal VSS.

The gate terminal of TFT-C is connected with netA(n), the drain terminal thereof is connected with the terminal 114, and the source terminal thereof is connected with the output terminal 117.

Regarding the capacitor Cbst, one of electrodes thereof is connected with netA(n), and the other electrode thereof is connected with the terminal 117.

The gate terminal of TFT-D is connected with the terminal 115, the drain terminal thereof is connected with the terminal 117, and the source terminal thereof is connected to the power source voltage terminal VSS.

The gate terminal of TFT-E is connected with the terminal 116, the drain terminal thereof is connected with the terminal 117, and the source terminal thereof is connected to the power source voltage terminal VSS.

(Operation of Gate Driver)

Next, the operation of the gate driver 11 is described with reference to FIGS. 4 and 5. FIG. 5 is a timing chart when the gate driver 11 scans the gate lines 13G. In FIG. 5, the period from t3 to t4 is a period while the gate line of GL(n) is selected. The clock signal (CKA) and the clock signal (CKB), supplied from the display control circuit 4, whose phases are reversed every horizontal scanning period, are input to the gate driver 11 through the terminals 112, 114, and 115. Further, though the illustration is omitted in FIG. 5, the reset signal (CLR), which is maintained at the H (High) level for a certain set period during every perpendicular scanning period, is input from the display control circuit 4, through the terminals 113 and 116, to the gate driver 11. When the reset signal (CLR) is input, the netA(n) and the gate line 13G make a transition to the L (Low) level.

From time 0 to t1 in FIG. 5, the clock signal (CKA) at the L level is input to the terminal 114, and the clock signal (CKB) at the H level is input to the terminals 112 and 115. This causes TFT-A and TFT-D shift to the ON state, netA(n) is charged to the power source voltage (VSS) at the L level, TFT-C is turned OFF, and a potential at the L level is output from the terminal 117.

Next, at time t1, when the clock signal (CKA) shifts to the H level and the clock signal (CKB) shifts to the L level, TFT-A and TFT-D are turned OFF, the potential of netA(n) is maintained at the L level, and a potential at the L level is output from the terminal 117.

At time t2, the clock signal (CKA) shifts to the L level, the clock signal (CKB) shifts to the H level, and the set signal (S) is input to the terminal 111 via the gate line of GL(n−1). This causes TFT-A to be turned ON, and netA(n) is charged to a potential obtained by lowering the H level by the threshold voltage of the TFT-A. Since TFT-D is in the ON state during this period, a potential at the L level is output from the terminal 117.

At time t3, when the clock signal (CKA) shifts to the H level and the clock signal (CKB) shifts to the L level, TFT-C is turned ON, and TFT-D is turned OFF. This causes the potential of the terminal 117 to start being charged to the H level. Simultaneously, netA(n) is charged to a further higher potential through the capacitor Cbst. Here, the configuration is designed so that the potential of netA(n) is higher a potential obtained by raising the H level by the threshold voltage of TFT-C. Since this causes TFT-C to maintain the ON state, the gate line 13G of GL(n) connected to the terminal 117 is charged to the H level, and shifts to the selected state.

At time t4, when the clock signal (CKA) shifts to the L level and the clock signal (CKB) shifts to the H level, the potential of netA(n) shifts to the L level through TFT-A, and TFT-C is turned OFF. Further, TFT-D is turned ON, and therefore, a potential at the L level is output from the terminal 117.

In this way, the set signal (S) is output from the terminal 117 of the gate driver 11 to the gate line 13G, whereby the gate line 13G shifts to the selected state. The liquid crystal display device 1 sequentially scans the gate lines 13G by the gate drivers 11 connected respectively to the gate lines 13G, and supplies data signals to the source lines 15S, respectively, by using the source driver 3, thereby causing images to be displayed on the display panel 2.

As described above, in the conventional active matrix substrate, a plurality of the gate lines 13G extending in the horizontal direction when viewed in a plan view are arranged at regular intervals. Further, the pixel-TFTs (pixel control elements) are arranged in areas between the pixels adjacent in the vertical direction, and in these areas, there are arranged TFTs such as TFTs-A to -E (hereinafter, referred to as driver TFTs) that compose the gate driver 11. In such an arrangement configuration, however, since the pixel-TFTs are provided in the vicinity of the driver TFTs, large driver TFTs cannot be arranged.

In the active matrix substrate in the present embodiment, therefore, a plurality of the gate lines 13G (horizontal lines) are arranged at irregular intervals, and in some of the areas between the pixels adjacent in the vertical direction, no pixel-TFT is arranged, and therein the driver TFTs are arranged.

Further, in the present embodiment, among the pixel-TFTs, a part of the pixel-TFTs connected with the same source line 15S (vertical line) are arranged on a side with respect to the respective gate lines 13G to which the pixel-TFTs are connected, the side being different from the side on which the other pixel-TFTs connected with the same source line 15S are arranged.

More specifically, among the intervals between adjacent two of the gate lines 13G, the interval between two gate lines 13G positioned on both sides of the position where the driver-TFT is arranged is widest. The pixel-TFT connected with the gate line 13G positioned upper adjacent to the position where the driver-TFT is arranged is arranged on the upper side with respect to the gate line 13G to which the pixel-TFT is connected. Further, the pixel-TFT connected with the gate line 13G positioned lower adjacent to the position where the driver-TFT is arranged is arranged on the lower side with respect to the gate line 13G to which the pixel-TFT is connected.

Figure 6:
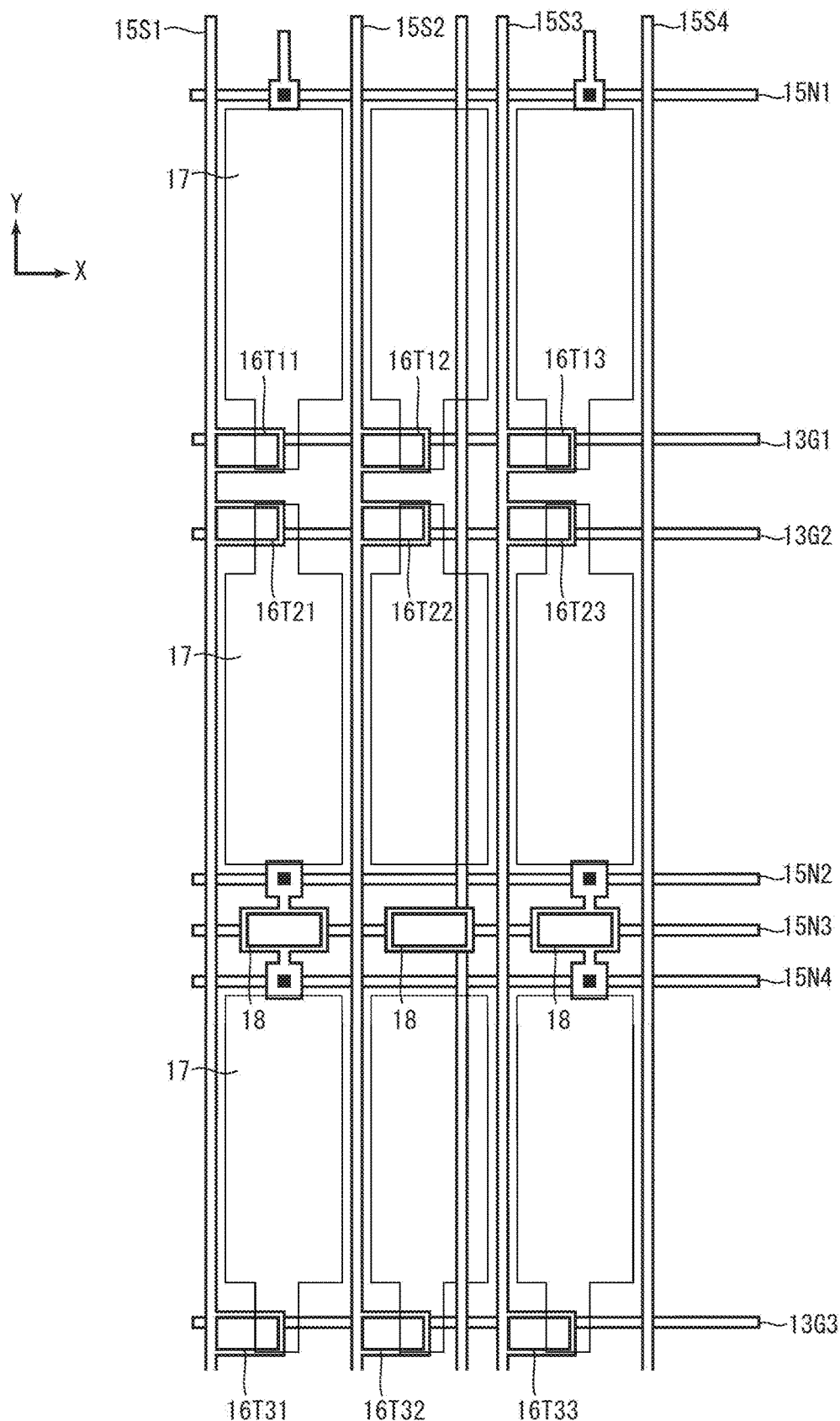
FIG. 6 is a schematic diagram for explaining a configuration of an active matrix substrate in Embodiment 1.

FIG. 6 is a schematic diagram for explaining a configuration of the active matrix substrate 20a in the present embodiment. The interval between the gate line 13G1 and the gate line 13G2, and the interval between the gate line 13G2 and the gate line 13G3 are different from each other. More specifically, the interval between the gate line 13G2 and the gate line 13G3 is wider than the interval between the gate line 13G1 and the gate line 13G2, and these gate lines are apart from each other by two pixels in the Y direction. In FIG. 6, the pixel electrodes 17 of the respective pixels are illustrated as well.

Further, among the pixel-TFTs 16T11, 16T21, and 16T31 connected with the same source line 15S1, the pixel-TFT 16T11 connected with the gate line 13G1, and the pixel-TFT 16T31 connected with the gate line 13G3 are arranged on the lower side with respect to the respective gate lines 13G to which these pixel-TFTs are connected, respectively, and on the other hand, the pixel-TFT 16T21 connected with the gate line 13G2 is arranged on the upper side with respect to the gate line 13G to which the TFT 16T21 is connected.

The driver-TFT 18 is arranged in an area between the gate line 13G2 and the gate line 13G3 arranged at a wider interval, among areas between adjacent twos of the gate lines 13G, the area being an area where no pixel-TFT 16T is arranged, among areas between pixels that are adjacent with each other in the vertical direction.

Figure 7A:
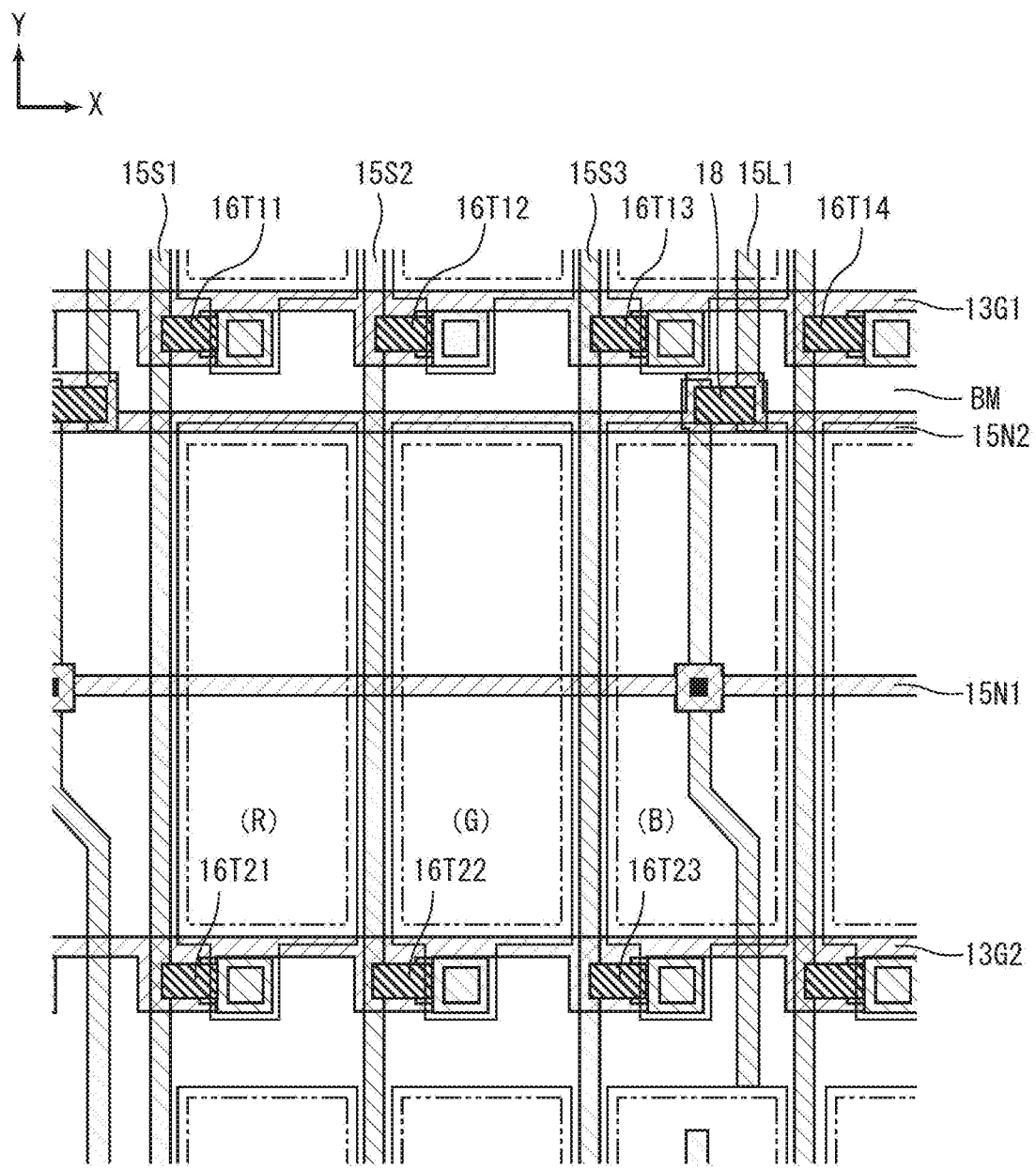
FIG. 7A illustrates a configuration of a conventional active matrix substrate.
Figure 7B:
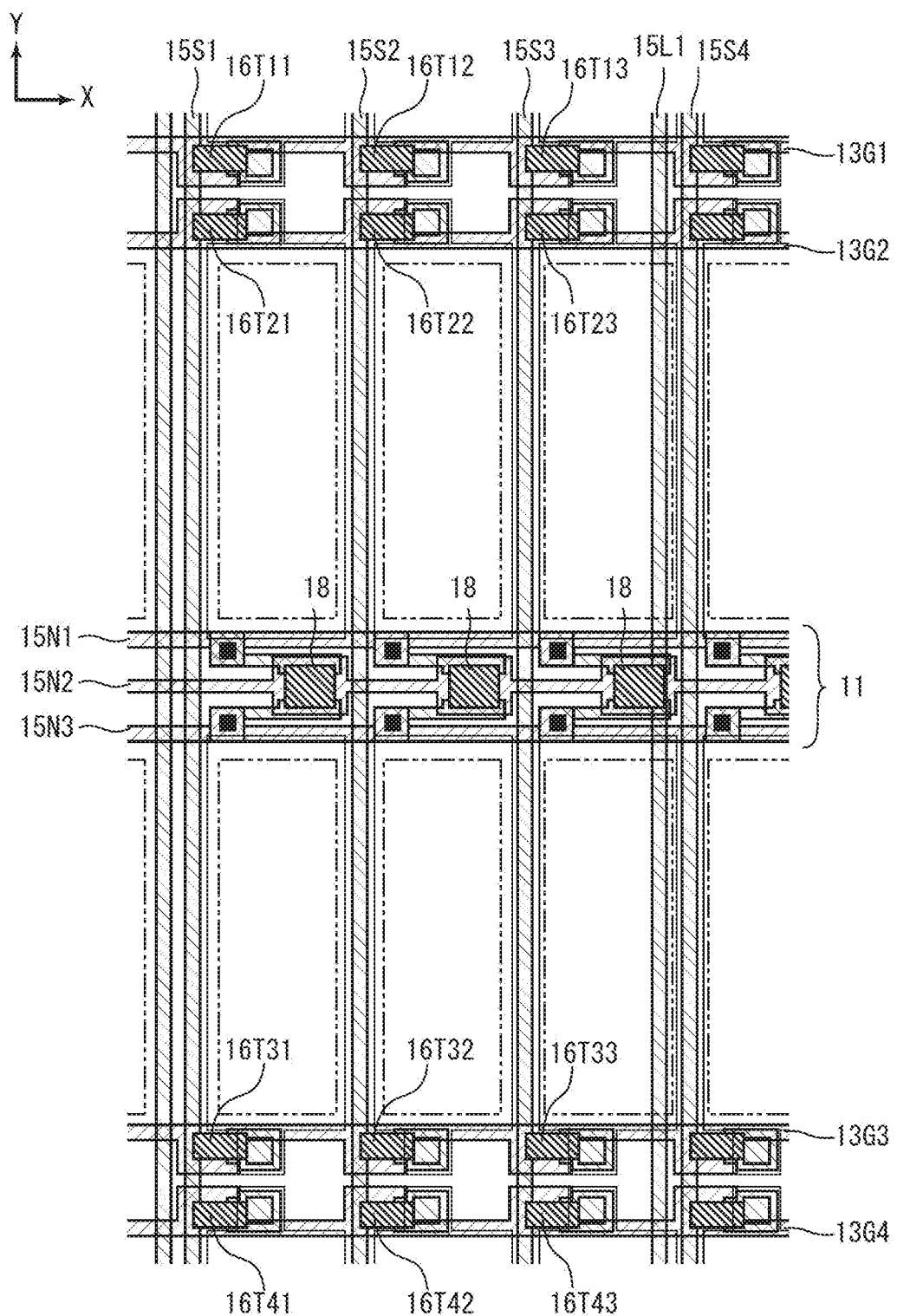
FIG. 7B illustrates a configuration of the active matrix substrate in Embodiment 1.

FIGS. 7A and 7B are diagrams for comparing and explaining the configuration of the active matrix substrate 20a in the present embodiment, and a configuration of the conventional active matrix substrate in which the intervals between adjacent ones of the source lines are approximately identical and a plurality of pixel-TFTs connected to the same gate line 13B are arranged on the same side. FIG. 7A illustrates a configuration of the conventional active matrix substrate, and FIG. 7B illustrates a configuration of the active matrix substrate 20a in the present embodiment.

In FIGS. 7A and 7B, the descriptions of "(red)", "(blue)", and "(green)" indicate the colors of corresponding color filters. Further, in FIGS. 7A and 7B, the area denoted by "BM", which is indicated by alternate long and two short dashed lines, is a light-shielding area BM in which light is blocked by a black matrix (not shown) formed on the counter substrate 20b.

In the conventional active matrix substrate, intervals between adjacent ones of the gate lines 13G are regular intervals, and intervals between adjacent ones of the source lines 15S are regular intervals. Further, a plurality of the pixel-TFTs 16T connected with the same source line 15S are arranged on the same side with respect to the respective gate lines 13G to which the pixel-TFTs 16T are connected. In the example illustrated in FIG. 7A, the pixel-TFTs 16T11 and 16T21 connected with the same source line 15S1 are arranged on the lower side with respect to the respective gate lines 13G to which the pixel-TFTs are connected.

In the conventional active matrix substrate, the driver TFT 18 is arranged in the light-shielding area BM between the pixels adjacent in the Y axis direction. Since the pixel-TFT 18 is also arranged in the same area, as illustrated in FIG. 7A, however, a large driver TFT 18 cannot be arranged therein. Further, since the driver TFT 18 and the pixel-TFT 16T are close to each other in terms of distance, the drain pad as an element electrically connected with the pixel electrode 17 and the driver line 15N2 are close to each other in terms of distance, whereby the capacitive coupling is large.

On the other hand, in the active matrix substrate 20a in the present embodiment 20a, as illustrated in FIG. 7 B, intervals between adjacent ones of the source lines 15S are regular intervals, but intervals between adjacent ones of the gate lines 13G are irregular intervals. Further, among a plurality of pixel-TFTs 16T connected with the same source line 15S, a part of the pixel-TFTs 16T are arranged on a different side with respect to the respective gate lines 13G to which the pixel-TFTs are connected. For example, among the pixel-TFTs 16T11, 16T21 connected with the source line 15S1, the pixel-TFT 16T11 is arranged on the lower side with respect to the gate line 13G1 to which the pixel-TFT 16T11 is connected, and the pixel-TFT 16T21 is arranged on the upper side with respect to the gate line 13G2 to which the pixel-TFT 16T21 is connected.

The driver-TFT 18 is arranged in an area between the gate lines 13G2 and 13G3 arranged at a wider interval, among areas between adjacent ones of the gate lines 13G, and in the light-shielding area BM between the pixels adjacent in the Y axis direction. In this area, no pixel-TFT 16T is arranged, as illustrated in FIG. 7B.

In other words, according to the active matrix substrate 20*a* in the present embodiment 20*a*, an area exclusively for the driver TFT 18 where no pixel-TFT 16T is arranged can be provided in the light-shielding area BM between the pixels adjacent in the Y axis direction. This allows a large driver TFT 18 to be arranged, without a decrease in the aperture ratio, as compared with the conventional active matrix substrate. Further, this makes it easier to arrange an element needing a large area such as an electrostatic protection circuit or a capacitor forming portion in an area where the driver TFT 18 is arranged.

Further, the driver TFT 18 is apart from the pixel-TFT 16T in the Y axis direction by about one pixel. This makes it possible to increase the distance between the drain pad as an element electrically connected with the pixel electrode 17 and the driver lines 15N1 to 15N3, thereby decreasing capacitive coupling therebetween. This makes it possible to decrease noise propagation from the driver lines 15N1 to 15N3 with respect to the pixel potential, and improve the image quality.

Figure 8A:
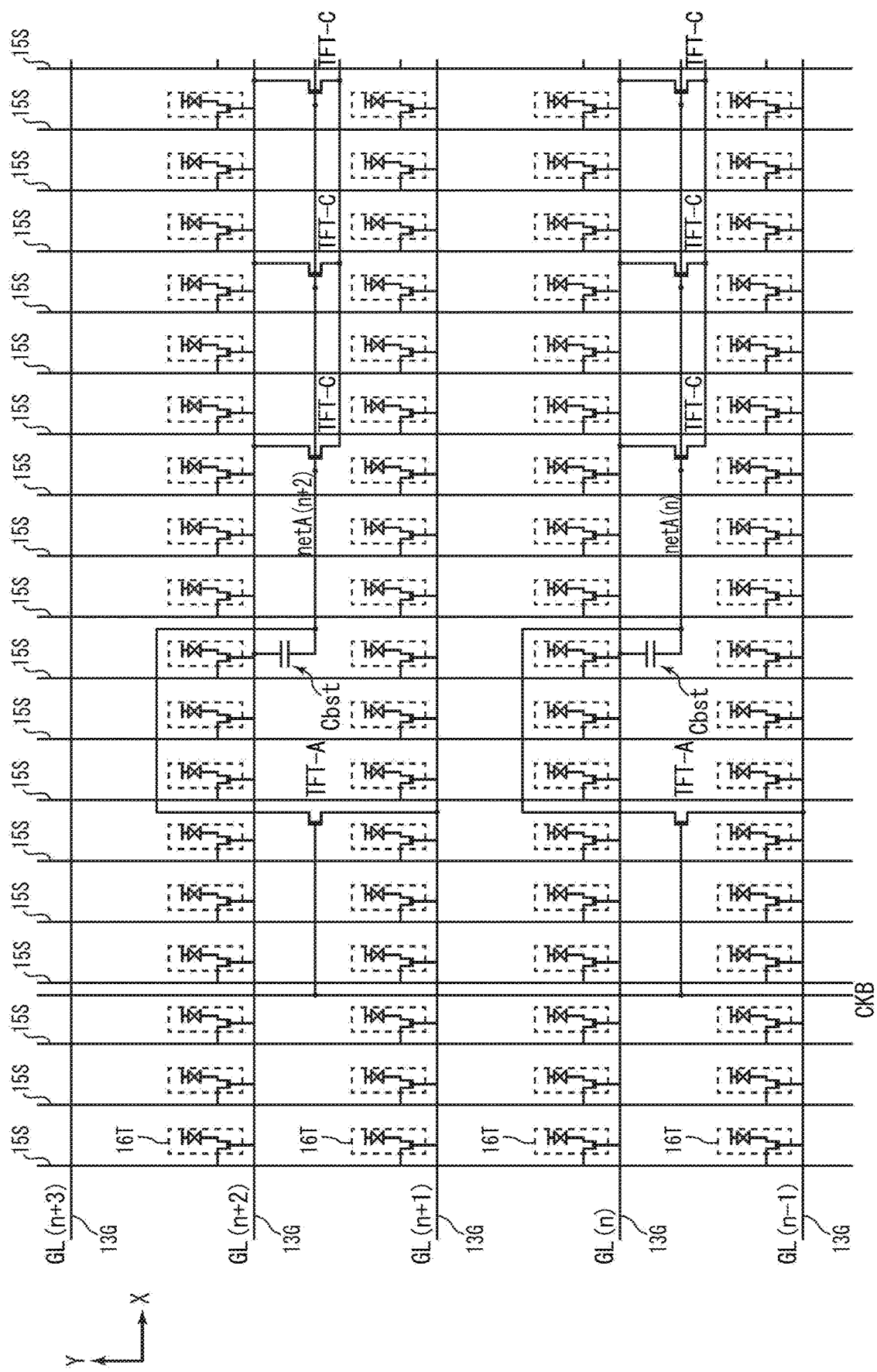
FIG. 8A illustrates an exemplary equivalent circuit in a case where the circuit of the gate driver illustrated in FIG. 4 is arranged in the display region of the conventional active matrix substrate illustrated in FIG. 7A.
Figure 8B:
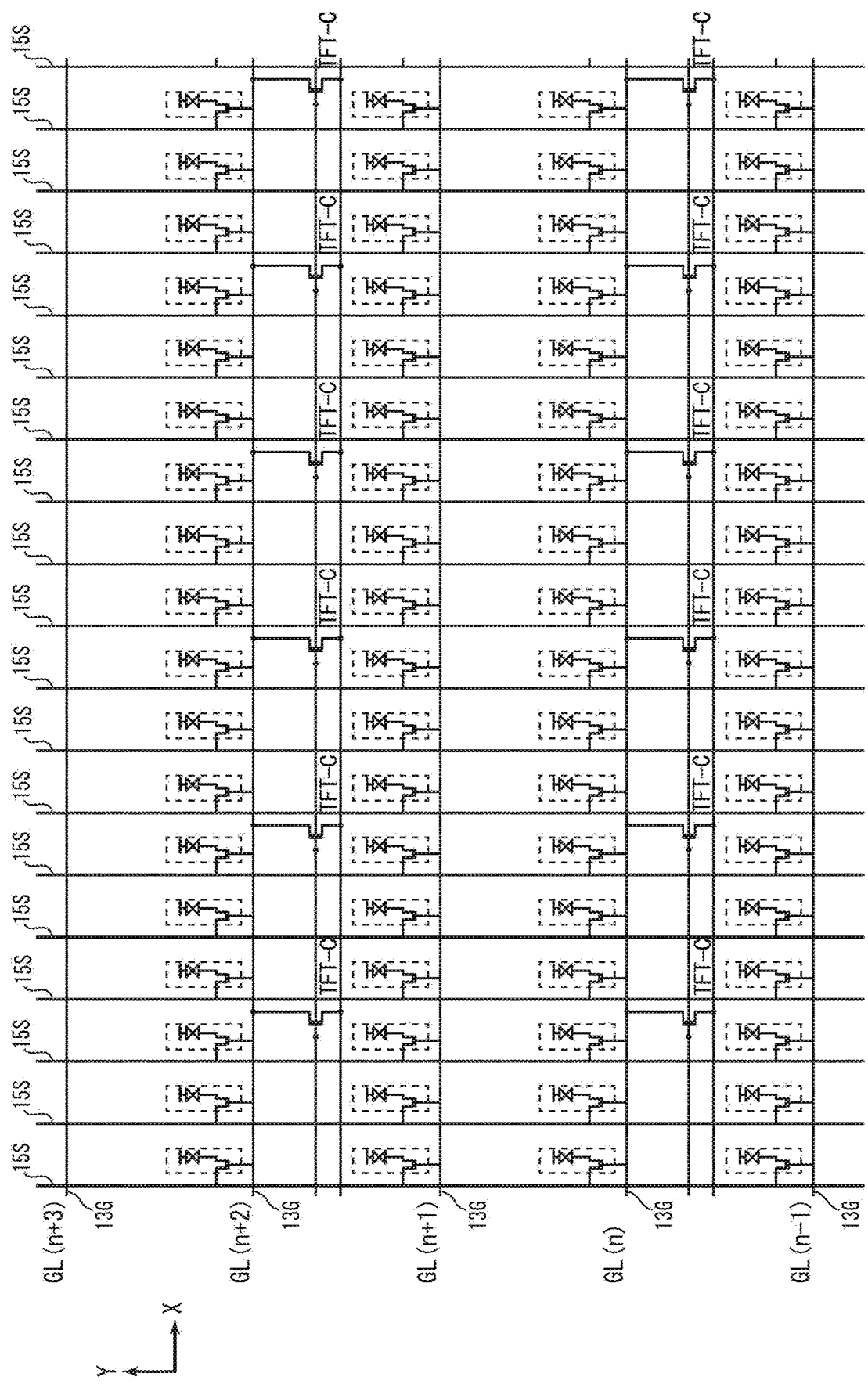
FIG. 8B illustrates an exemplary equivalent circuit in a case where the circuit of the gate driver illustrated in FIG. 4 is arranged in the display region of the conventional active matrix substrate illustrated in FIG. 7A.
Figure 8C:
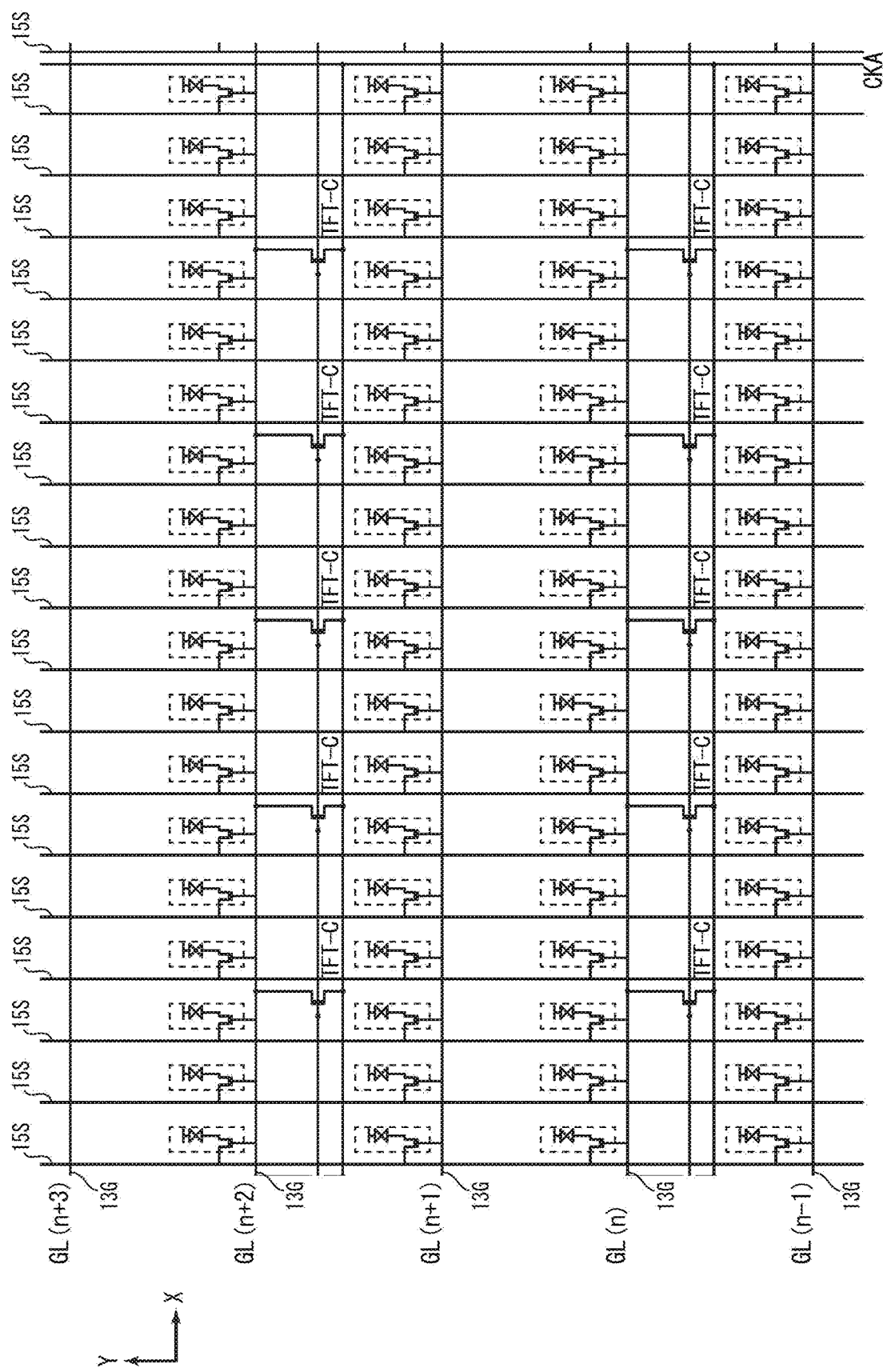
FIG. 8C illustrates an exemplary equivalent circuit in a case where the circuit of the gate driver illustrated in FIG. 4 is arranged in the display region of the conventional active matrix substrate illustrated in FIG. 7A.
Figure 8D:
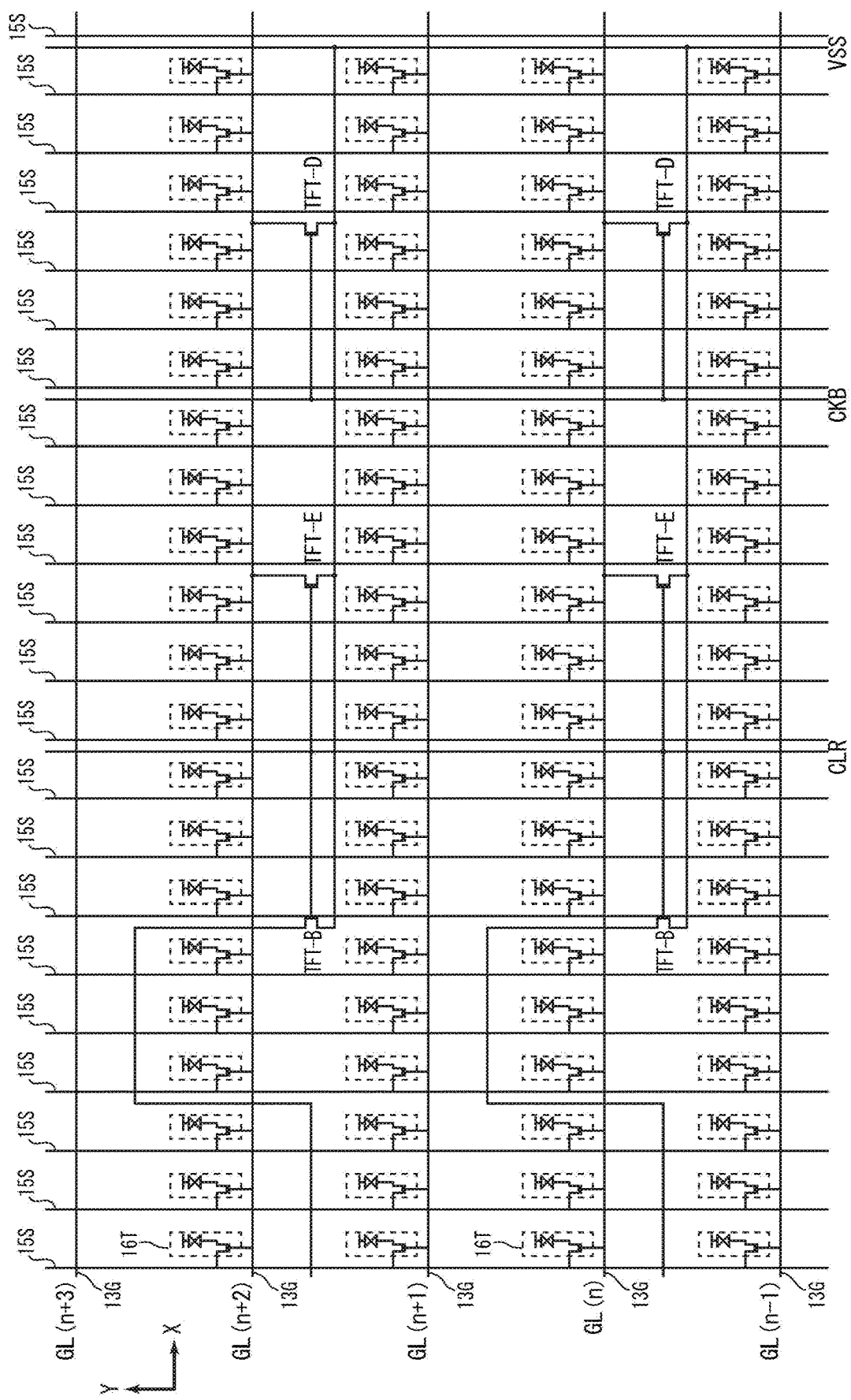
FIG. 8D illustrates an exemplary equivalent circuit in a case where the circuit of the gate driver illustrated in FIG. 4 is arranged in the display region of the conventional active matrix substrate illustrated in FIG. 7A.

FIGS. 8A to 8D illustrate an exemplary equivalent circuit in a case where the circuit of the gate driver 11 illustrated in FIG. 4 is arranged in the display region of the conventional active matrix substrate illustrated in FIG. 7A. In view of the size of the diagram drawn herein, one circuit diagram is divided into four diagrams of FIGS. 8A to 8D. For example, the source line 15S shown at the right end of FIG. 8A is the same as the source line 15S shown at the left end of FIG. 8B. Further, the source line 15S shown at the right end of FIG. 8B is the same as the source line 15S shown at the left end of FIG. 8C. Still further, the source line 15S shown at the right end of FIG. 8C is the same as the source line 15S shown at the left end of FIG. 8D.

In the example illustrated in FIGS. 8A to 8D, only a TFT-C (driver-TFT 18) having a length of at most 6 μm in the X axis direction can be arranged per one display pixel. In a case where the requirements for the TFT-C to be arranged are assumed to be the length L in the Y axis direction=6 μm, and the length W in the X axis direction>80 μm, it is necessary to arrange 14 TFTs-C having the length L in the Y axis direction=6 μm, and the length W in the X axis direction=6 μm (6 μm×14=84 μm>80 μm). In a case where one TFT-C is arranged per one display pixel, it is necessary to arrange TFTs-C over 14 display pixels.

Figure 9:
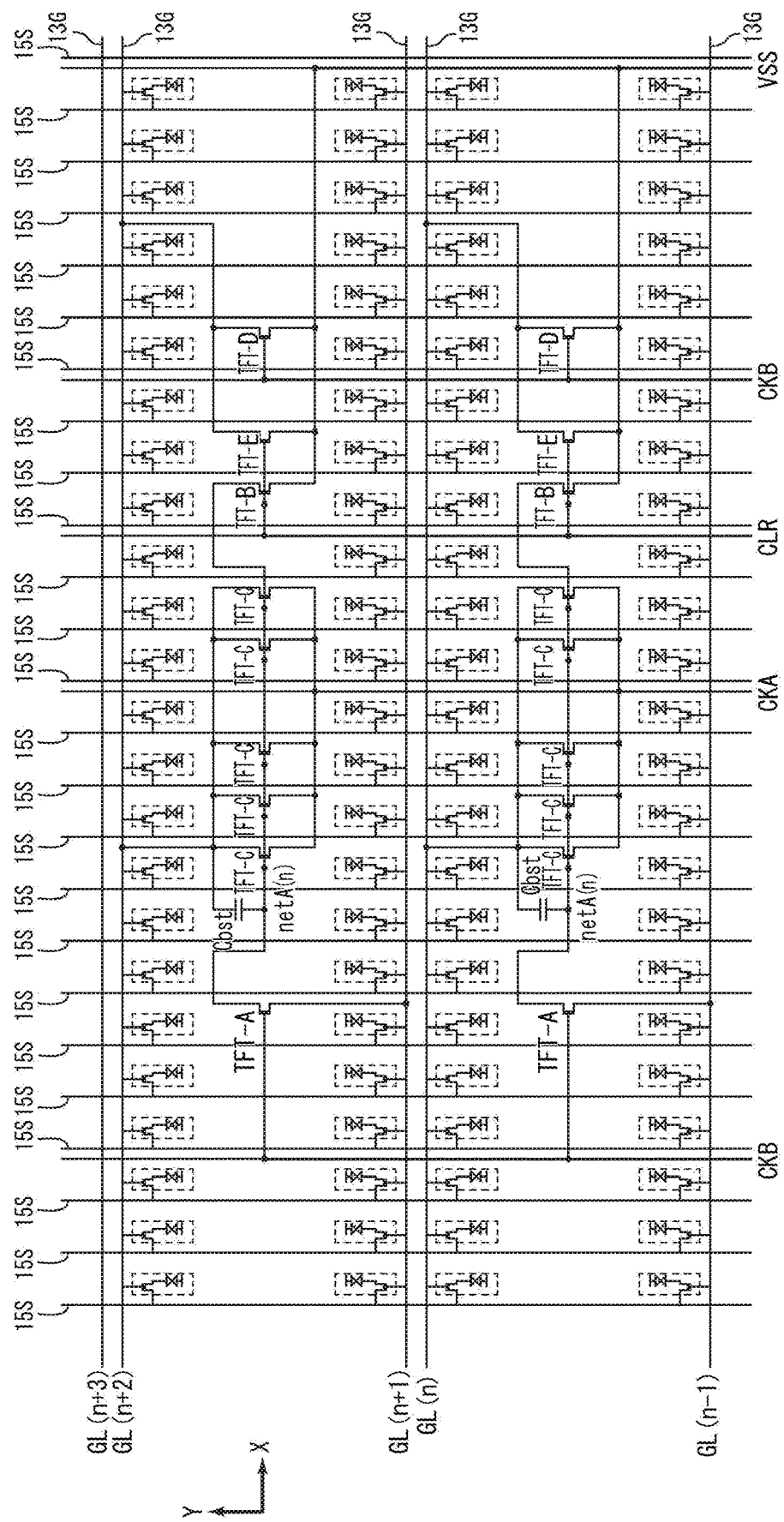
FIG. 9 illustrates an exemplary equivalent circuit in a case where the circuit of the gate driver illustrated in FIG. 4 is arranged in the display region of the active matrix substrate in Embodiment 1.
Figure 10:
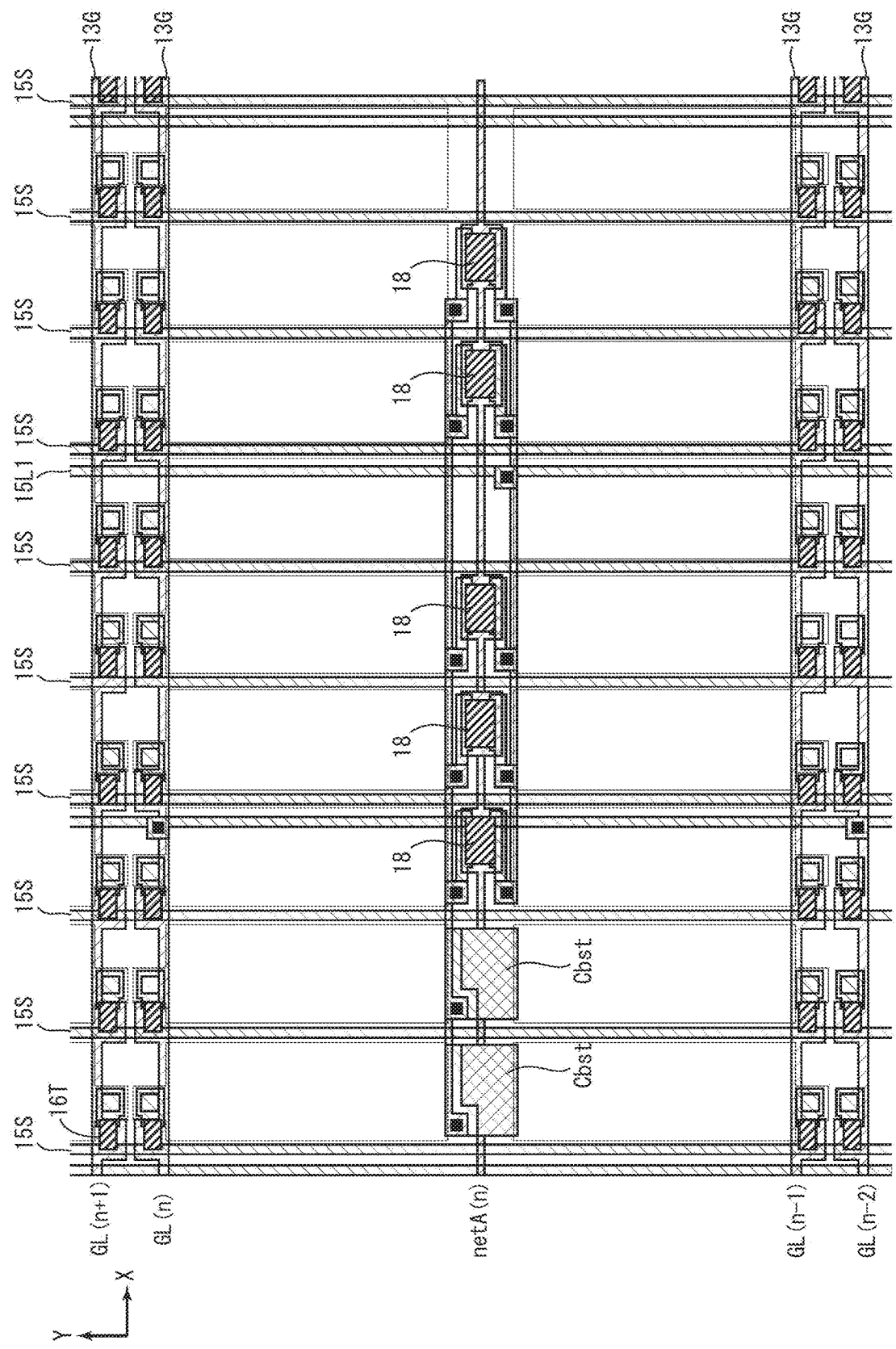
FIG. 10 illustrates the TFT-C (driver TFT) excerpted from FIG. 9 and enlarged.

FIG. 9 illustrates an exemplary equivalent circuit in a case where the circuit of the gate driver 11 illustrated in FIG. 4 is arranged in the display region of the active matrix substrate 20*a* in the present embodiment. FIG. 10 illustrates a part of the TFTs-C (driver-TFTs 18) excerpted from FIG. 9 and enlarged.

As described above, in the active matrix substrate 20*a* in the present embodiment, larger driver-TFTs 18 can be arranged, as compared with the case of the conventional active matrix substrate. In the example illustrated in FIGS. 9 and 10, a TFT-C (driver-TFT 18) having a length of 6 μm in the Y axis direction and a length of 16 μm in the X axis direction can be arranged. In a case where the requirements for the TFT-C to be arranged are assumed to be the length L in the Y axis direction=6 μm, and the length W in the X axis direction>80 μm, therefore, five TFTs-C having the length L in the Y axis direction=6 μm, and the length W in the X axis direction=16 μm may be arranged (16×5=80 μm). As illustrated in FIG. 10, a plurality of TFTs-C can be arranged per one display pixel, it is only required to arrange TFTs-C over three display pixels, in the exemplary arrangement illustrated in FIG. 10. This can make the area for arranging the gate driver 11 smaller, as compared with the case of the conventional active matrix substrate.

In the active matrix substrate 20*a* in the present embodiment, the area for arranging the entire gate driver 11 can be made smaller, which allows the length of the internal node to decrease, as compared with the conventional active matrix substrate. The internal node is a line corresponding to netA illustrated in FIG. 4. The decrease of the length of the internal node allows the parasitic capacitance of the internal node to decrease, resulting in a decrease in the electric power consumption.

In addition, the decrease of the length of the internal node causes the points of connection between the internal node in the X axis direction and the source lines 15S in the Y axis direction to decrease. Still further, as compared with the conventional active matrix substrate, a larger driver TFT 18 can be arranged, which results in a decrease in the number of the drivers TFT 18. This therefore makes it possible to decrease the points of connection between the driver lines in the Y axis direction and the gate lines 13G in the X axis direction.

Figure 11A:
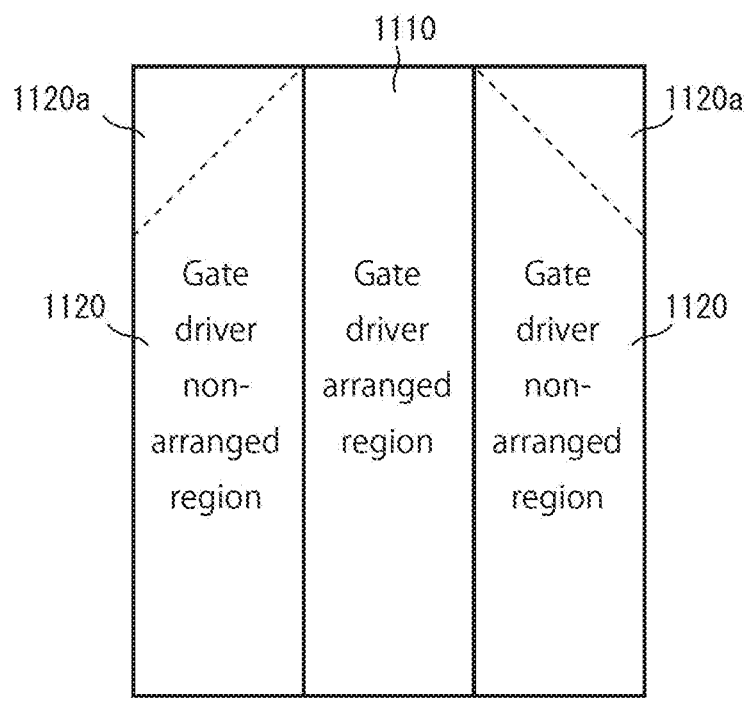
FIG. 11A schematically illustrates a gate driver arranged region and gate driver non-arranged regions in the conventional active matrix substrate.
Figure 11B:
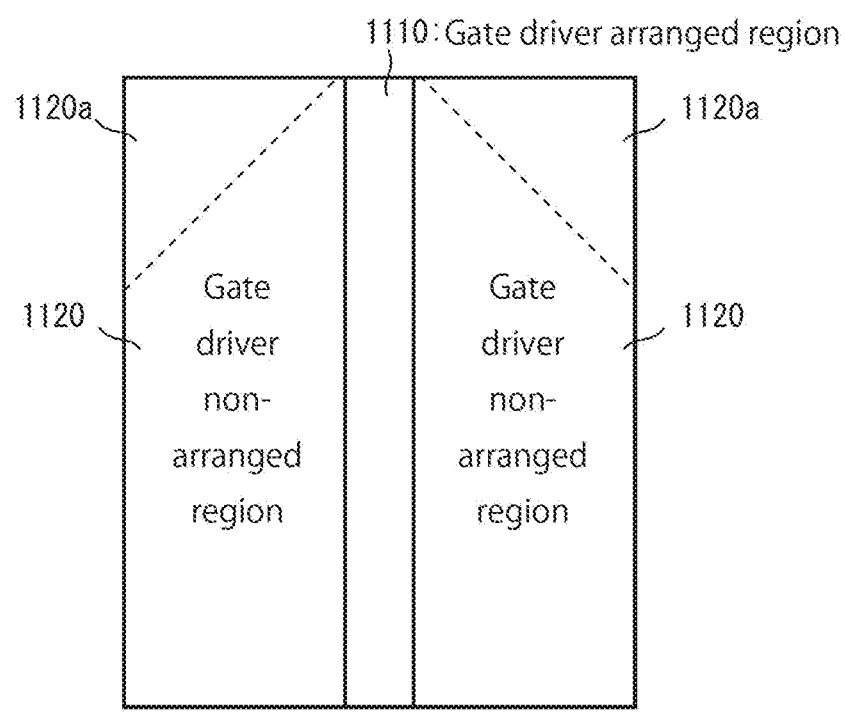
FIG. 11B schematically illustrates a gate driver arranged region and gate driver non-arranged regions in the active matrix substrate Embodiment 1.

FIG. 11A schematically illustrates a gate driver arranged region 1110 where the gate drivers 11 are arranged, and gate driver non-arranged regions 1120 where no gate driver 11 is arranged, in the conventional active matrix substrate. FIG. 11B schematically illustrates a gate driver arranged region 1110 where the gate drivers 11 are arranged and gate driver non-arranged regions 1120 where no gate driver 11 is arranged, in the active matrix substrate 20*a* of the present embodiment.

As described with reference to FIGS. 8A to 8D, and FIG. 9, the gate driver arranged region 1110 where the gate drivers 11 are arranged can be smaller in size, in the active matrix substrate 20*a* in the present embodiment, as compared with the conventional active matrix substrate. This allows the gate driver non-arranged region 1120, where no gate driver 11 is arranged, to be larger (see FIGS. 11A and 11B).

The gate driver non-arranged region 1120, where no gate driver 11 is arranged, is cuttable. FIGS. 11A and 11B illustrate an exemplary cuttable area as an area 1120*a*. In the case of the active matrix substrate 20*a* in the present embodiment, as compared with the conventional active matrix substrate, the gate driver non-arranged region 1120, where the gate drivers 11 are arranged, can be larger, which allows the cuttable area 1120*a* to be larger. This enables to increase the degree of freedom when the display panel 2 is formed in a shape other than the rectangular shape, thereby increasing the degree of freedom in the design of the liquid crystal display device 1.

Embodiment 2

In the active matrix substrate 20*a* in Embodiment 1, the source lines 15S are arranged for the respective colors, and the gate lines 13G are arranged for the respective pixels. In the active matrix substrate 20*a* in Embodiment 2, the gate lines 13G are arranged for respective colors, and the source lines 15S are arranged for respective pixels. In other words, the gate lines 13G are vertical lines that extend in the vertical direction in plan view, and the source lines 15S are horizontal lines that extend in the horizontal direction in plan view.

In the active matrix substrate 20*a* in the present embodiment, the intervals between adjacent ones of the source lines 15S are, not regular intervals, but irregular intervals. Besides, among a plurality of the pixel-TFTs 16T connected with the same gate line 13G, a part of the pixel-TFTs 16T are arranged on a different side with respect to the respective gate lines 13G to which the pixel-TFTs 16T are connected.

More specifically, among the intervals between adjacent two source lines 15S, the interval between the two source lines 15S positioned on both sides of the position where the driver-TFT 18 is arranged is widest. Further, the pixel-TFT 16T connected with the source line 15S positioned upper adjacent to the driver-TFT 18 arranged position is arranged on the upper side with respect to the source line 15S to which the pixel-TFT 16T concerned is connected, and the pixel-TFT 16T connected with the source line 15S positioned lower adjacent to the driver-TFT 18 arranged position is arranged on the lower side to the source line 15S to which the pixel-TFT 16T concerned is connected.

The driver-TFT 18 is arranged in an area between adjacent two of the source lines 15S arranged at a wider interval, among areas between adjacent ones of the source lines 15S, and in the light-shielding area BM between the pixels adjacent in the Y axis direction. In this part of the light-shielding area BM where the driver-TFT 18 is arranged, no pixel-TFT 16T is arranged.

Figure 12A:
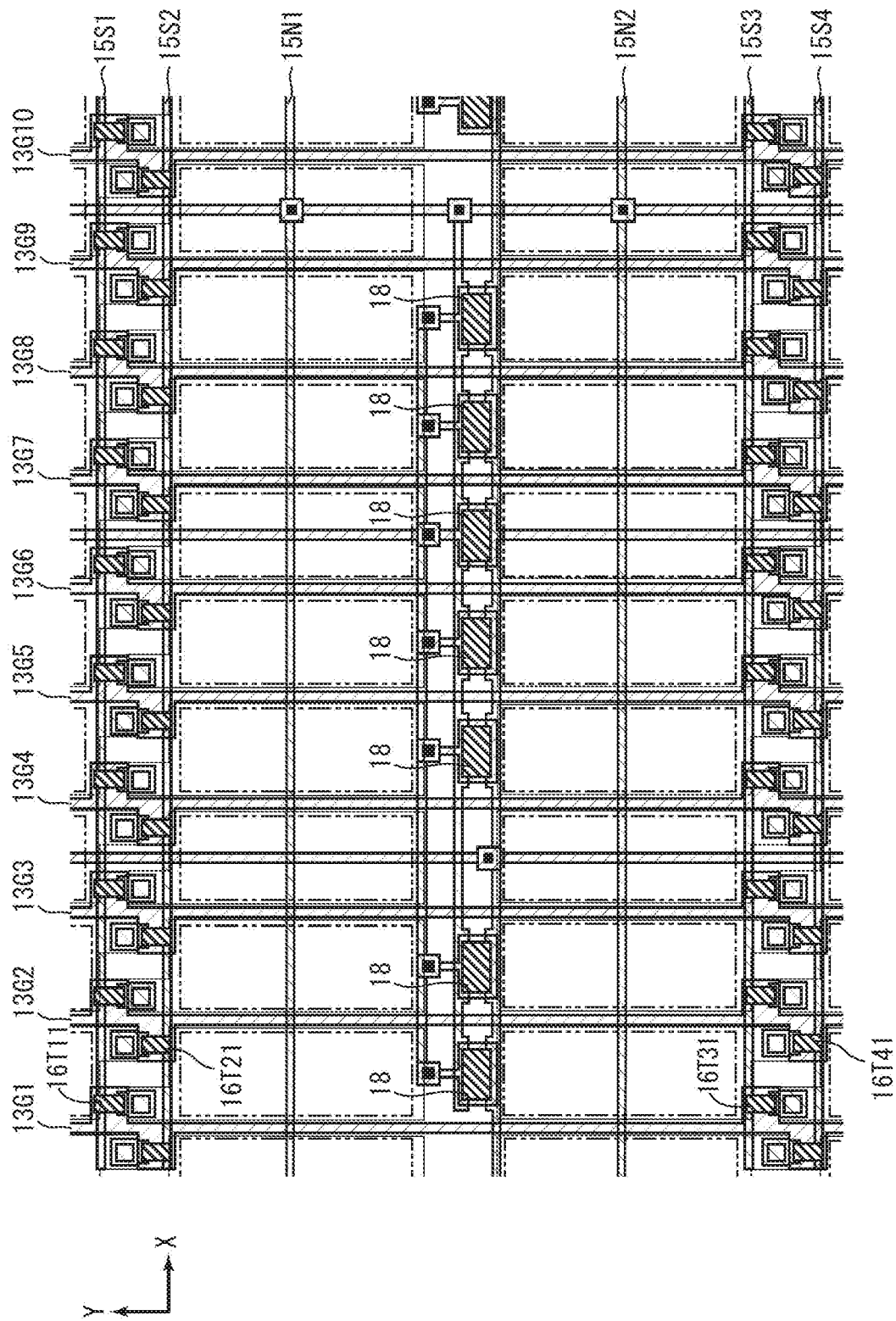
FIG. 12A illustrates a configuration of an active matrix substrate in Embodiment 2.

FIG. 12A illustrates a configuration of an active matrix substrate 20a in Embodiment 2. The interval between the source line 15S1 and the source line 15S2, the interval between the source line 15S2 and the source line 15S3, and the interval between the source line 15S3 and the source line 15S4 are different from one another. More specifically, the interval between the source line 15S2 and the source line 15S3 is wider than the interval between the source line 15S1 and the source line 15S2, and the interval between the source line 15S3 and the source line 15S4; the source line 15S2 and the source line 15S3 are apart from each other by two pixels in the Y axis direction.

Further, the pixel-TFT 16T11 connected with the same source line 15S1 and the pixel-TFT 16T31 connected with the source line 15S3 are arranged on the lower side with respect to the respective source lines 15S to which these are connected. On the other hand, the pixel-TFT 16T21 connected with the source line 15 S2 and the pixel-TFT 16T41 connected with the source line 15 S4 are arranged on the upper side with respect to the respective source lines 15S to which these are connected.

The driver-TFT 18 is arranged in an area between the source line 15S2 and the source line 15 S3 arranged at a wider interval, and in the light-shielding area BM between two adjacent pixels that are adjacent in the Y axis direction with each other. In the light-shielding area BM, no pixel-TFT 16T is arranged.

Figure 12B:
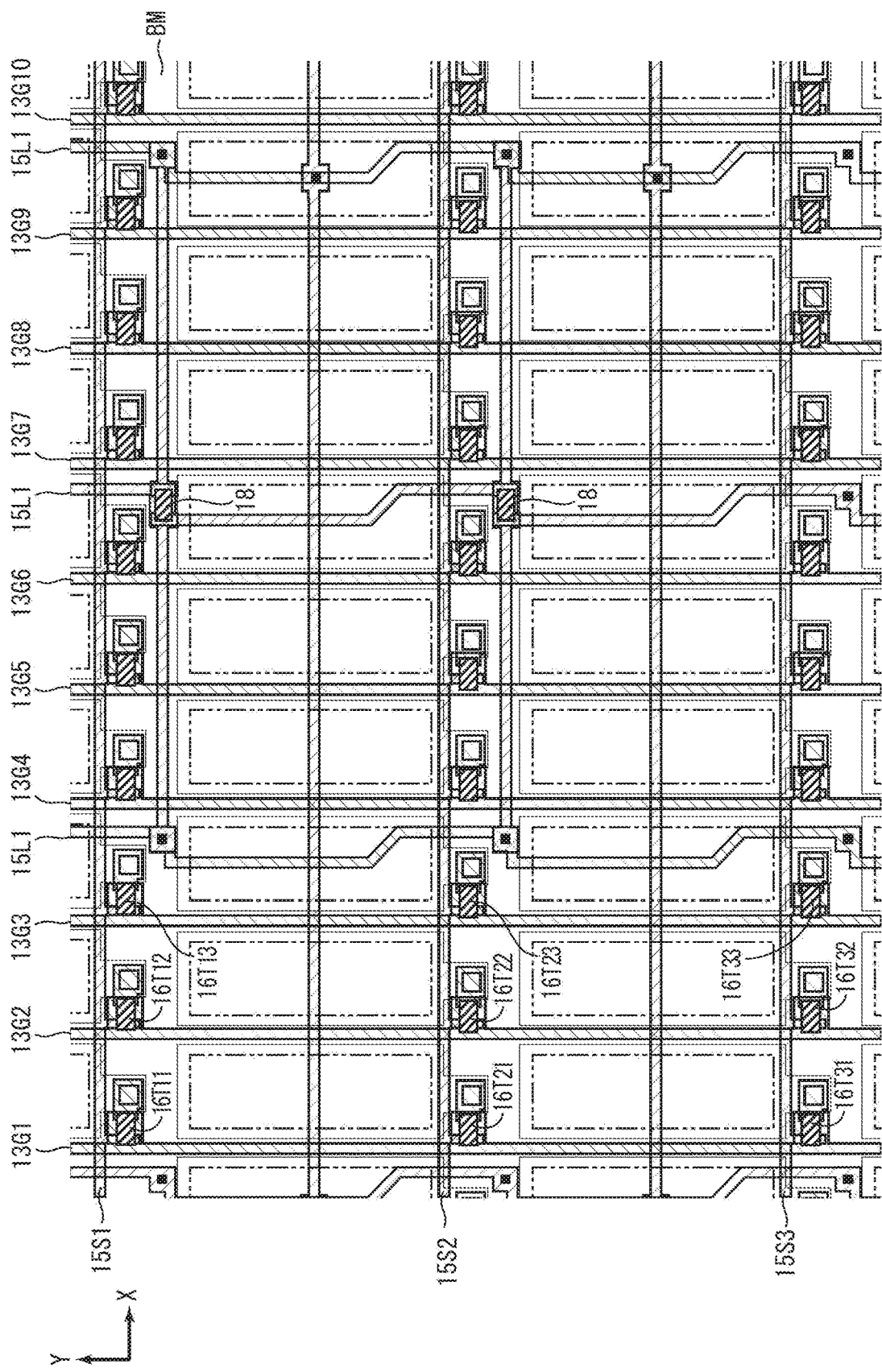
FIG. 12B illustrates a configuration of a conventional active matrix substrate in which gate lines are provided for respective colors, and source lines are provided for respective pixels.
Figure 13A:
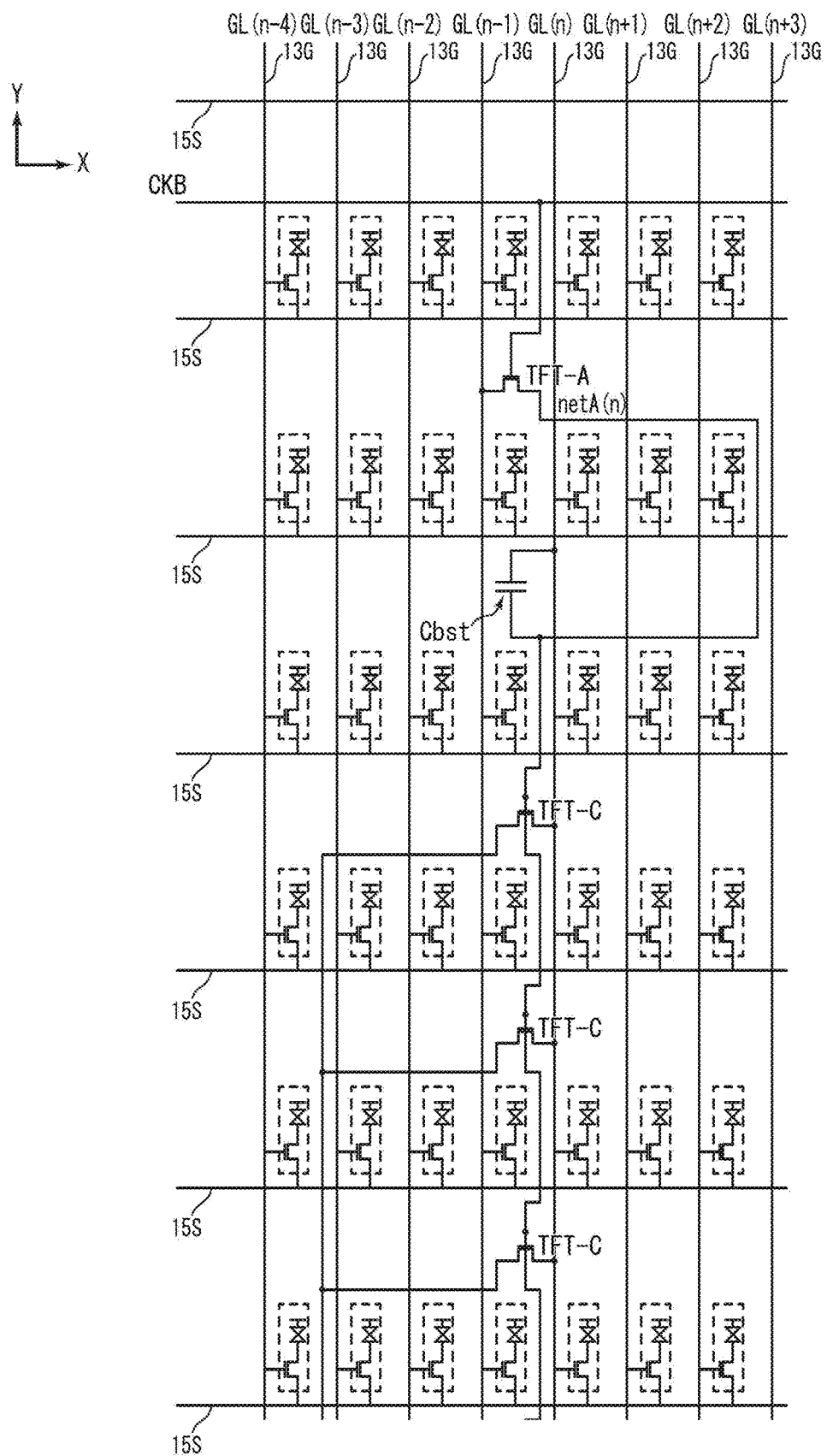
FIG. 13A illustrates an exemplary equivalent circuit in a case where the circuit of the gate driver illustrated in FIG. 4 is arranged in the display region of the conventional active matrix substrate illustrated in FIG. 12B.
Figure 13B:
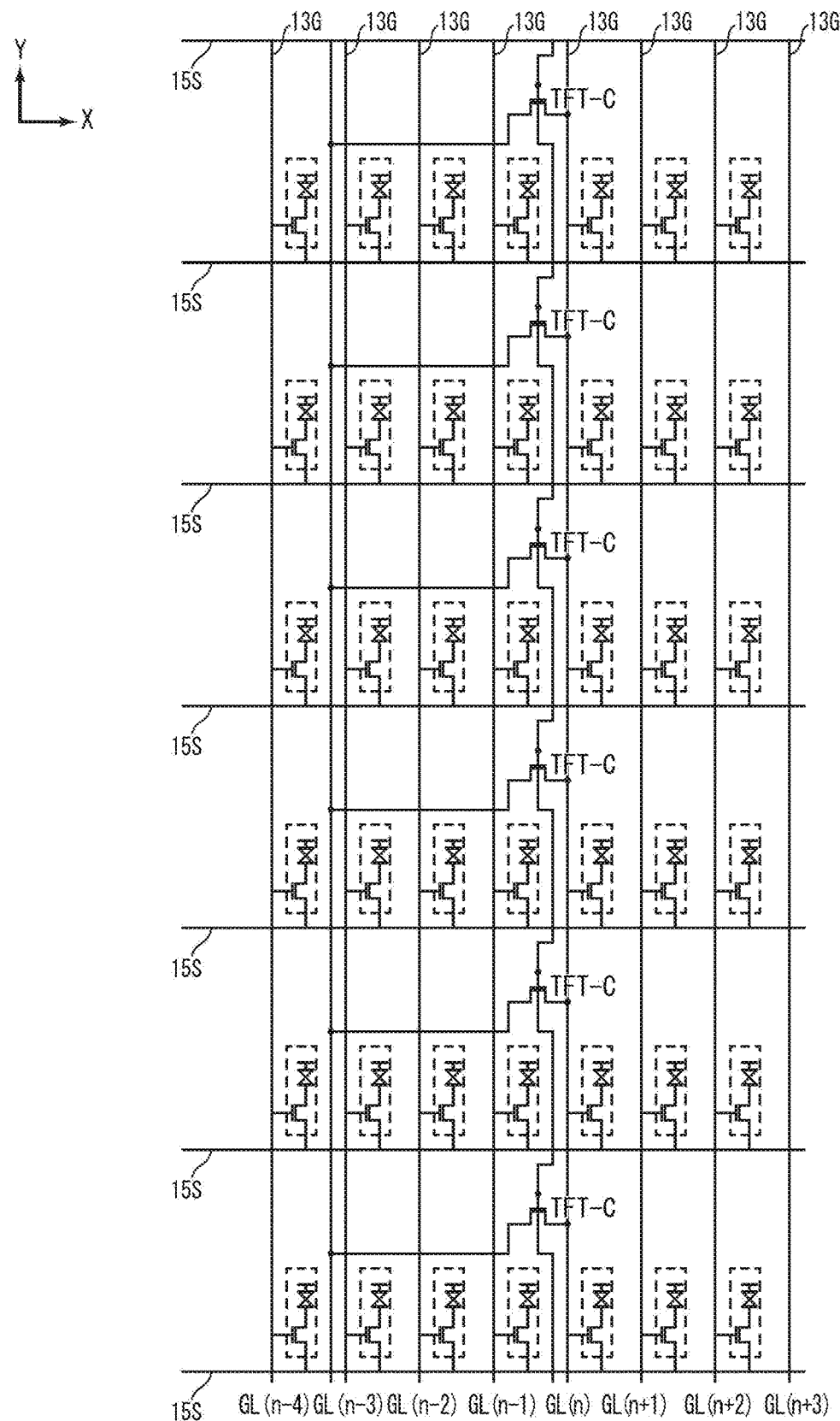
FIG. 13B illustrates an exemplary equivalent circuit in a case where the circuit of the gate driver illustrated in FIG. 4 is arranged in the display region of the conventional active matrix substrate illustrated in FIG. 12B.
Figure 13C:
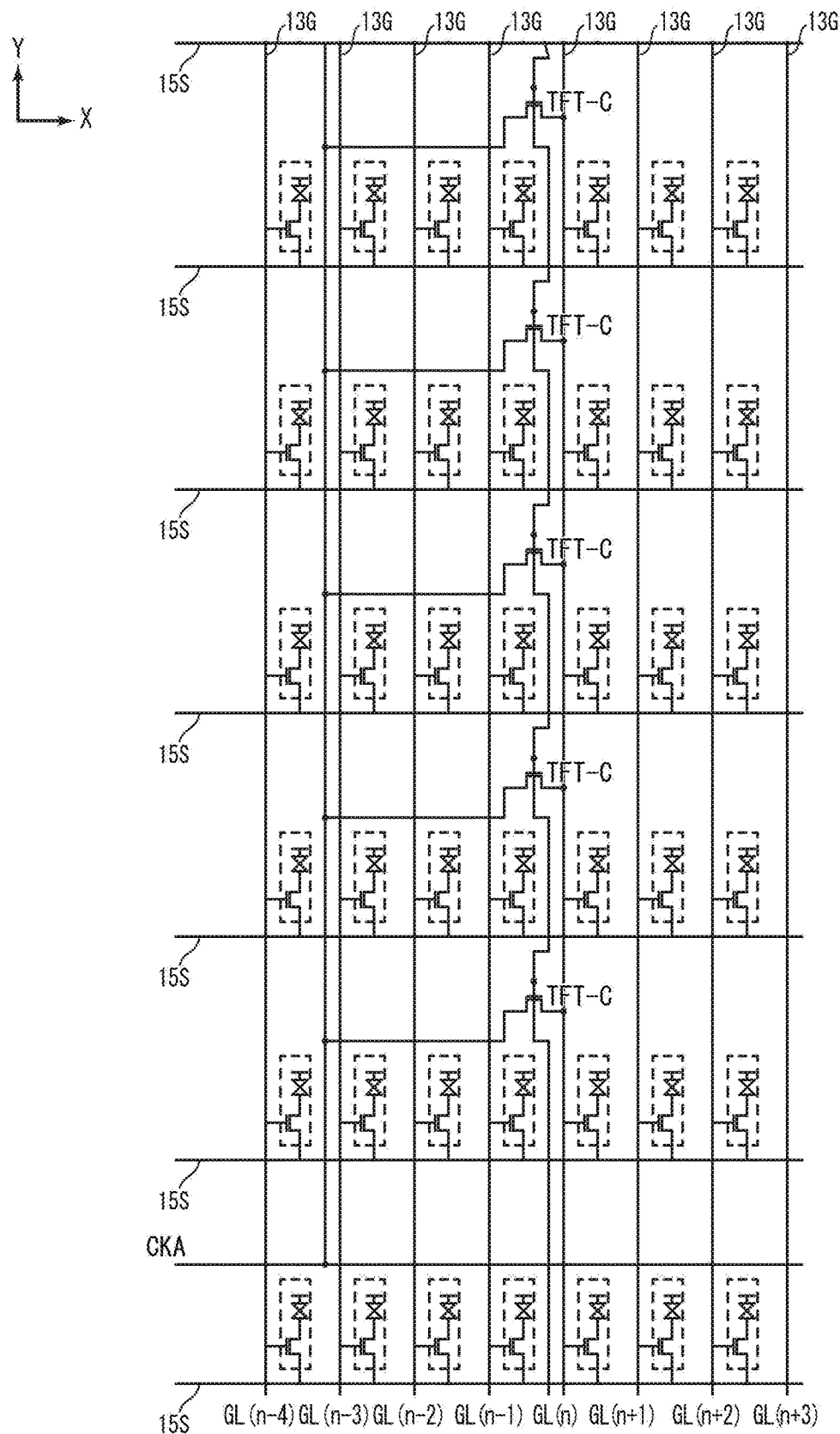
FIG. 13C illustrates an exemplary equivalent circuit in a case where the circuit of the gate driver illustrated in FIG. 4 is arranged in the display region of the conventional active matrix substrate illustrated in FIG. 12B.
Figure 13D:
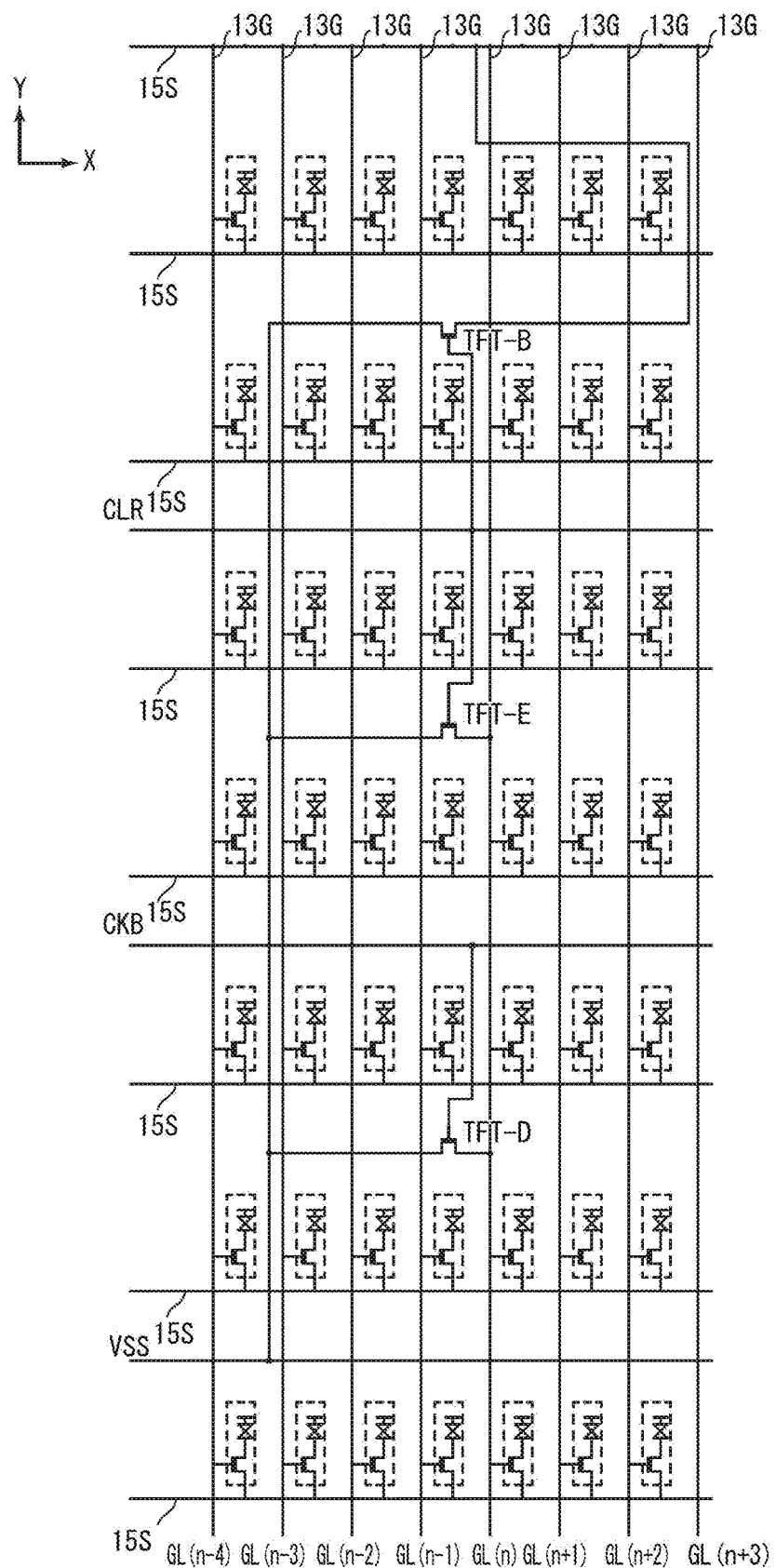
FIG. 13D illustrates an exemplary equivalent circuit in a case where the circuit of the gate driver illustrated in FIG. 4 is arranged in the display region of the conventional active matrix substrate illustrated in FIG. 12B.

FIG. 12B illustrates a configuration of a conventional active matrix substrate on which the gate lines 13G are arranged for the respective colors, and the source lines 15S are arranged for the respective pixels. On the conventional active matrix substrate, a plurality of source lines 15S are arranged at regular intervals, and a plurality of pixel-TFTs 16T connected with the same gate line 13G are arranged on the same side with respect to the respective source lines 15S to which the forgoing pixel-TFTs are connected. In the exemplary configuration illustrated in FIG. 12B, all of the pixel-TFTs 16T are arranged on the lower side with respect to the respective source lines 15S to which the pixel-TFTs 16T are connected.

In the conventional active matrix substrate as well, the driver-TFT 18 is arranged in the light-shielding area BM between the pixels adjacent in the Y axis direction, and in this area, the pixel-TFT 16T is also arranged. This causes the area for arranging the driver-TFT 18 to be narrow, and hence, only a small driver-TFT 18 can be arranged therein. It is therefore necessary to arrange small driver-TFTs 18 at a plurality of positions, which causes the length of the internal node in the gate driver 11 to increase. An increase in the length of the internal node causes parasitic capacitances of the internal node to increase, resulting in an increase of the electric power consumption. Besides, in the conventional active matrix substrate, since the length of the internal node of the gate driver 11 increases, the points of connection between the internal node in the Y axis direction and the source lines 15S in the X axis direction increase.

In contrast, in the active matrix substrate 20a in the present embodiment, the source lines 15S are arranged at irregular intervals, and among a plurality of pixel-TFTs 16T connected with the same gate line 13G, a part of the pixel-TFTs 16T are arranged on a different side with respect to the respective source lines 15S to which the pixel-TFTs 16T are connected. The driver-TFT 18 is arranged in an area between two of the source lines 15S arranged at a wider interval, and in the light-shielding area BM between two adjacent pixels that are adjacent in the Y axis direction with each other. Since no pixel-TFT 16T is arranged in this part of the light-shielding area BM where the driver-TFT 18 is arranged, as illustrated in FIG. 12A, the area for arranging the driver-TFT 18 is wide.

This makes it possible to arrange a larger driver-TFT 18 as compared with the conventional active matrix substrate, thereby making the area for arranging the entire gate driver 11 smaller. This allows the length of the internal node of the gate driver 11 to decrease, thereby allowing the parasitic capacitance of the internal node to decrease, resulting in a decrease in the electric power consumption.

In addition, since the length of the internal node of the gate driver 11 decreases, the points of connection between the internal node in the Y axis direction and the source lines 15S in the X axis direction decrease.

Besides, as illustrated in 12A, the driver-TFT 18 is apart from the pixel-TFT 16T in the Y axis direction by about one pixel. This makes it possible to increase the distance between the drain pad of the pixel-TFT 16T as an element electrically connected with the pixel electrode 17, and the driver lines 15N3 to 15N5, thereby decreasing capacitance coupling. This makes it possible to decrease noise propagation from the driver lines 15N3 to 15N5 with respect to the pixel potential, and improve the image quality.

Figure 14:
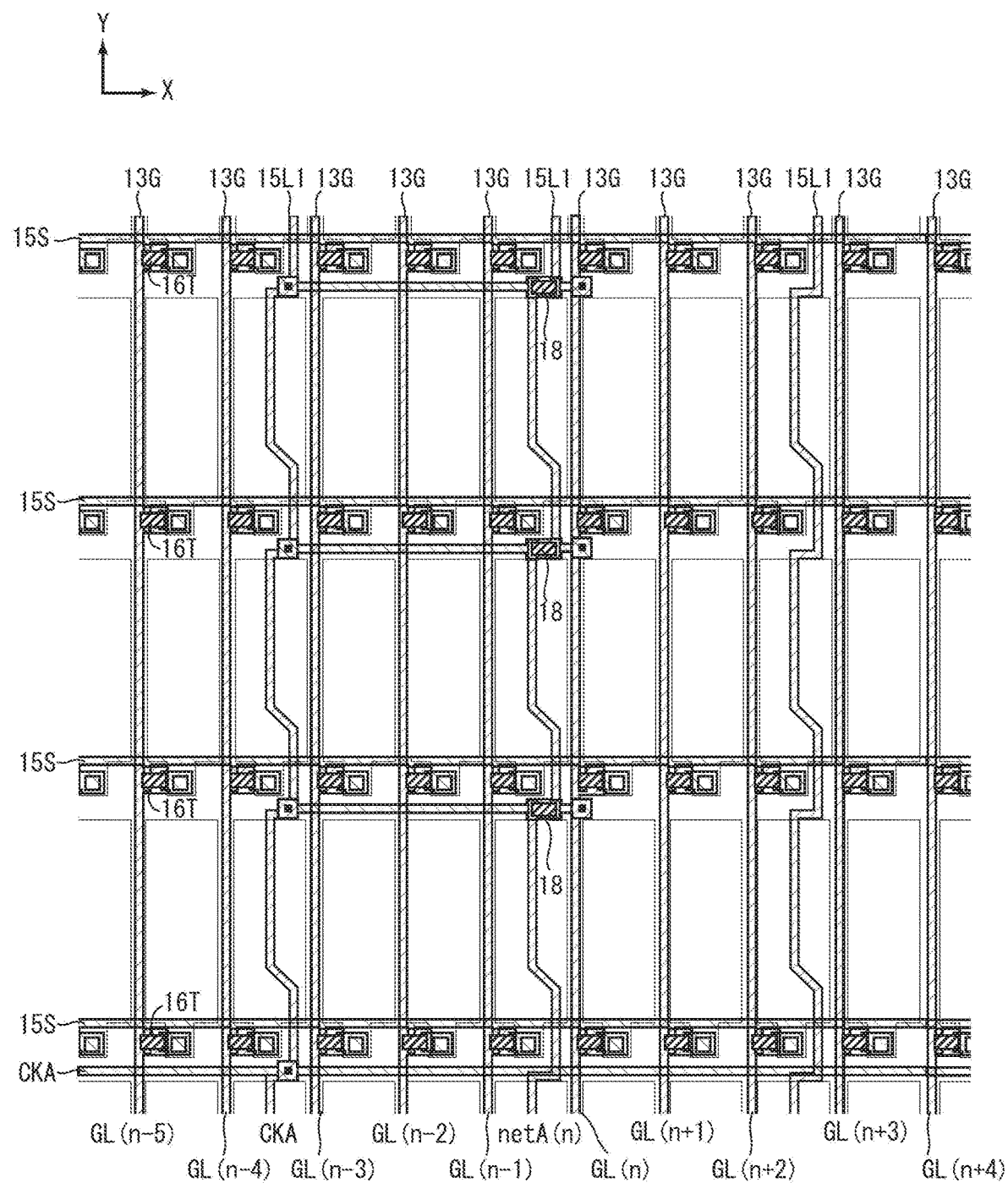
FIG. 14 illustrates a part of the TFTs-C (driver TFTs) excerpted from FIG. 13C and enlarged.

FIGS. 13A to 13D illustrate an exemplary equivalent circuit in a case where the circuit of the gate driver 11 illustrated in FIG. 4 is arranged in the display region of the conventional active matrix substrate illustrated in FIG. 12B. Further, FIG. 14 illustrates a part of the TFTs-C (driver-TFTs 18) excerpted from FIG. 13C and enlarged.

As described above, in the case of the conventional active matrix substrate, the size of the area for arranging the driver-TFT 18 is limited. In a case where a TFT-C having a length in the X axis direction of 6 μm is arranged, since the TFT-C (driver-TFT 18) cannot be arranged between the pixel-TFTs 16T adjacent in the X axis direction, as illustrated in FIG. 14, a TFT-C that is long in the Y axis direction cannot be arranged. In the example illustrated in FIG. 14, only a TFT-C (driver-TFT 18) having a length of at most 6 μm in the Y axis direction can be arranged. Therefore, in a case where the requirements for the TFT-C to be arranged are assumed to be the length L in the X axis direction=6 and the length W in the Y axis direction>80 it is necessary to arrange 14 TFTs-C having the length L in the X axis direction=6 µm, and the length W in the Y axis direction=6 µm (6 µm×14=84 µm>80 µm).

Figure 15:
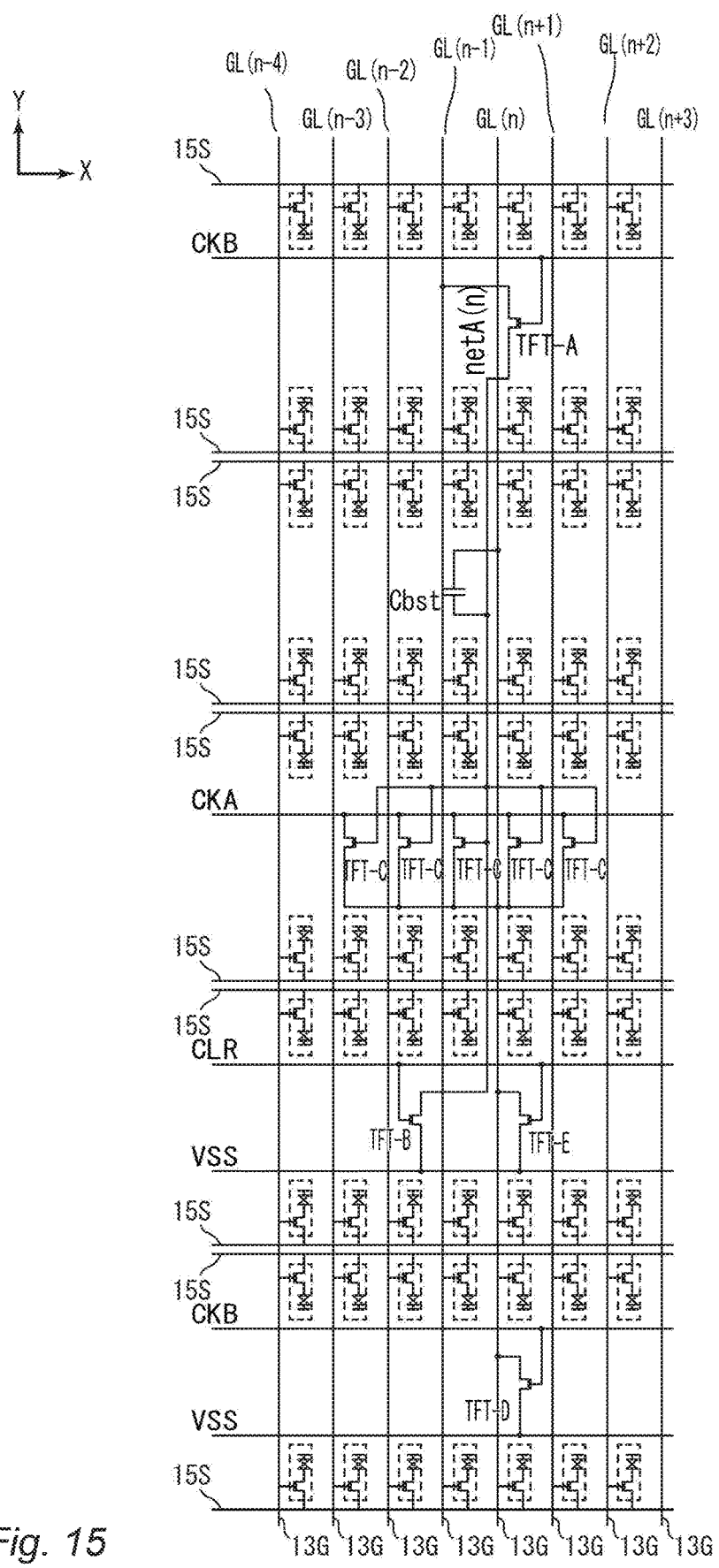
FIG. 15 illustrates an exemplary equivalent circuit in a case where the circuit of the gate driver illustrated in FIG. 4 is arranged in the display region of the active matrix substrate in Embodiment 2.
Figure 16:
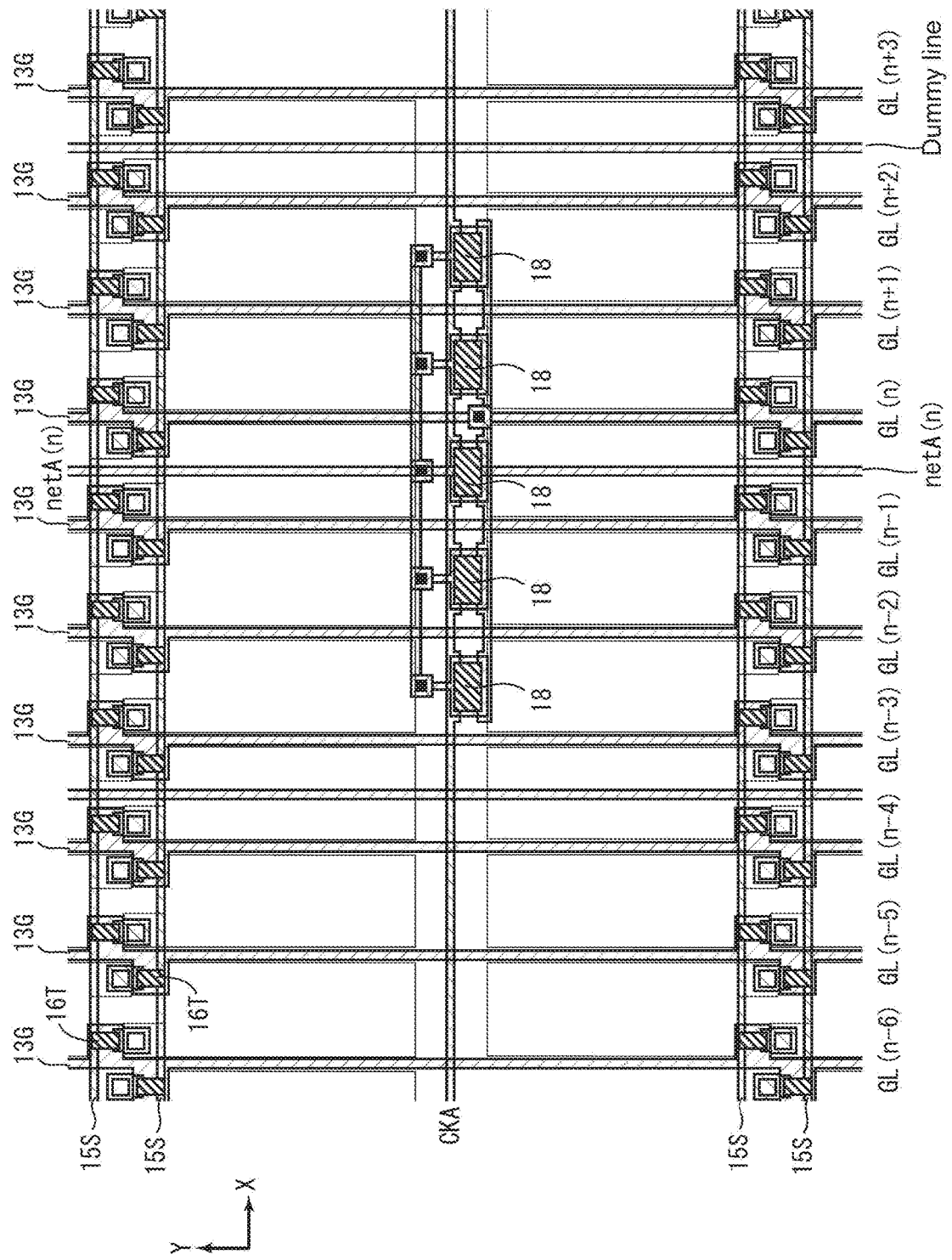
FIG. 16 illustrates a part of the TFTs-C (driver TFTs) excerpted from FIG. 15 and enlarged.

FIG. 15 illustrate an exemplary equivalent circuit in a case where the circuit of the gate driver 11 illustrated in FIG. 4 is arranged in the display region of the active matrix substrate 20a of the present embodiment. Further, FIG. 16 illustrates a part of the TFTs-C (driver-TFTs 18) excerpted from FIG. 15 and enlarged.

As described above, in the active matrix substrate 20a in the present embodiment, larger driver-TFTs 18 can be arranged, as compared with the case of the conventional active matrix substrate. In the example illustrated in FIG. 16, therefore, a driver-TFT 18 having a length in the X axis direction of 18 µm can be arranged.

In a case where the requirements for the TFT-C to be arranged are assumed to be the length L in the Y axis direction=6 µm, and the length W in the X axis direction>80 µm, therefore, five TFTs-C having the length L in the Y axis direction=6 µm, and the length W in the X axis direction=18 µm may be arranged (18 µm×5=90 µm>80 µm). This can make the area for arranging the gate driver 11 smaller, as compared with the case of the conventional active matrix substrate.

Modified Configuration Example 1 of Embodiment 2

Figure 17:
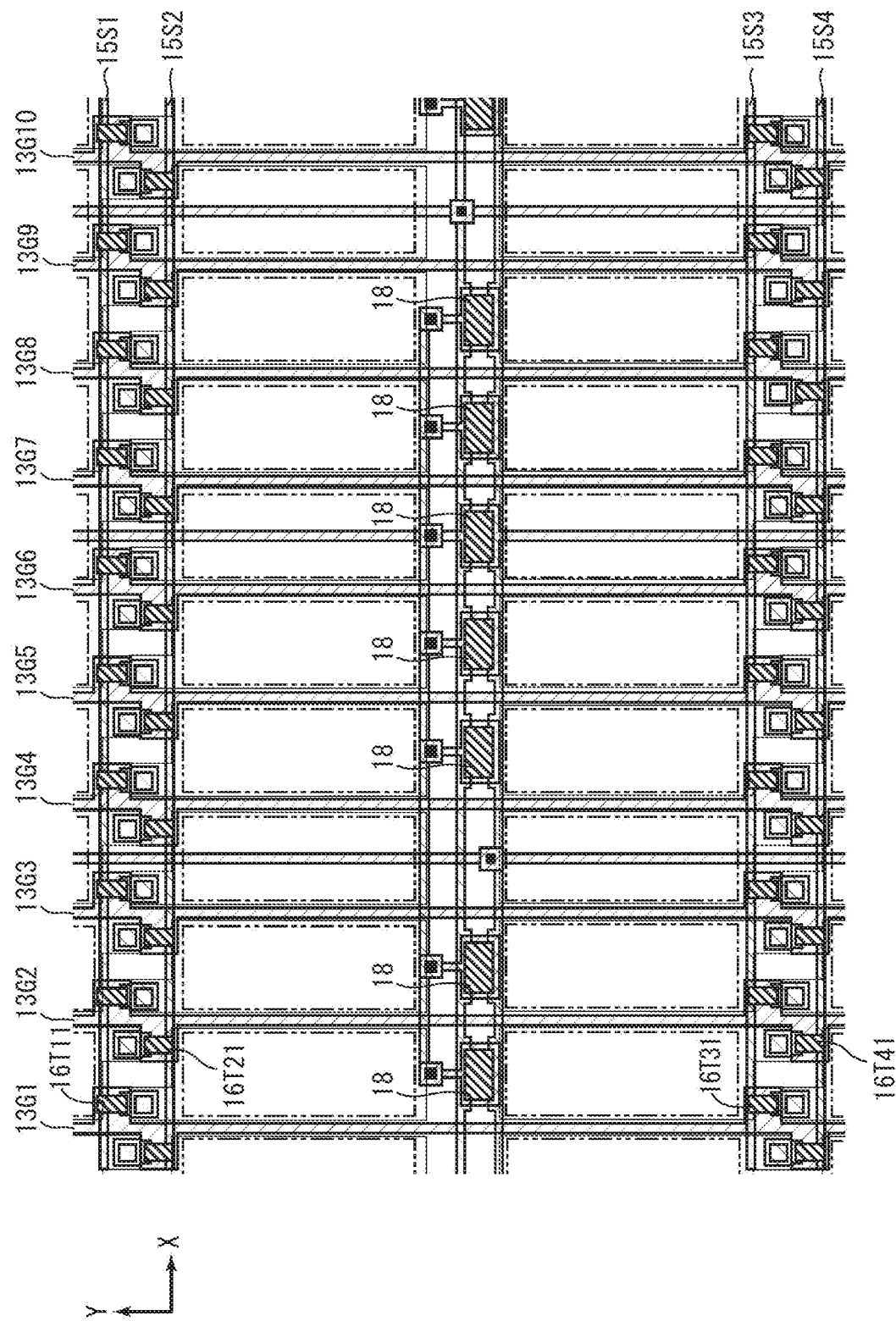
FIG. 17 illustrates a modified configuration of the active matrix substrate in Embodiment 2.

FIG. 17 illustrates a modified configuration of the active matrix substrate 20a in Embodiment 2. The configuration illustrated in FIG. 17 is different from the configuration illustrated in FIG. 12A regarding that the driver lines 15N1 and 15N2 arranged in pixels are omitted. With this configuration, the aperture ratio increases, as compared with the configuration illustrated in FIG. 12A.

Modified Configuration Example 2 of Embodiment 2

Figure 18:
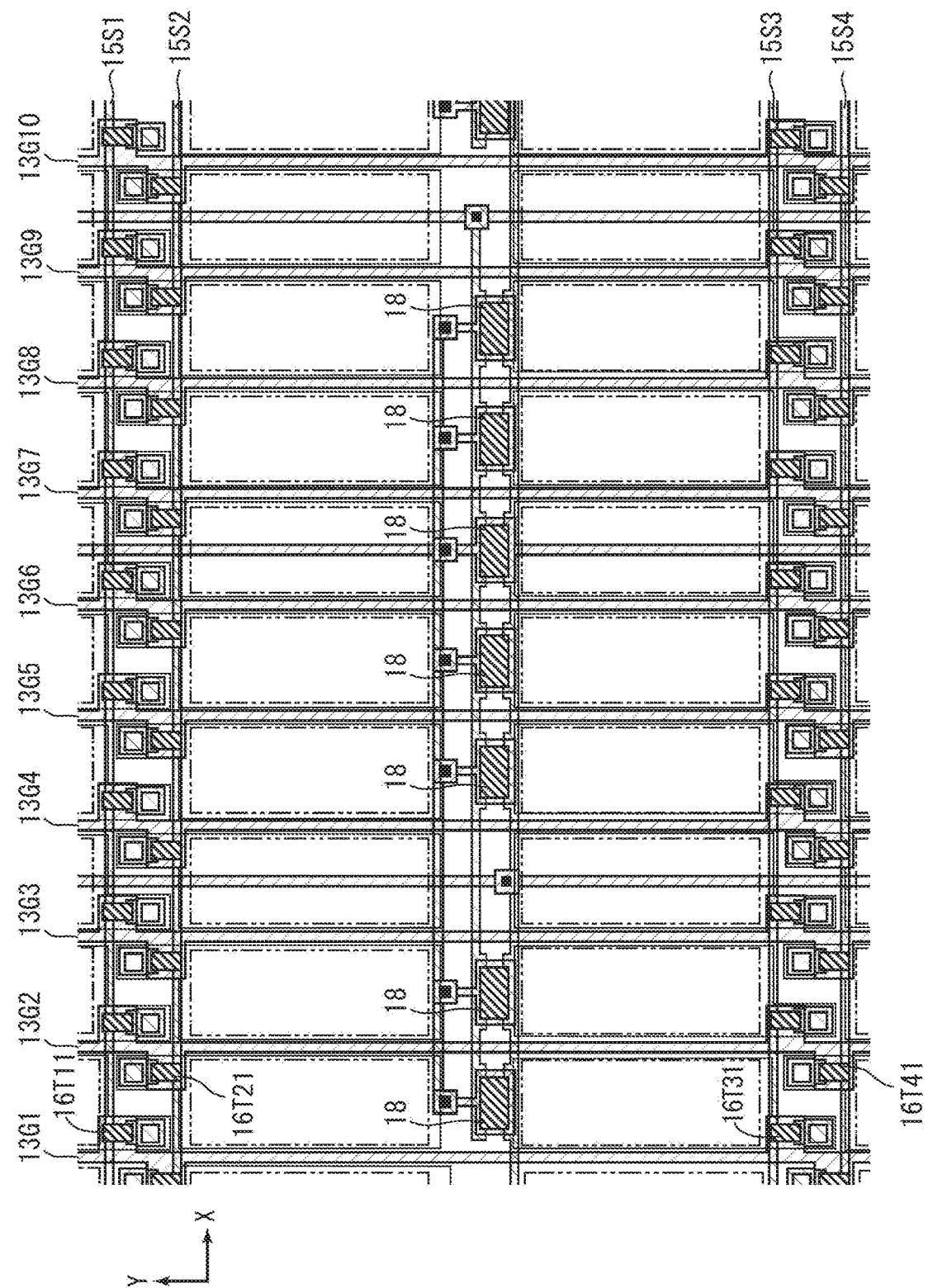
FIG. 18 illustrates another modified configuration of the active matrix substrate in Embodiment 2.

FIG. 18 illustrates another modified configuration of the active matrix substrate 20a in Embodiment 2. The configuration illustrated in FIG. 18 is different from the configuration illustrated in FIG. 12A regarding the output direction of the pixel electrode 17.

Figure 19A:
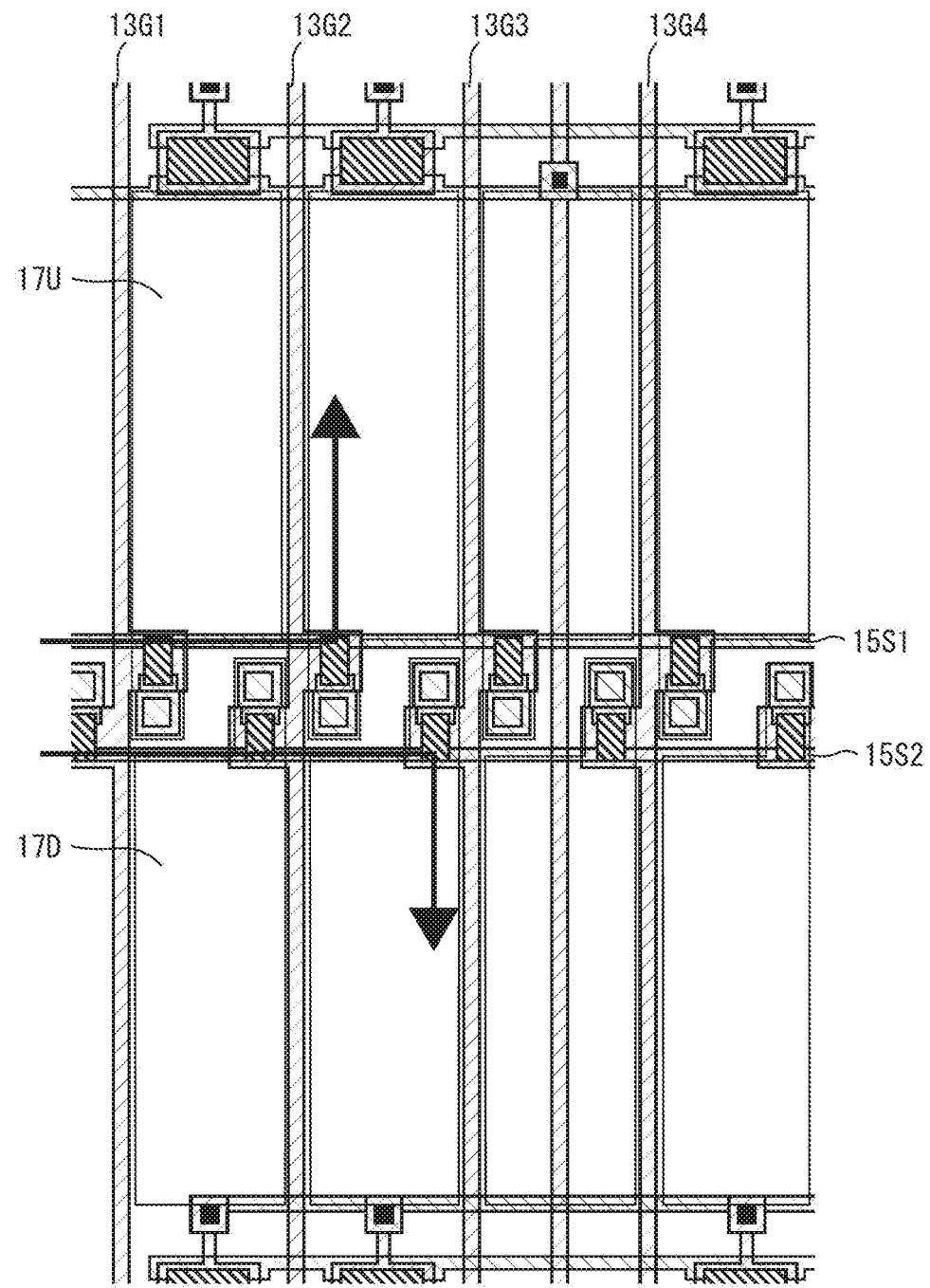
FIG. 19A is a diagram for explaining the direction of output of the pixel electrode configured as illustrated in FIG. 18.
Figure 19B:
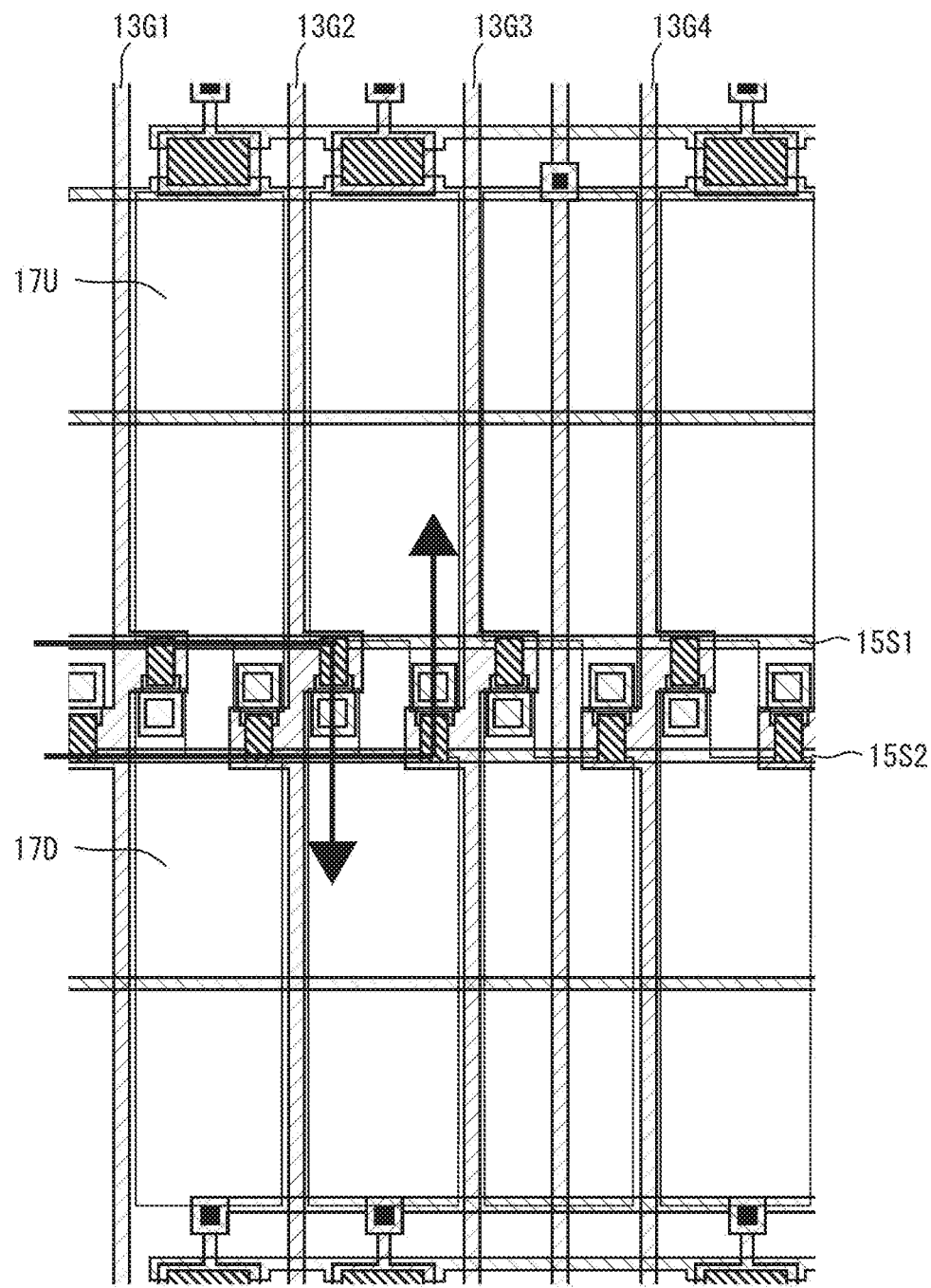
FIG. 19B is a diagram for explaining the direction of output of the pixel electrode configured as illustrated in FIG. 12A.

FIGS. 19A and 19B are diagrams for explaining the output direction of the pixel electrode 17 in the configuration illustrated in FIG. 18, and that in the configuration illustrated in FIG. 12A. FIG. 19A is an enlarged view of a part of FIG. 18, and FIG. 19B is an enlarged view of a part of FIG. 12A.

In the configuration illustrated in FIG. 18 and FIG. 19A, the pixel-TFT 16T1 connected with the source line 15S1 is connected with a pixel electrode 17U positioned on the upper side in the Y axis direction with respect to the source line 15S1. The pixel-TFT 16T2 connected with the source line 15S2 is connected with a pixel electrode 17D positioned on the lower side in the Y axis direction with respect to the source line 15S2.

On the other hand, in the configuration illustrated in FIG. 12A and FIG. 19B, the pixel-TFT 16T1 connected with the source line 15S1 is connected with the pixel electrode 17D positioned on the lower side in the Y axis direction with respect to the source line 15S1. The pixel-TFT 16T2 connected with the source line 15S2 is connected with the pixel electrode 17U positioned on the upper side in the Y axis direction with respect to the source line 15S2.

Embodiment 3

In the active matrix substrate 20a in Embodiment 1, the intervals between adjacent ones of the source lines 15S are not regular intervals, but irregular intervals. Besides, among a plurality of the pixel-TFTs 16T connected with the same source line 15S, a part of the pixel-TFTs 16T are arranged on a different side with respect to the respective gate lines 13G to which the pixel-TFTs 16T are connected.

An active matrix substrate 20a in Embodiment 3, while keeping the above-described characteristics of the configuration of the active matrix substrate 20a in Embodiment 1, further has the following characteristics: the intervals between adjacent ones of the source lines 15S are not regular intervals, but irregular intervals; and among a plurality of the pixel-TFTs 16T connected with the same gate line 13G (horizontal line), a part of the pixel-TFTs 16T are arranged on a different side with respect to the respective source lines 15S (vertical lines) to which the pixel-TFTs 16T are connected.

Figure 20:
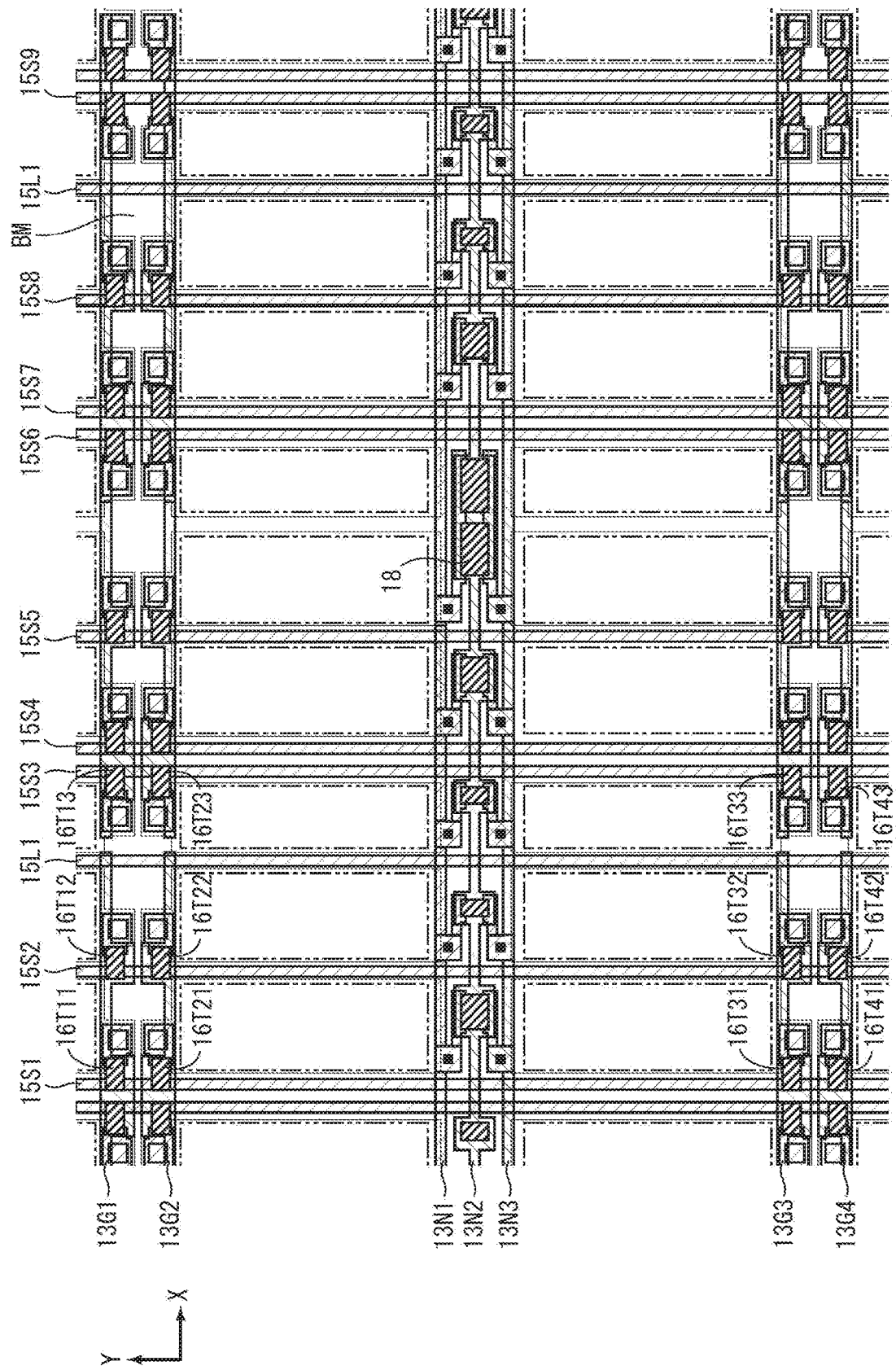
FIG. 20 illustrates a configuration an active matrix substrate in Embodiment 3.

FIG. 20 illustrates a configuration of the active matrix substrate 20a in Embodiment 3. The interval between the source line 15S1 and the source line 15S2, the interval between the source line 15S2 and the source line 15S3, and the interval between the source line 15S3 and the source line 15S4 are different from one another. More specifically, the interval between the source line 15S2 and the source line 15S3 is wider than the interval between the source line 15S1 and the source line 15 S2, and the source line 15S3 and the source line 15S4.

Besides, among the pixel-TFTs 16T11, 16T12, and 16T13 connected with the same gate line 13G1, the pixel-TFT 16T11 connected to the source line 15S1, and the pixel-TFT 16T12 connected with the source line 15S2, are arranged on the right side with respect to the respective source lines 15S to which these are connected. On the other hand, the pixel-TFT 16T13 connected with the source line 15S3 is arranged on the left side with respect to the source line 15S to which the pixel-TFT 16T13 is connected.

In addition, the interval between the gate line 13G1 and the gate line 13G2 is different from the interval between the gate line 13G2 and the gate line 13G3. More specifically, the interval between the gate line 13G2 and the gate line 13G3 is wider than the interval between the gate line 13G1 and the gate line 13G2, and these are apart from each other by two pixels.

Still further, among the pixel-TFTs 16T11, 16T21, 16T31, and 16T41 connected with the same source 15S1, the pixel-TFT 16T11 connected with the gate line 13G1, and the pixel-TFT 16T31 connected with the gate line 13G3 are arranged on the lower side with respect to the respective gate lines 13G to which these are connected, and the pixel-TFT 16T21 connected with the gate line 13G2, and the pixel-TFT 16T41 connected with the gate line 13G4, are arranged on the upper side with respect to the respective gate lines 13G to which these are connected.

The driver-TFT 18 is arranged in a space between adjacent ones of the gate lines 13G arranged at a wider interval, among spaces between adjacent two gate lines 13G, and in the light-shielding area BM between the pixels adjacent in the Y axis direction. In the example illustrated in FIG. 20, the driver-TFT 18 is arranged between the gate line 13G2 and the gate line 13G3 and in the light-shielding area BM between the pixels adjacent in the Y axis direction. In this part of the light-shielding area BM, no pixel-TFT 16T is arranged.

The driver line 15L1, electrically connected with the driver-TFT 18, and extending in the Y axis direction, is arranged in the light-shielding area BM between pixels adjacent in the X axis direction. Further, the driver lines 15N1, 15N2, and 15N3, electrically connected with the driver-TFT 18, and extending in the X axis direction, are arranged between the gate line 13G2 and the gate line 13G3, in the light-shielding area BM between the pixels adjacent in the Y axis direction, similarly to the driver-TFT 18. In other words, all of the driver lines 15L1, 15N1 to 15N3 are arranged in the light-shielding area BM, and are not in the pixel areas (aperture areas).

Among a plurality of the source lines 15S, a part of the source lines 15S are arranged in the pixel areas. In the example illustrated in FIG. 20, the source lines 15S1, 15S2, 15S4, 15S5, 15S7, and 15S8 are arranged in the light-shielding area BM between the pixels adjacent in the X axis direction, whereas the source lines 15S3, 15S6, and 15S9 are arranged in the pixel areas. In this case, the source lines 15S are arranged in the same manner with respect to each display pixel, and hence, dummy lines for making the aperture ratio uniform are not needed.

In the case of the active matrix substrate in Embodiment 3, as is the case with the active matrix substrate in Embodiment 1, no pixel-TFT 16T is arranged in the part of the light-shielding area BM where the driver-TFTs 18 are arranged. This makes it possible to arrange larger driver-TFTs 18 as compared with the conventional active matrix substrate, thereby making the area for arranging the entire gate driver 11 smaller. This allows the length of the internal node of the gate driver 11 to decrease, thereby allowing the parasitic capacitance of the internal node to decrease, which results in a decrease in the electric power consumption.

In addition, since the length of the internal node of the gate driver 11 decreases, the points of connection between the internal node in the X axis direction and the source lines 15S in the Y axis direction decrease. Further, since larger driver-TFTs 18 can be arranged as compared with the conventional active matrix substrate, the number of the driver-TFTs 18 can be decreased. The points of connection between the driver lines 15L1 in the Y axis direction and the gate lines 13G in the X axis direction, therefore, can be decreased.

Further, the driver TFT 18 is apart from the pixel-TFT 16T in the Y axis direction by about one pixel. This makes it possible to increase the distance between the drain pad of the pixel-TFT 16T as an element electrically connected with the pixel electrode 17 and the driver lines 15N3 to 15N5, thereby decreasing capacitive coupling therebetween. This makes it possible to decrease noise propagation from the driver lines 15N3 to 15N5 with respect to the pixel potential, and improve the image quality.

Still further, as compared with the conventional active matrix substrate, a distance between the drain pad of the pixel-TFT 16T as an element electrically connected to the pixel electrode 17 and the driver line 15L1 extending in the Y axis direction increases, which causes capacitive coupling to decrease. This makes it possible to decrease noise propagation from the driver line with respect to the pixel potential, and improve the image quality.

In the conventional active matrix substrate illustrated in FIGS. 8A to 8D, only a TFT-C (driver-TFT 18) having a length of at most 6 μm in the X axis direction can be arranged per one display pixel. In a case where the requirements for the TFT-C to be arranged are assumed to be the length L in the Y axis direction=6 and the length W in the X axis direction>80 it is necessary to arrange TFTs-C having the length L in the Y axis direction=6 and the length W in the X axis direction=6 μm over 14 display pixels (6 μm×14=84 μm>80 μm).

Figure 21:
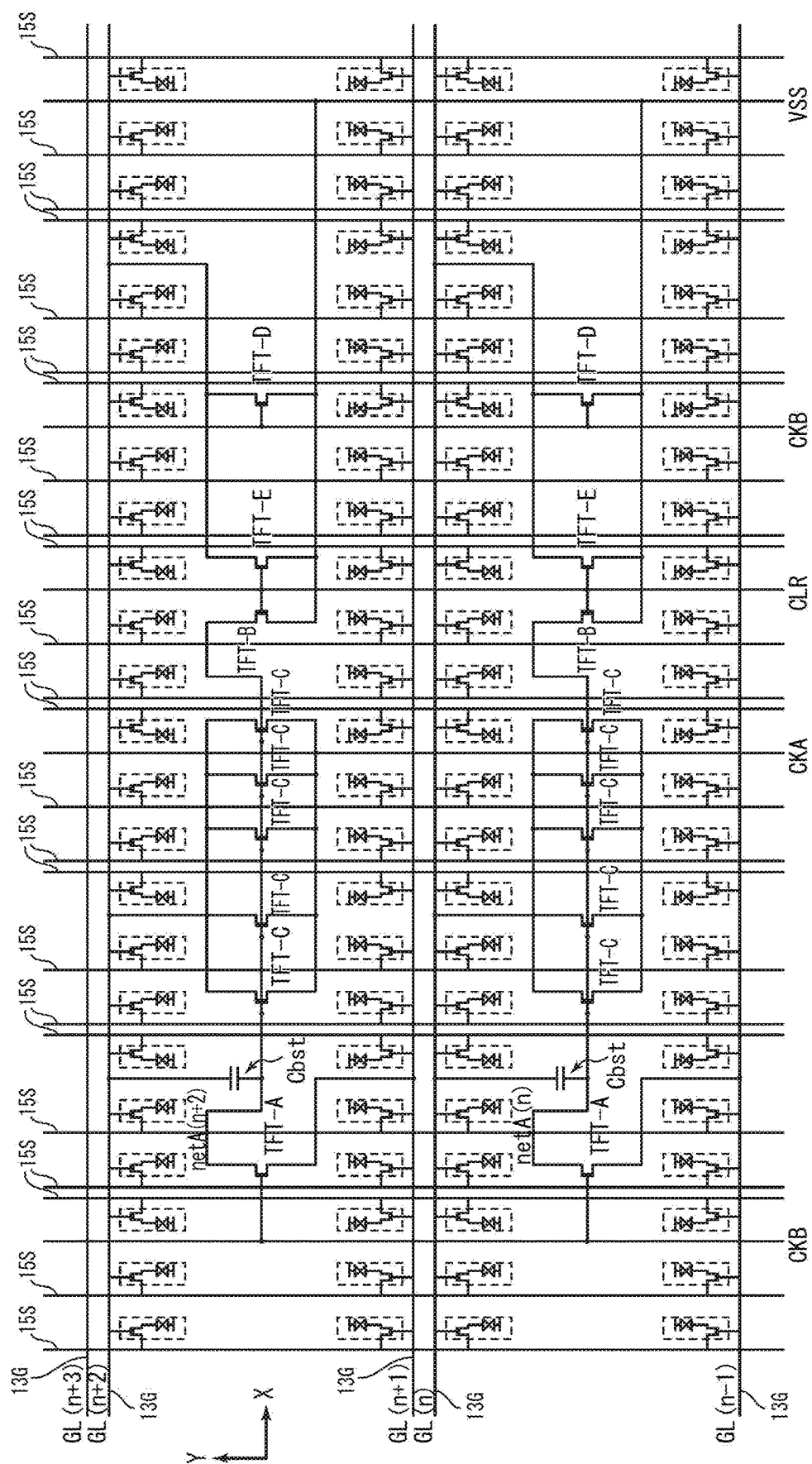
FIG. 21 illustrates an exemplary equivalent circuit in a case where the circuit of the gate driver illustrated in FIG. 4 is arranged in the display region of the active matrix substrate in Embodiment 3.
Figure 22:
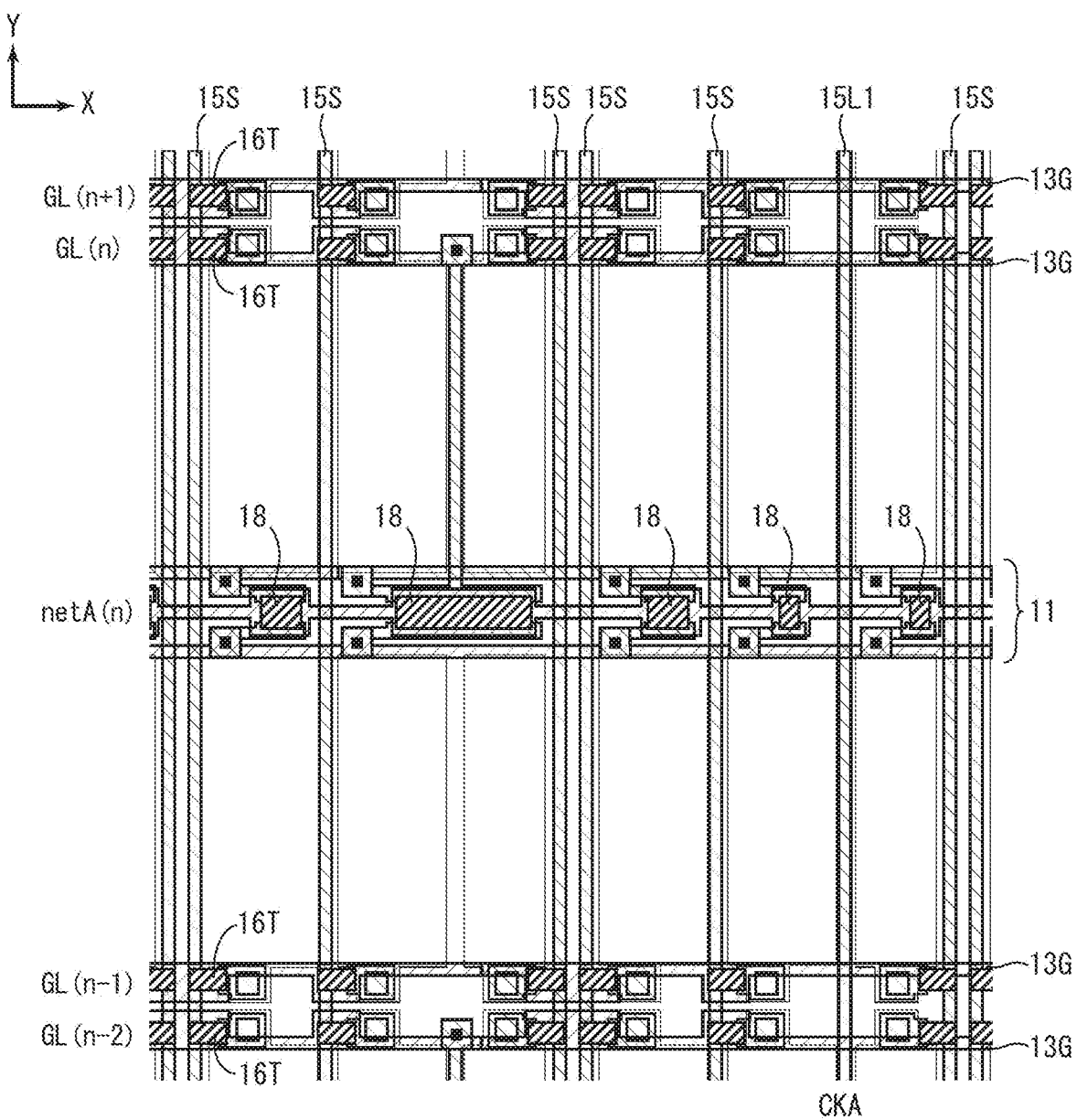
FIG. 22 illustrates a part of the TFTs-C (driver TFTs) excerpted from FIG. 21 and enlarged.

FIG. 21 illustrates an exemplary equivalent circuit in a case where the circuit of the gate driver 11 illustrated in FIG. 4 is arranged in the display region of the active matrix substrate 20a in the present embodiment. FIG. 22 illustrates a part of the TFTs-C (driver-TFTs 18) excerpted from FIG. 21 and enlarged.

In a case where the requirements for the TFT-C to be arranged are assumed to be the length L in the Y axis direction=6 and the length W in the X axis direction >80 μm, TFTs-C having the length in the Y axis direction=6 and the lengths in the X axis direction=12 μm, 44 μm, 12 μm, 6 μm, and 6 μm, respectively, may be arranged in the example illustrated in FIGS. 21 and 21, whereby the requirements are satisfied. It is therefore only required to arrange TFTs-C (driver TFTs 18) over two display pixels, as illustrated in FIG. 22, and the area for arranging the gate driver 11 can be made smaller, as compared with the case of the conventional active matrix substrate.

Embodiment 4

In the active matrix substrate 20a in Embodiment 2, the intervals between adjacent ones of the source lines 15S are not regular intervals, but irregular intervals. Besides, among a plurality of the pixel-TFTs 16T connected with the same gate line 13G, a part of the pixel-TFTs 16T are arranged on a different side with respect to the respective source lines 15S to which the pixel-TFTs 16T are connected.

An active matrix substrate 20a in Embodiment 4, while keeping the above-described characteristics of the configuration of the active matrix substrate 20a in Embodiment 2, further has the following characteristics: the intervals between adjacent ones of the gate lines 13G are not regular intervals, but irregular intervals; and, among a plurality of the pixel-TFTs 16T connected with the same source line 15S (horizontal line), a part of the pixel-TFTs 16T are arranged on a different side with respect to the respective gate lines 13G (vertical lines) to which the pixel-TFTs 16T are connected.

Figure 23:
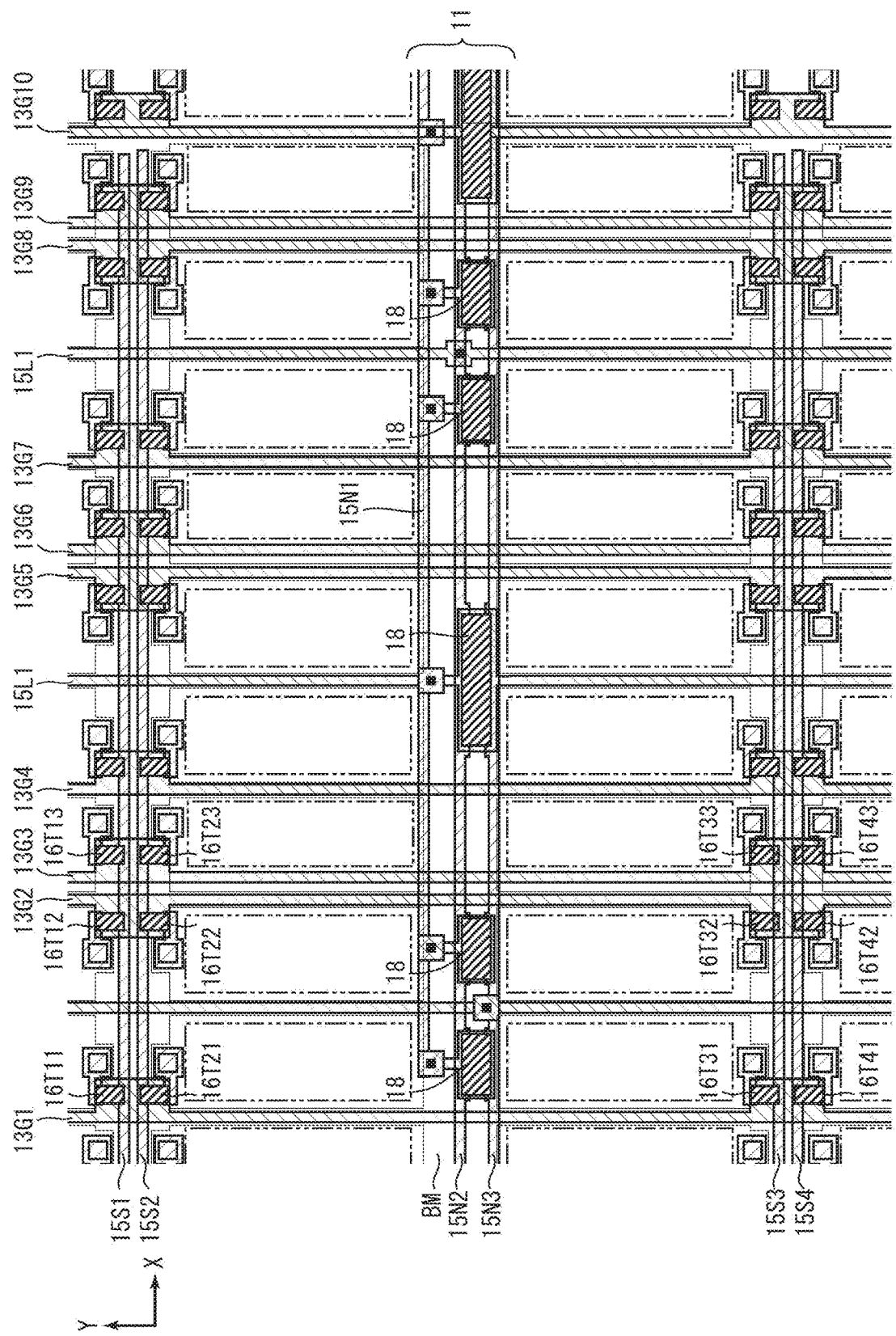
FIG. 23 illustrates a configuration an active matrix substrate in Embodiment 4.

FIG. 23 illustrates a configuration of an active matrix substrate 20a in Embodiment 4. The interval between the gate line 13G1 and the gate line 13G2, the interval between the gate line 13G2 and the gate line 13G3, and the interval between the gate line 13G3 and the gate line 13G4 are different from one another. More specifically, the interval between the gate line 13G1 and the gate line 13G2 is wider than the interval between the gate line 13G2 and the gate line 13G3, and the interval between the gate line 13G3 and the gate line 13G4; and the gate line 13G1 and the gate line 13G2 are apart from each other by one pixel or more.

Besides, among the pixel-TFTs 16T11, 16T12, and 16T13 connected with the same source line 15S1, the pixel-TFT 16T11 connected with the gate line 13G1, and the pixel-TFT 16T13 connected with the gate line 13G3, are arranged on the right side with respect to the respective gate lines 13G to which these are connected. On the other hand, the pixel-TFT 16T12 connected with the gate line 13G2 is arranged on the left side with respect to the gate line 13G to which the pixel-TFT 16T12 is connected.

In addition, the interval between the source line 15S1 and the source line 15S2 is different from the interval between the source line 15S2 and the source line 15S3. More specifically, the interval between the source line 15S2 and the source line 15S3 is wider than the interval between the source line 15S1 and the source line 15S2, and these are apart from each other by two pixels.

Still further, among the pixel-TFTs 16T11, 16T21, 16T31, and 16T41 connected with the same gate line 13G1, the pixel-TFT 16T11 connected with the source line 15S1, and the pixel-TFT 16T31 connected with the source line 15S3 are arranged on the upper side with respect to the respective source lines 15S to which these are connected, and the pixel-TFT 16T21 connected with the source line 15S2, and the pixel-TFT 16T41 connected with the source line 15 S4 are arranged on the lower side with respect to the respective source lines 15S to which these are connected.

The driver-TFT 18 is arranged in an area between adjacent ones of the source lines 15S arranged at a wider interval, among the source lines 15S that are adjacent in the Y axis direction, and in the light-shielding area BM between the pixels adjacent in the Y axis direction. In the example illustrated in FIG. 23, the driver-TFT 18 is arranged between the source line 15S2 and the source line 15S3 and in the light-shielding area BM between the pixels adjacent in the Y axis direction. In this part of the light-shielding area BM, no pixel-TFT 16T is arranged.

The driver line 15L1, electrically connected with the driver-TFT 18, and extending in the Y axis direction, is arranged in the light-shielding area BM between the pixels adjacent in the X axis direction. Further, the driver lines 15N1, 15N2, and 15N3, electrically connected with the driver-TFT 18, and extending in the X axis direction, are arranged between the source line 15S2 and the source line 15S3, in the light-shielding area BM between the pixels adjacent in the Y axis direction. In other words, all of the driver lines are arranged in the light-shielding area BM, and not in the pixel areas.

Among a plurality of the gate lines 13G, a part of the gate lines 13G are arranged in the pixel areas. In the example illustrated in FIG. 23, the gate lines 13G1, 13G2, 13G4, 13G5, 13G7, 13G8, and 13G10 are arranged in the light-shielding area BM between the pixels adjacent in the X axis direction, but the gate lines 13G3, 13G6, 13G9 are arranged in the pixel areas. In this case, the gate lines 13G are arranged in the same manner with respect to each display pixel, and hence, dummy lines for making the aperture ratio uniform are not needed.

In the case of the active matrix substrate 20a in Embodiment 4, as is the case with the active matrix substrate in Embodiment 2, no pixel-TFT 16T is arranged in the part of the light-shielding area BM where the driver-TFTs 18 are arranged, and therefore, the area for arranging the driver-TFT 18 is large. This makes it possible to make the area for arranging the entire gate driver 11 smaller, thereby allowing the length of the internal node of the gate driver 11 to decrease. The decrease of the length of the internal node allows the parasitic capacitance of the internal node to decrease, which results in a decrease in the electric power consumption.

In addition, since the length of the internal node of the gate driver 11 decreases, the points of connection between the internal node in the Y axis direction and the source lines 15S in the X axis direction decrease.

Further, the driver TFT 18 is apart from the pixel-TFT 16T in the Y axis direction by about one pixel. This makes it possible to increase the distance between the drain pad of the pixel-TFT 16T as an element electrically connected with the pixel electrode 17 and the driver lines 15N3 to 15N5, thereby decreasing capacitive coupling therebetween. This makes it possible to decrease noise propagation from the driver lines 15N3 to 15N5 with respect to the pixel potential, and improve the image quality.

Still further, as compared with the conventional active matrix substrate, a distance between the drain pad of the pixel-TFT 16T as an element electrically connected to the pixel electrode 17 and the driver line 15L1 extending in the Y axis direction increases, which causes capacitive coupling to decrease. This makes it possible to decrease noise propagation from the driver line with respect to the pixel potential, and improve the image quality.

As described in the description of Embodiment 2, in the case of the conventional active matrix substrate, the size of the area for arranging the driver-TFT 18 is limited. In the example illustrated in FIGS. 13A to 13D and 14, in a case where the requirements for the TFT-C (driver TFT 18) to be arranged are assumed to be the length L in the short axis direction=6 and the length W in the long axis direction>80 it is necessary to arrange TFTs-C having the length L in the X axis direction=6 and the length W in the Y axis direction=6 μm over 14 display pixels (6 μm×14=84 μm>80 μm).

Figure 24:
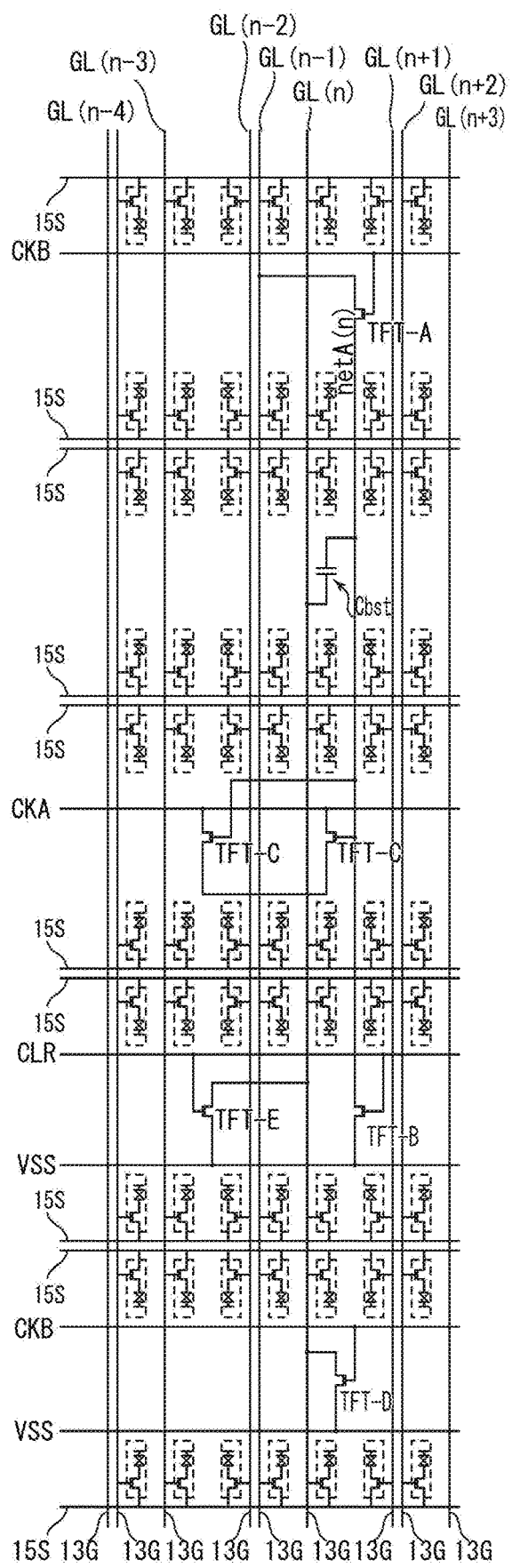
FIG. 24 illustrates an exemplary equivalent circuit in a case where the circuit of the gate driver illustrated in FIG. 4 is arranged in the display region of the active matrix substrate in Embodiment 4.

FIG. 24 illustrates an exemplary equivalent circuit in a case where the circuit of the gate driver 11 illustrated in FIG. 4 is arranged in the display region of the active matrix substrate 20a in the present embodiment. Further, FIG. 25 illustrates a part of the TFTs-C (driver-TFTs 18) excerpted from FIG. 24 and enlarged.

Figure 25:
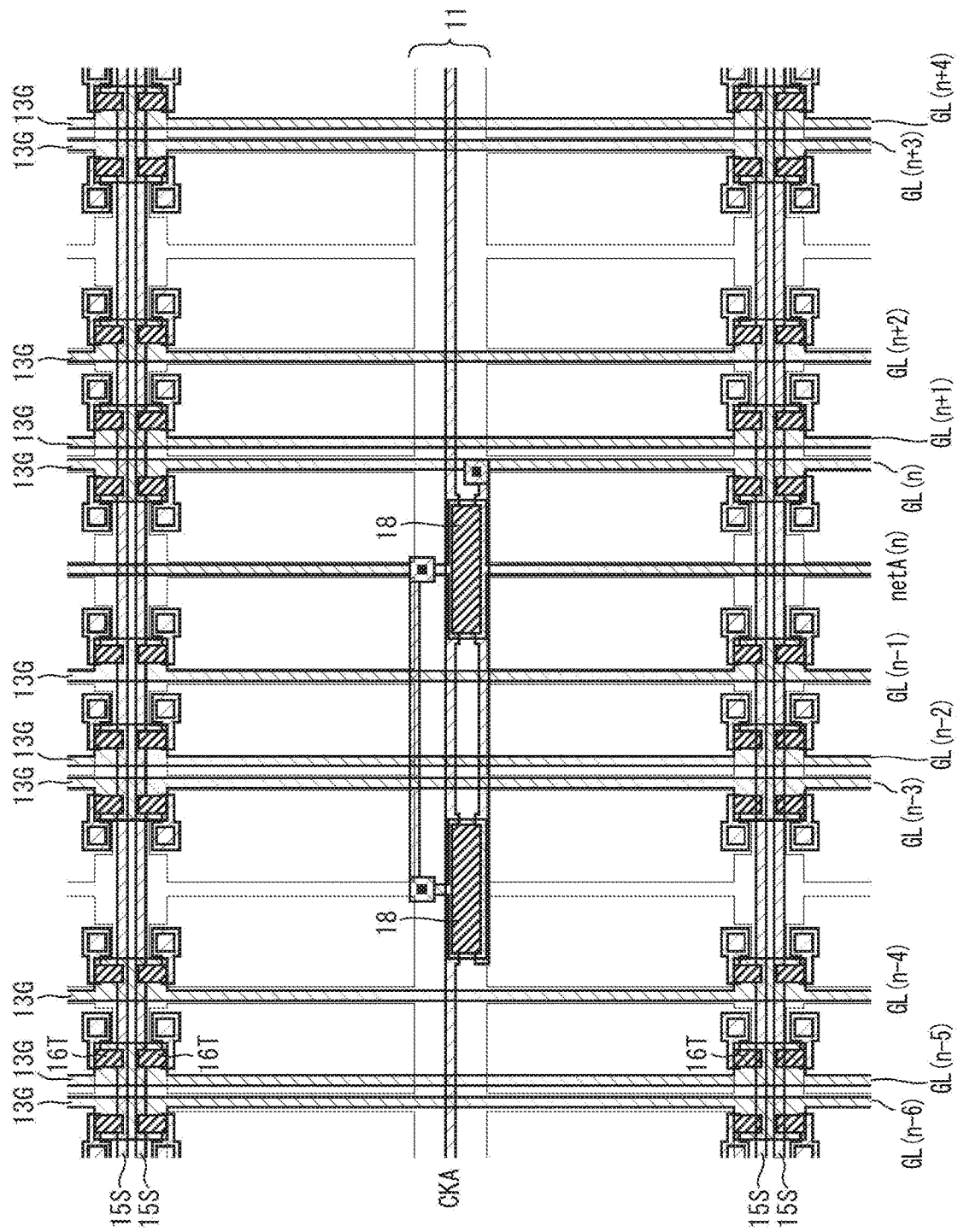
FIG. 25 illustrates a part of the TFTs-C (driver TFTs) excerpted from FIG. 24 and enlarged.

In a case where the requirements for the TFT-C to be arranged are assumed to be the length L in the short axis direction=6 and the length W in the long axis direction>80 two TFTs-C (driver-TFTs 18) having the length in the Y axis direction=6 and the length in the X axis direction=40 respectively, may be arranged in the case of the example illustrated in FIGS. 24 and 25, whereby the requirements are satisfied. It is therefore only required to arrange TFTs-C (driver-TFTs 18) over two display pixels, as illustrated in FIG. 25, and the area for arranging the gate driver 11 can be made smaller, as compared with the case of the conventional active matrix substrate.

Embodiment 5

In order to form the active matrix substrate 20a in Embodiments 1 to 4 described above, a gate layer composing the gate lines 13G, and a source layer composing the source lines 15S are formed on a glass substrate. The gate layer and the source layer are formed in different layers in the lamination direction. Here, in some cases, a displacement occurs between the layers in the plane direction intersecting with the lamination direction at right angles, whereby the area of overlap between the gate layer and the source layer varies with the substrate, or alternatively, with the position. In a case where such displacement occurs, there is possibility that, even if the capacitance between the gate layer and the source layer is in the same pattern on design, the actual capacitance varies with the position.

Influences of this appear noticeably particularly between the drain pad of the pixel-TFT 16T and other elements, and causes the deterioration of the display quality. For example, the capacitance between the drain pad and the gate line 13G increases/decreases due to displacement, and the pull-in amount of the pixel-TFT in the OFF state increases/decreases.

Figure 26:
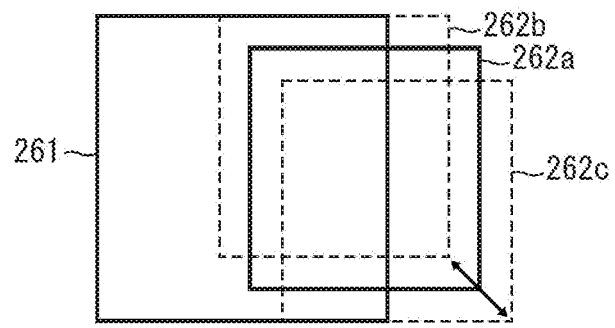
FIG. 26 is a diagram for explaining the displacement of a source layer with respect to a gate layer.

FIG. 26 is a diagram for explaining the displacement of a source layer 262 with respect to a gate layer 261. When the source layer 262 is displaced to a position 262b from a position 262a as a reference position, an area of overlap between the gate layer 261 and the source layer 262 increases, whereby the capacitance increases; and when the source layer 262 is displaced to a position 262c, the area of overlap between the gate layer 261 and the source layer 262 decreases, whereby the capacitance decreases.

Figure 27:
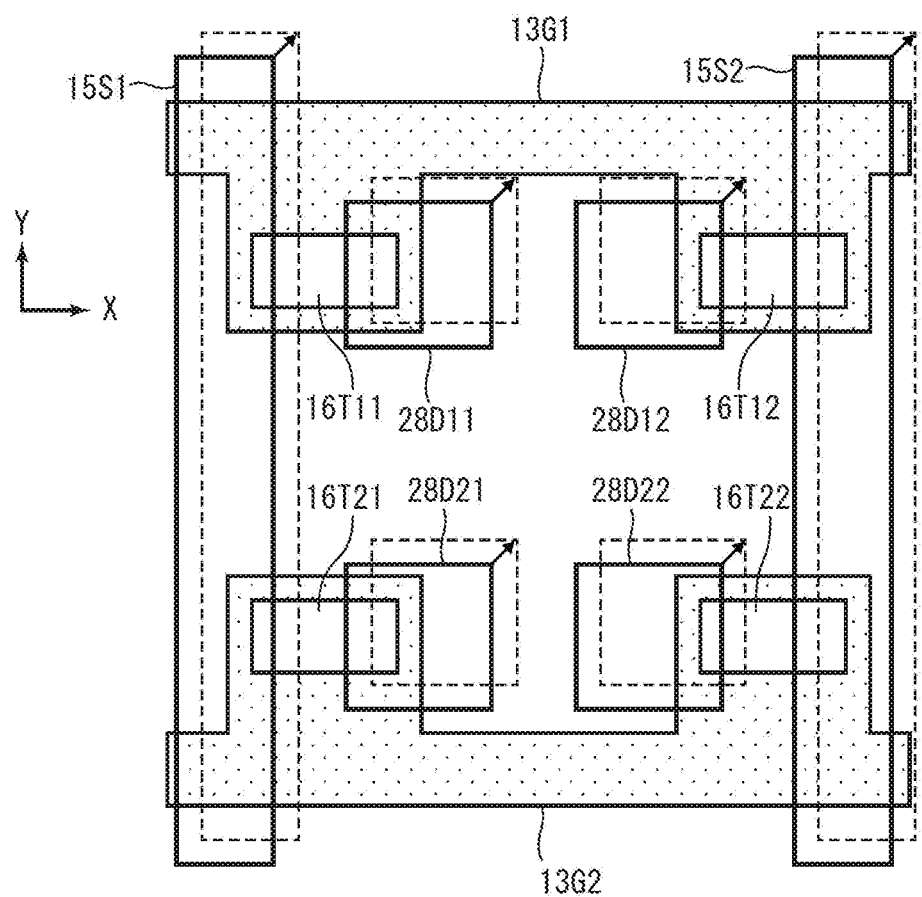
FIG. 27 is a diagram for explaining influences in a case where the displacement of the source line with respect to the gate line and the displacement of the drain pad with respect to the gate line occurs in the active matrix substrate in Embodiment 3.

FIG. 27 is a diagram for explaining influences in a case where the displacement of the source line 15S with respect to the gate line 13G and the displacement of the position of the drain pad 28D with respect to the gate line 13G occurs in the active matrix substrate 20a in Embodiment 3. In FIG. 27, the positions as reference positions of the source line 15S and the drain pad 28D are indicated by solid lines, and the positions thereof when the displacement occurs are indicated by dotted lines.

As described above, in the active matrix substrate 20a in Embodiment 3, among a plurality of the pixel-TFTs 16T connected with the same gate line 13G, a part of the pixel-TFTs are arranged on a different side with respect to the respective source lines 15S to which the pixel-TFTs are connected. Besides, among a plurality of the pixel-TFTs 16T connected with the same source line 15S, a part of the pixel-TFTs are arranged on a different side with respect to the respective gate lines 13G to which the pixel-TFTs are connected. In the example illustrated in FIG. 27, the pixel-TFT 16T11 is arranged on the right side with respect to the source line 15S1, and the pixel-TFT 16T12 is arranged on the left side with respect to the source line 15S2. Besides, the pixel-TFT 16T11 is arranged on the lower side with respect to the gate line 13G1, and the pixel-TFT 16T12 is arranged on the upper side with respect to the gate line 13G2.

When a displacement occurs between the source lines 15S and the drain pads 28D in such an arrangement, as indicated by the dotted lines in the drawing, the areas of overlap between the gate line 13G and the drain pad 28D change among the pixel-TFTs 16T, whereby the capacitances change. In the example illustrated in FIG. 27, the area of overlap between the gate line 13G1 and the drain pad 28D11, and the area of overlap between the gate line 13G2 and the drain pad 28D21, decrease, whereby the capacitances decrease, and the pull-in amounts of the pixel-TFTs 16T11 and 16T21 in the OFF state decrease. On the other hand, the area of overlap between the gate line 13G1 and the drain pad 28D12, and the area of overlap between the gate line 13G2 and the drain pad 28D22 increase, whereby the capacitance increases, and the pull-in amounts of the pixel-TFTs 16T12 and 16T22 in the OFF state increase.

Figure 28:
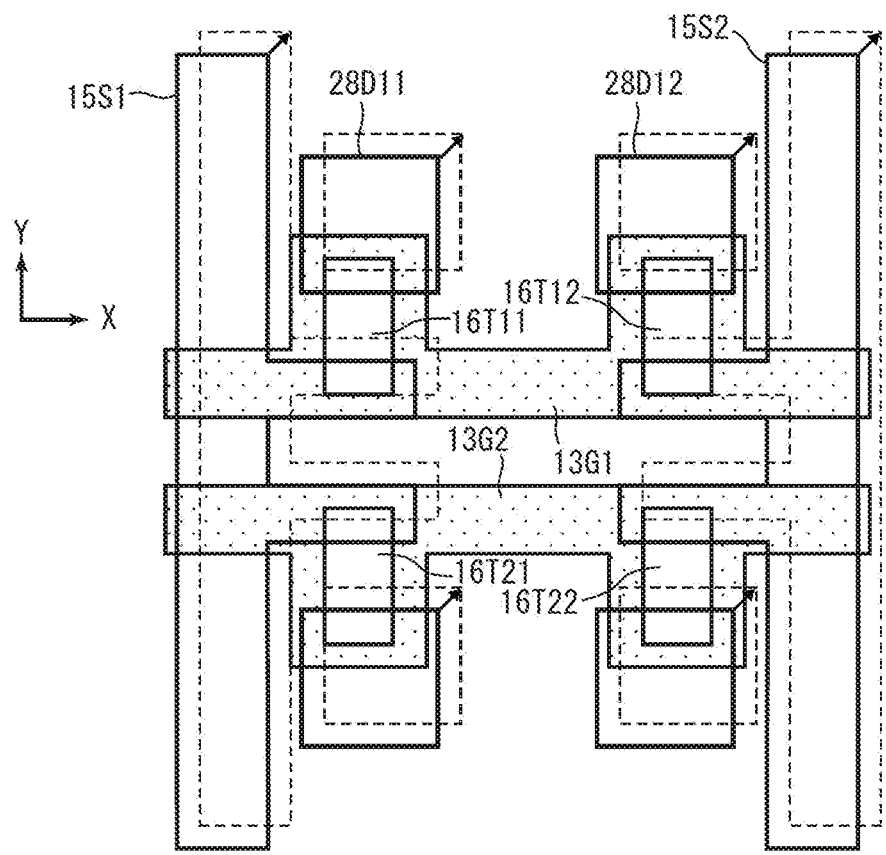
FIG. 28 is a diagram for explaining influences in a case where a displacement of the source line with respect to the gate line and a displacement of the drain pad with respect to the gate line occurs in a configuration in which the orientation of the pixel-TFT in the active matrix substrate in Embodiment 3 is rotated by 90°.

FIG. 28 is a diagram for explaining influences in a case where a displacement of the source line 15S with respect to the gate line 13G and a displacement of the drain pad 28D with respect to the gate line 13G occurs in a configuration in which the orientation of the pixel-TFT 16T in the active matrix substrate 20a in Embodiment 3 is rotated by 90°. In FIG. 28, the positions as reference positions of the source line 15S and the drain pad 28D are indicated by solid lines, and the positions thereof when the displacement occurs are indicated by dotted lines.

In the arrangement configuration illustrated in FIG. 28 as well, when a displacement occurs between the source lines 15S and the drain pads 28D, the areas of overlap between the gate line 13G and the drain pad 28D change among the pixel-TFTs 16T, whereby the capacitances change. In the example illustrated in FIG. 28, the area of overlap between the gate line 13G1 and the drain pad 28D11, and the area of overlap between the gate line 13G1 and the drain pad 28D12, decrease, whereby the capacitances decrease, and the pull-in amounts of the pixel-TFTs 16T11 and 16T12 in the OFF state decrease. On the other hand, the area of overlap between the gate line 13G2 and the drain pad 28D21, and the area of overlap between the gate line 13G2 and the drain pad 28D22 increase, whereby the capacitance increases, and the pull-in amounts of the pixel-TFTs 16T21 and 16T22 in the OFF state increase.

In the active matrix substrate 20a in Embodiment 5, therefore, an offset pattern is formed in the gate layer, so that, even in a case where a displacement occurs between the layers, the change in the area of overlap between the gate layer and the drain pad caused by the displacement can be offset.

Figure 29:
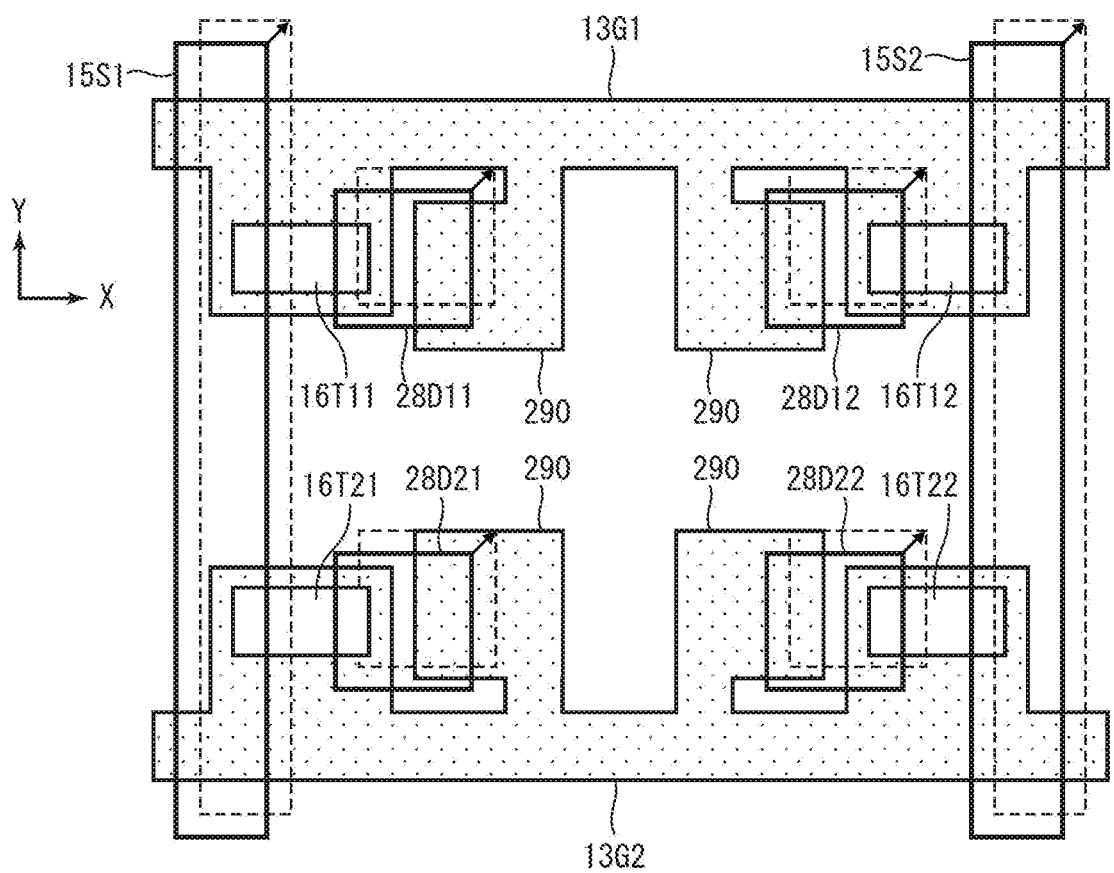
FIG. 29 illustrates an exemplary offset pattern formed on the gate line 13G (gate layer).

FIG. 29 illustrates an exemplary offset pattern 290 formed on the gate line 13G (gate layer). In FIG. 29 as well, reference positions of the source line 15S and the drain pad 28D are indicated by solid lines, and positions thereof when a displacement occurs are indicated by dotted lines.

The offset pattern 290 is in such a shape that, when a displacement occurs between the gate line 13G and the drain pad 28D, the area of overlap between the gate line 13G and the drain pad 28D can be prevented from changing. In the example illustrated in FIG. 29, the offset pattern 290 is formed so that, in a case where the drain pad 28D11 is formed at the reference position, the area of overlap between the gate line 13G1 and the drain pad 28D11 when no offset pattern 290 is formed, and the area of overlap between the offset pattern 290 and the drain pad 28D11, become point-symmetric with respect to the center point of the drain pad 28D. This applies to offset patterns 290 corresponding to the pixel-TFTs 16T other than the pixel-TFT 16T11.

By providing the offset pattern 290 as illustrated in FIG. 29, even in a case where the position of the drain pad 28D is displaced from the reference position indicated by the solid lines to a position indicated by the dotted lines, a change in the area of overlap between the gate line 13G and the drain pad 28D can be suppressed, whereby a change in the capacitance between the two can be suppressed.

Figure 30:
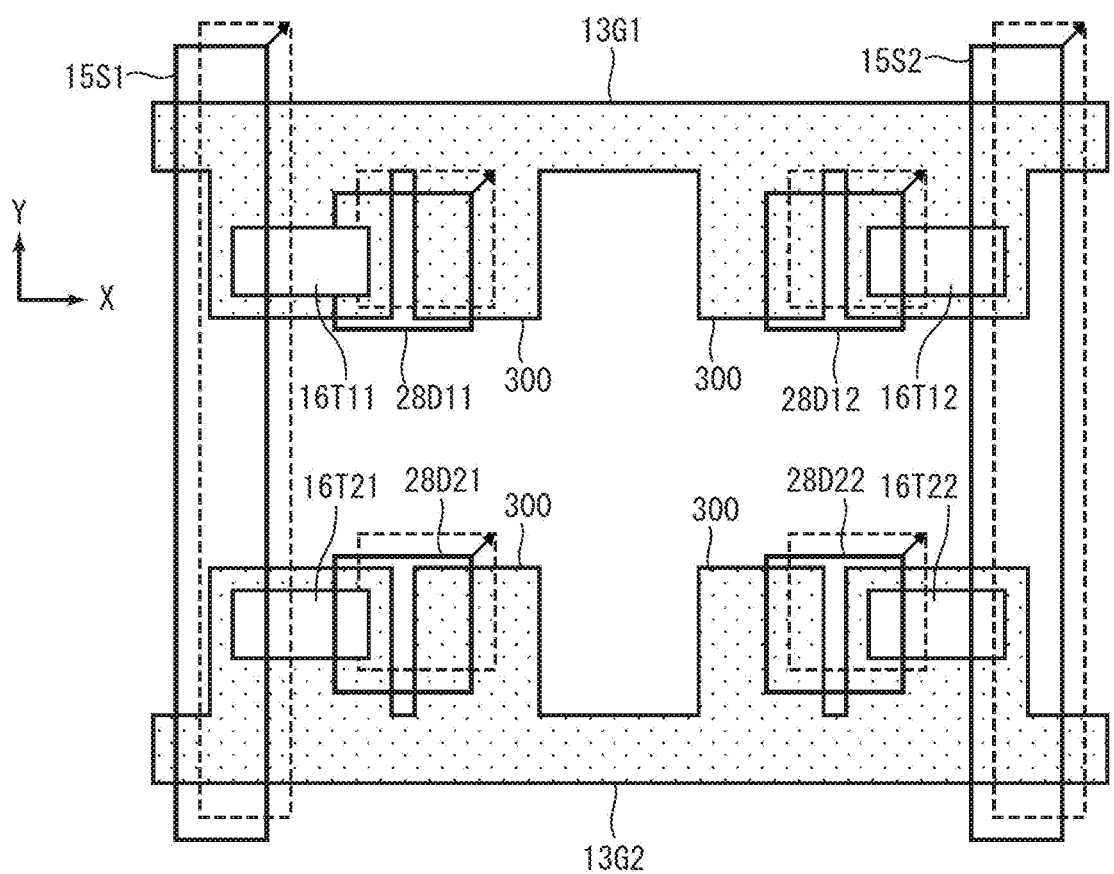
FIG. 30 illustrates an exemplary offset pattern of the gate line (gate layer) for offsetting a change in the area of overlap between the gate line and the drain pad in a case where the drain pad is displaced in the horizontal direction with respect to the gate line.

FIG. 30 illustrates an exemplary offset pattern 300 of the gate line 13G (gate layer) for offsetting a change in the area of overlap between the gate line 13G and the drain pad 28D in a case where the drain pad 28D is displaced in the horizontal direction with respect to the gate line 13G.

An offset pattern 300 is formed in the following manner: in a case where the drain pad 28D is formed at a reference position, an area of overlap between the gate line 13G and the drain pad 28D in a case where the offset pattern 300 is not formed, and an area of overlap between the offset pattern 300 and the drain pad 28D, are horizontally symmetric to each other with respect to the center line of the drain pad 28D that divides the drain pad 28D in the X axis direction. By forming the offset pattern 300 in this way, even in a case where the position of the drain pad 28D is displaced from the reference position leftward or rightward, the area of overlap between the gate line 13G and the drain pad 28D can be prevented from changing (the capacitance is prevented from changing).

Figure 31:
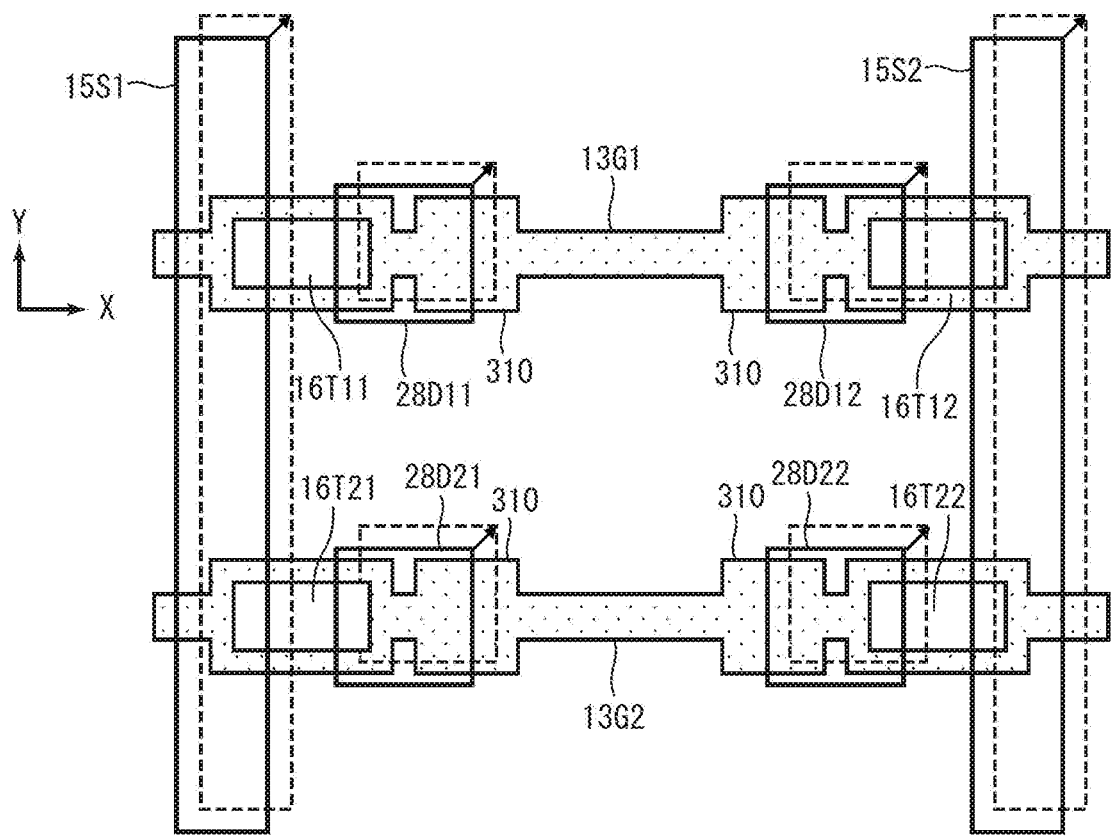
FIG. 31 illustrates an exemplary offset pattern of the gate line (gate layer) for offsetting a change in the capacitance between the gate line and the drain pad in a case where the drain pad is displaced in the vertical and horizontal directions with respect to the gate line.

FIG. 31 illustrates an exemplary offset pattern 310 of the gate line 13G (gate layer) for offsetting a change in the capacitance between the gate line 13G and the drain pad 28D in a case where the drain pad 28D is displaced in the vertical and horizontal directions with respect to the gate line 13G.

An offset pattern 310 is formed in the following manner: in a case where the drain pad 28D is formed at a reference position, an area of overlap between the gate line 13G and the drain pad 28D in a case where the offset pattern 310 is not formed, and an area of overlap between the offset pattern 310 and the drain pad 28D, are horizontally symmetric to each other with respect to the center line of the drain pad 28D that divides the drain pad 28D in the X axis direction, and vertically symmetric to each other with respect to the center line of the drain pad 28D that divides the drain pad 28D in the Y direction. By forming the offset pattern 310 in this way, even in a case where the position of the drain pad 28D is displaced in any direction of the horizontal direction and the vertical direction, the area of overlap between the gate line 13G and the drain pad 28D can be prevented from changing (the capacitance is prevented from changing).

Figure 32:
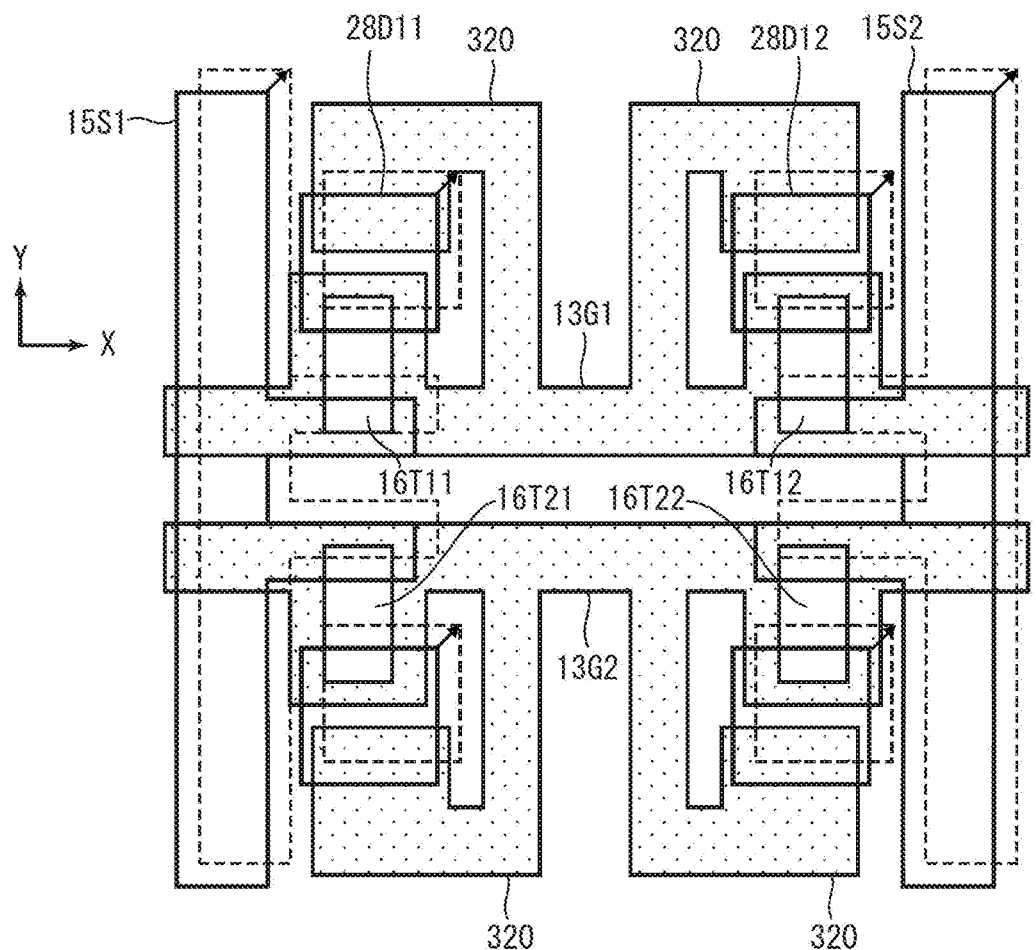
FIG. 32 illustrates an exemplary offset pattern provided in the gate line (gate layer) in the configuration in FIG. 28.

FIG. 32 illustrates an exemplary offset pattern 320 provided in the gate line 13G (gate layer) in the configuration illustrated in FIG. 28. In the example illustrated in FIG. 32, the offset pattern 320 is formed in the following manner: in a case where the drain pad 28D is formed at a reference position, an area of overlap between the gate line 13G and the drain pad 28D in a case where the offset pattern 320 is not formed, and an area of overlap between the offset pattern 320 and the drain pad 28D, are point-symmetric to each other with respect to the center point of the drain pad 28D. With this configuration, even in a case where the position of the drain pad 28D is displaced in any direction of the horizontal direction and the vertical direction with respect to the gate line 13G, the area of overlap between the gate line 13G and the drain pad 28D can be prevented from changing, whereby the capacitance between these can be prevented from changing.

Figure 33:
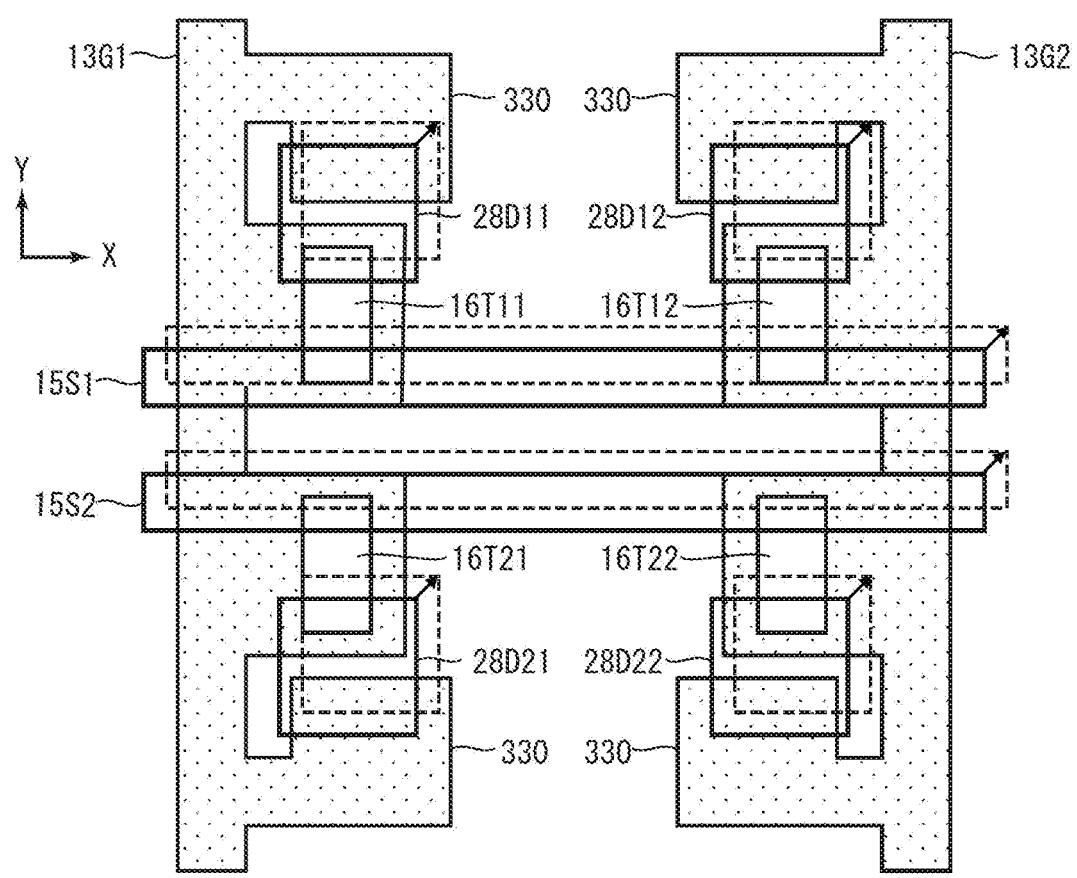
FIG. 33 illustrates an exemplary offset pattern provided in the gate line (gate layer) in a configuration in which the gate lines are arranged for respective colors and the source lines are arranged for respective pixels, like in Embodiment 4.

FIG. 33 illustrates an exemplary offset pattern 330 provided in the gate line 13G (gate layer) in a configuration in which the gate lines 13G are provided for respective colors and the source lines 15S are provided for respective pixels, as is the case with Embodiment 4. In the example illustrated in FIG. 33 as well, the offset pattern 320 is formed in the following manner: in a case where the drain pad 28D is formed at a reference position, an area of overlap between the gate line 13G and the drain pad 28D in a case where the offset pattern 320 is not formed, and an area of overlap between the offset pattern 320 and the drain pad 28D, are point-symmetric to each other with respect to the center point of the drain pad 28D. With this configuration, even in a case where the position of the drain pad 28D is displaced in any direction of the horizontal direction and the vertical direction with respect to the gate line 13G, the area of overlap between the gate line 13G and the drain pad 28D can be prevented from changing, whereby the capacitance between these can be prevented from changing.

Figure 34:
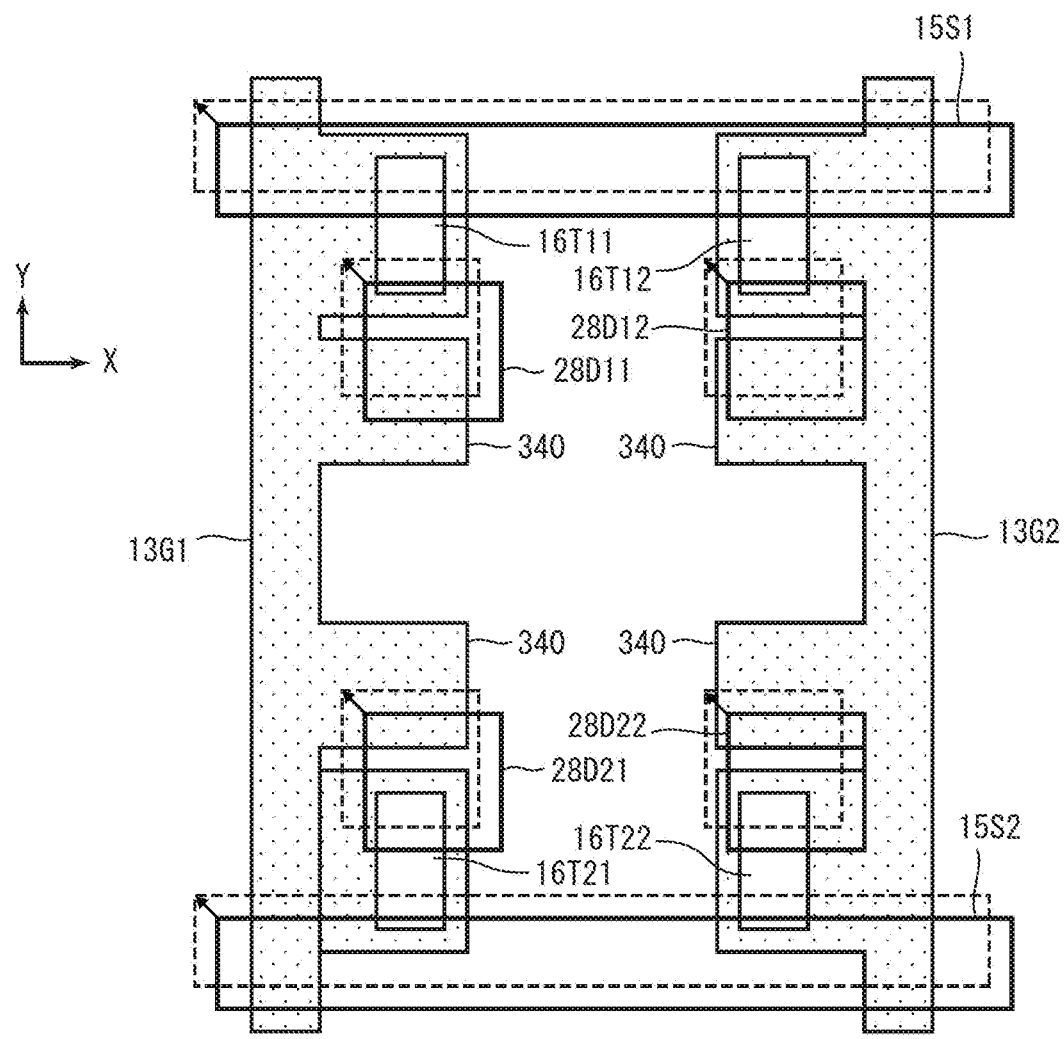
FIG. 34 illustrates an exemplary offset pattern provided in the gate line (gate layer) for offsetting a change in the area of overlap between the gate line and the drain pad in a case where the drain pad is displaced in the vertical direction with respect to the gate line in a configuration in which the gate lines are arranged for respective colors and the source lines are arranged for respective pixels.

FIG. 34 illustrates an exemplary offset pattern 340 in the gate line 13G (gate layer) for offsetting a change in the area of overlap between the gate line 13G and the drain pad 28D in a case where the drain pad 28 is displaced in the vertical direction with respect to the gate line 13G, in a configuration in which the gate lines 13G are provided for respective colors and the source lines 15S are provided for respective pixels.

An offset pattern 340 is formed in the following manner: in a case where the drain pad 28D is formed at a reference position, an area of overlap between the gate line 13G and the drain pad 28D in a case where the offset pattern 340 is not formed, and an area of overlap between the offset pattern 340 and the drain pad 28D, are vertically symmetric to each other with respect to the center line of the drain pad 28D that divides the drain pad 28D in the Y axis direction. By forming the offset pattern 300 in this way, even in a case where the position of the drain pad 28D is displaced from the reference position upward or downward, the area of overlap between the gate line 13G and the drain pad 28D can be prevented from changing (the capacitance is prevented from changing).

Figure 35:
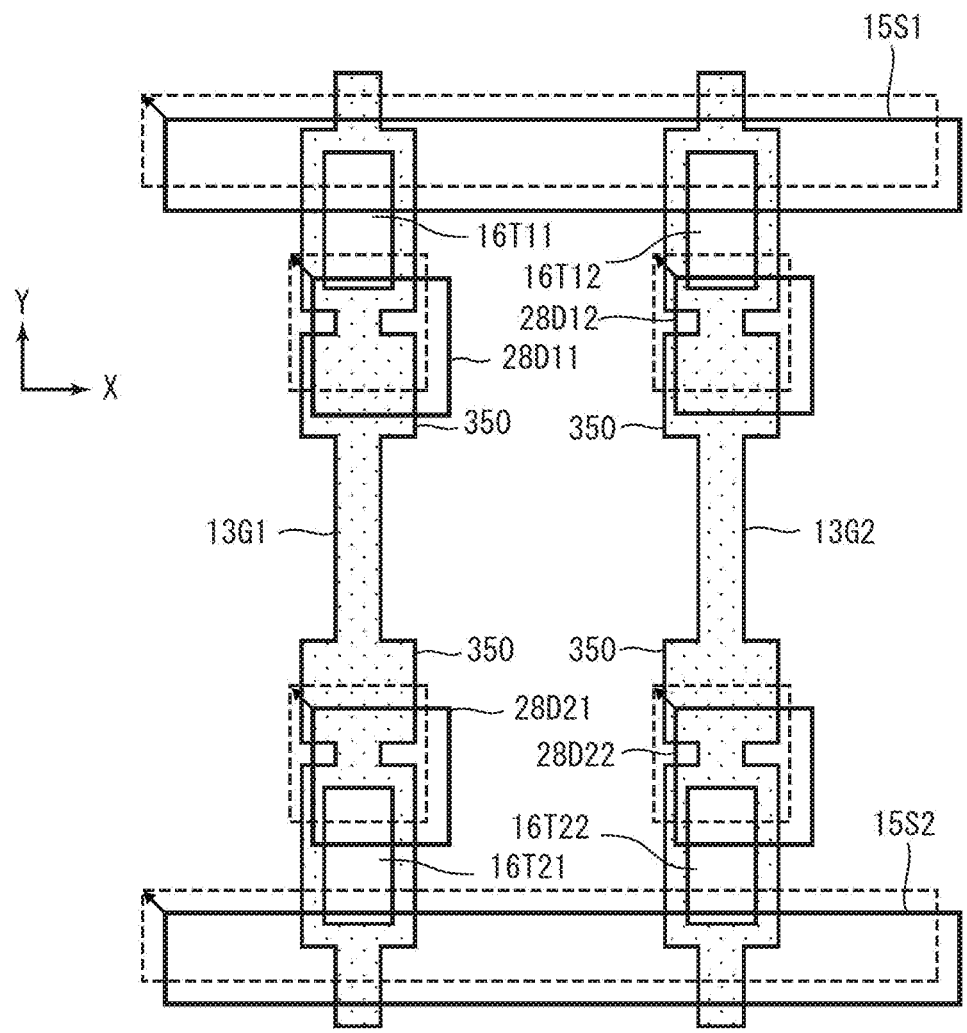
FIG. 35 illustrates an exemplary offset pattern provided in the gate line (gate layer) for offsetting a change in the capacitance between the gate line and the drain pad in a case where the drain pad is displaced in the vertical and horizontal directions with respect to the gate line in a configuration in which the gate lines are arranged for respective colors and the source lines are arranged for respective pixels

FIG. 35 illustrates an exemplary offset pattern 350 in the gate line 13G (gate layer) for offsetting a change in the capacitance between the gate line 13G and the drain pad 28D in a case where the drain pad 28 is displaced in the vertical and horizontal directions with respect to the gate line 13G, in a configuration in which the gate lines 13G are provided for respective colors and the source lines 15S are provided for respective pixels.

An offset pattern 350 is formed in the following manner: in a case where the drain pad 28D is formed at a reference position, an area of overlap between the gate line 13G and the drain pad 28D in a case where the offset pattern 350 is not formed, and an area of overlap between the offset pattern 350 and the drain pad 28D, are horizontally symmetric to each other with respect to the center line of the drain pad 28D that divides the drain pad 28D in the X axis direction, and vertically symmetric to each other with respect to the center line of the drain pad 28D that divides the drain pad 28D in the Y direction. By forming the offset pattern 350 in this way, even in a case where the position of the drain pad 28D is displaced from the reference position in any direction of the horizontal and vertical directions, the area of overlap between the gate line 13G and the drain pad 28D can be prevented from changing (the capacitance is prevented from changing).

The present invention is not limited to the above-described embodiments. For example, in the description of each of the above-described embodiments, it is described that among a plurality of the pixel-TFTs 16T, a part of the pixel-TFTs 16T connected with the same vertical line are arranged on a side with respect to the respective horizontal lines to which the pixel-TFTs are connected, the side being different from the side on which the other pixel-TFTs 16T connected with the foregoing same vertical line are arranged with respect to the respective horizontal lines. All of the pixel-TFTs 16T connected with the same vertical line, however, may be arranged on the same side with respect to the respective horizontal lines to which the pixel-TFTs are connected.

Figure 36:
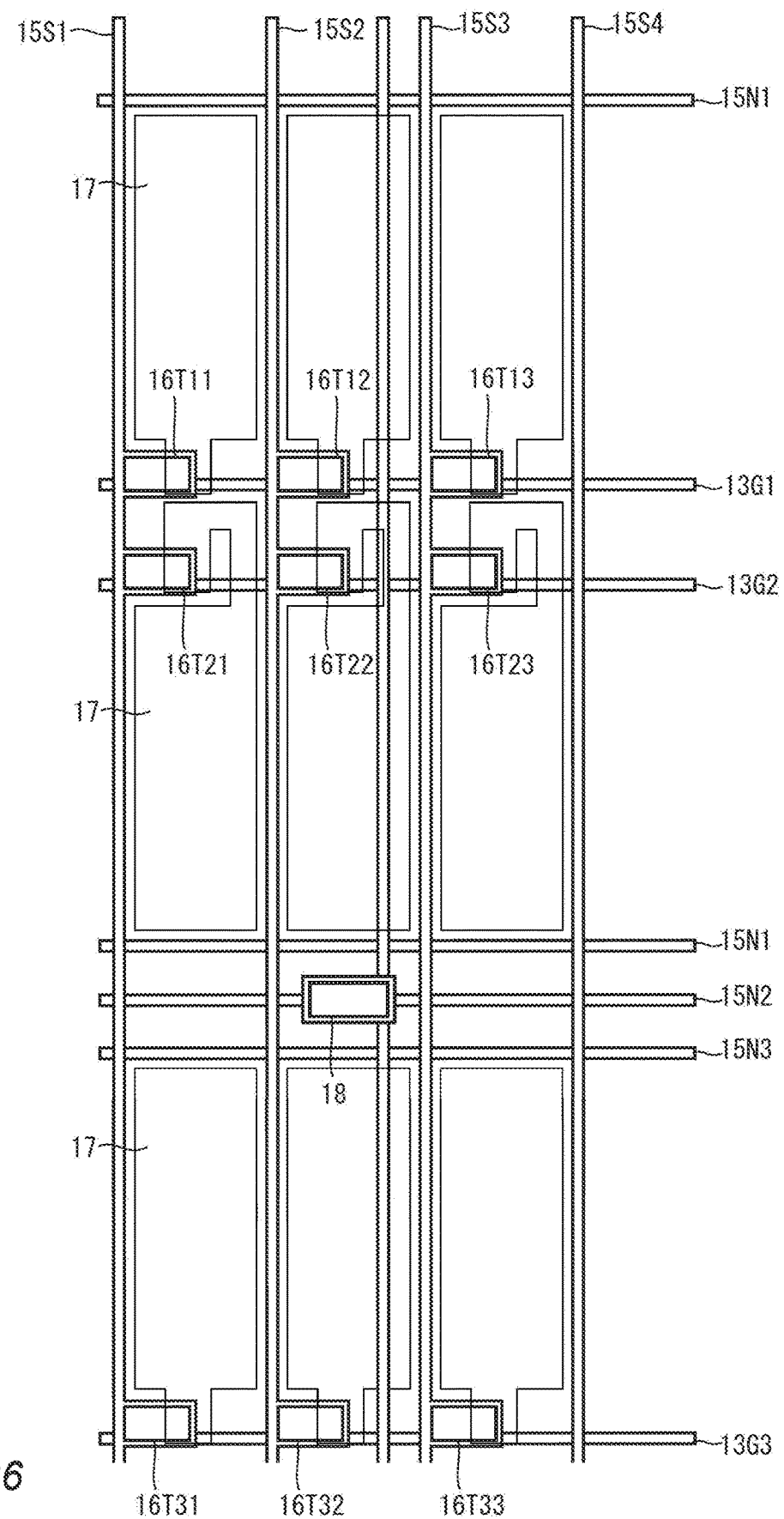
FIG. 36 is a schematic diagram for explaining a configuration of an active matrix substrate in which all of pixel-TFTs connected with the same vertical line are arranged on the same side with respect to the respective horizontal lines to which the pixel-TFTs are connected.

FIG. 36 is a schematic diagram for explaining a configuration of the active matrix substrate 20a in which all of the pixel-TFTs 16T connected with the same vertical line are arranged on the same side with respect to the respective horizontal lines to which the pixel-TFTs 16T are connected. In FIG. 36, the vertical lines are the source lines 15S, and the horizontal lines are the gate lines 13G.

As illustrated in FIG. 36, the intervals of the adjacent gate lines 13G are irregular intervals. Further, the pixel-TFTs 16T connected with the same source line 15S are arranged on the same side, i.e., the upper side, with respect to the respective gate lines 13G to which the pixel-TFTs 16T are connected.

The driver TFT 18 is arranged in an area between adjacent two of the gate lines 13G arranged at a wider interval, among areas between adjacent twos of the gate lines 13G. More specifically, the area is an area that is between pixels that are adjacent with each other in the vertical direction, and that has no pixel-TFT 16T provided therein.

In such a configuration as well, the driver TFT 18 can be arranged in an area where no pixel-TFT 16T is arranged, among areas between pixels adjacent in the vertical direction, which allows a large driver TFT 18 to be arranged. This, however, results in that a part of the pixel electrodes 17 have significantly deformed shapes, as illustrated in FIG. 36.

Likewise, in the active matrix substrate 20a in Embodiment 2, the pixel-TFTs 16T connected with the same gate line 13G may be arranged on the same side with respect to the respective source lines 15S to which the foregoing pixel-TFTs 16T are connected. Moreover, in the active matrix substrate 20a in Embodiment 3 and Embodiment 4 as well, all of the pixel-TFTs 16T connected with the same vertical line may be arranged on the same side with respect to the respective horizontal lines to which the foregoing pixel-TFTs 16T are connected.

In the foregoing descriptions of the embodiments, it is described that a larger driver-TFT 18 can be arranged, as compared with the conventional active matrix substrate. Two or more small driver-TFTs, however, may be connected in series and arranged.

Among a plurality of driver-TFTs 18 as constituent elements of the gate driver 11, a part of the driver-TFTs 18 may be arranged in the display region, and the other driver-TFTs 18 may be arranged outside the display region.

The invention claimed is:

1. An active matrix substrate comprising:
   a plurality of data lines;
   a plurality of lines that intersect with the data lines, and include at least a plurality of gate lines;
   a driving circuit that includes a plurality of switching elements, and is connected to at least a part of the lines, so as to control potentials of the lines according to a control signal supplied from outside a display region;
   a driver line that is connected to the driving circuit to supply the control signal to the driving circuit; and
   a plurality of pixel control elements that are provided in correspondence to a plurality of pixels that are arranged in the display region, and are connected with the data lines and the gate lines, so as to control display of the corresponding pixels, respectively,
   wherein the gate lines are a plurality of vertical lines that extend in a vertical direction in plan view, and the data lines are a plurality of horizontal lines that extend in a horizontal direction in plan view,
   the driver line is arranged in parallel with the data lines,
   intervals of the horizontal lines are irregular intervals,
   at least a part of the switching elements are arranged in areas that are between the pixels adjacent in the vertical direction in plan view, and where none of the pixel control elements is arranged, and
   the pixel control elements that are arranged in a plurality of pixels adjacent in the vertical direction are disposed at irregular intervals.

2. The active matrix substrate according to claim 1, wherein, among the pixel control elements, a part of the pixel control elements connected with one same vertical lines are arranged on one side with respect to the respective horizontal lines to which the pixel control elements are connected, the side being different from a side on which the other pixel control elements connected with the same vertical lines are arranged.

3. The active matrix substrate according to claim 1, wherein, among the pixel control elements, all of the pixel control elements connected with one same vertical lines are arranged on the same side with respect to the respective horizontal lines to which the pixel control elements concerned are connected.

4. The active matrix substrate according to claim 1, wherein a drain pad of each pixel control element is formed in a layer different in a lamination direction from a gate layer that forms the gate lines, and
   in the gate layer, a region is provided for preventing an area of overlap between the drain pad and the gate layer from changing in a case where the drain pad and the gate layer are displaced from each other.

5. A display panel comprising:
   the active matrix substrate according to claim 1;
   a counter substrate including a color filter and a counter electrode; and
   a liquid crystal layer interposed between the active matrix substrate and the counter substrate.

6. The active matrix substrate according to claim 1, wherein at least a part of the switching elements are arranged in light-shielding areas that are between display areas adjacent in the vertical direction in plan view.

* * * * *